(12) United States Patent
Ban et al.

(10) Patent No.: US 9,666,448 B2
(45) Date of Patent: May 30, 2017

(54) METHODS OF FORMING PATTERNS

(71) Applicant: SK hynix Inc., Gyeonggi-do (KR)

(72) Inventors: Keun Do Ban, Gyeonggi-do (KR);
Hong Ik Kim, Gyeonggi-do (KR);
Jung Gun Heo, Daejeon (KR); Cheol Kyu Bok, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 20 days.

(21) Appl. No.: 14/837,913

(22) Filed: Aug. 27, 2015

(65) Prior Publication Data
US 2016/0293442 A1 Oct. 6, 2016

(30) Foreign Application Priority Data

Apr. 6, 2015 (KR) .................. 10-2015-0048673

(51) Int. Cl.
*C03C 15/00* (2006.01)
*H01L 21/311* (2006.01)
*H01L 21/033* (2006.01)
*H01L 27/02* (2006.01)

(52) U.S. Cl.
CPC .... *H01L 21/31144* (2013.01); *H01L 21/0337* (2013.01); *H01L 27/0207* (2013.01)

(58) Field of Classification Search
CPC ........... H01L 21/31144; H01L 21/0334; H01L 21/0337; B81C 2201/0149; B81C 1/00388
USPC ........ 216/41, 46, 48, 49; 438/696, 717, 725, 438/736
See application file for complete search history.

(56) References Cited

U.S. PATENT DOCUMENTS

| 8,962,491 B2 | 2/2015 | Ban et al. |
| 2009/0184374 A1* | 7/2009 | Clevenger ......... H01L 21/31144 257/368 |
| 2012/0103935 A1* | 5/2012 | Cheng ................. H01L 21/0337 216/37 |
| 2014/0127456 A1* | 5/2014 | Regner .................... B05D 1/34 428/120 |
| 2015/0021295 A1* | 1/2015 | Yoshikawa ........... G03F 7/0002 216/66 |
| 2015/0179434 A1* | 6/2015 | Ban ..................... H01L 21/0271 428/179 |

(Continued)

FOREIGN PATENT DOCUMENTS

| KR | 1020100126190 | 12/2010 |
| KR | 1020140030873 | 3/2014 |

*Primary Examiner* — Binh X Tran
(74) *Attorney, Agent, or Firm* — IP & T Group LLP

(57) ABSTRACT

A method of forming patterns includes forming an array of pillars on an underlying layer stacked on an etch target layer, forming a separation wall layer on the pillars to provide separation walls covering sidewalls of the pillars, forming a block copolymer layer on the separation wall layer, annealing the block copolymer layer to form first domains located between the pillars, and a second domain surrounding and isolating the first domains, selectively removing the first domains to form second openings, selectively removing the pillars to form fourth openings, forming fifth openings that extend from the second and fourth openings to penetrate the underlying layer, forming a sealing pattern that covers and seals dummy openings among the fifth openings, and forming seventh openings that extend from the fifth openings exposed by the sealing pattern to penetrate the etch target layer.

20 Claims, 76 Drawing Sheets

(56) References Cited

U.S. PATENT DOCUMENTS

2015/0184024 A1* 7/2015 Chang ................. C09D 183/10
428/447
2015/0380266 A1* 12/2015 Wuister ................ G03F 7/0002
257/622
2016/0244581 A1* 8/2016 Brink ................... B05D 3/0453

* cited by examiner

METHODS OF FORMING PATTERNS

CROSS-REFERENCE TO RELATED APPLICATION

The present application claims priority under 35 U.S.C 119(a) to Korean Application No. 10-2015-0048673, filed on Apr. 6, 2015, in the Korean Intellectual Property Office, which is herein incorporated by reference in its entirety as set forth in full.

BACKGROUND

1. Technical Field

Various embodiments of the present disclosure relate to methods of fabricating semiconductor devices and, more particularly, to methods of forming patterns.

2. Related Art

As the semiconductor industry rapidly grows, a lot of effort has been focused on realizing integrated circuits having a high integration density. In order to increase the integration density of semiconductor devices comprised of the integrated circuits, it may be necessary to reduce an area that a unit cell of the semiconductor devices occupies and to increase the number of discrete devices for example, transistors, resistors, capacitors or the like integrated in a limited area of a semiconductor substrate. Various techniques have been attempted to realize fine pattern structures having a nano-scale critical dimension (CD), such as, a size of about a few nanometers to about several tens of nanometers.

In the event that nano-scale fine patterns of the semiconductor devices are formed using only a photolithography process, there may be some limitations in forming the fine patterns due to image resolution limits of lithography apparatuses used in the photolithography process. Methods of forming the fine patterns using a self-assembly characteristic of polymer molecules may be considered as a candidate for overcoming the image resolution limits which are due to the nature of optical systems used in the photolithography process and due to wavelengths of lights generated from light sources of the optical systems used in the photolithography process. However, it may be difficult to form fine patterns, which are irregularly arrayed, using a direct self-assembly (DSA) characteristic of polymer molecules. Accordingly, it may be necessary to further develop methods of forming the fine patterns using the DSA characteristic of the polymer molecules to overcome the demerits of the DSA technology.

SUMMARY

Various embodiments are directed to methods of forming patterns.

According to an embodiment, there is provided a method of forming patterns. The method includes forming an array of pillars and a template part providing first openings on an underlying layer stacked on an etch target layer, forming a separation wall layer on the pillars and the template part to provide separation walls covering sidewalls of the pillars and sidewalls of the first openings, and forming a block copolymer layer on the separation wall layer. The block copolymer layer is annealed to form first domains located between the pillars, a second domain surrounding and isolating the first domains, third domains respectively located in the first openings, and forth domains respectively disposed in the first openings to surround the third domains. The first and third domains are selectively removed to form second openings surrounded by the second domain and third openings surrounded by the fourth domains. The pillars are selectively removed to form fourth openings. Fifth openings and sixth openings are formed to penetrate the underlying layer. The fifth openings are formed to extend from the second and fourth openings, and the sixth openings are formed to extend from the third openings. A sealing pattern is formed to cover and seal dummy openings among the fifth openings. Seventh openings and eighth openings are formed to penetrate the etch target layer. The seventh openings are formed to extend from the fifth openings exposed by the sealing pattern, and the eighth openings are formed to extend from the sixth openings.

According to another embodiment, there is provided a method of forming patterns. The method includes forming an array of pillars and a template part providing first openings on an underlying layer stacked on an etch target layer, forming separation walls covering sidewalls of the pillars and sidewalls of the first openings, and selectively removing the pillars to form fourth openings. A block copolymer layer is formed to fill a space between the separation walls, the first openings, and the fourth openings. The block copolymer layer is annealed to form first domains located in gaps between the separation walls and located in the fourth openings, second domains surrounding and isolating the first domains, third domains located in the first openings, and fourth domains disposed in the first openings to surround the third domains. The first and third domains are selectively removed to form second openings surrounded by the second domain and third openings surrounded by the fourth domains. Fifth openings and sixth openings are formed to penetrate the underlying layer. The fifth openings are formed to extend from the second openings, and the sixth openings are formed to extend from the third openings. A sealing pattern is formed to cover and seal dummy openings among the fifth openings. Seventh openings and eighth openings are formed to penetrate the etch target layer. The seventh openings are formed to extend from the fifth openings exposed by the sealing pattern, and the eighth openings are formed to extend from the sixth openings.

According to another embodiment, there is provided a method of forming patterns. The method includes forming an array of pillars on an underlying layer stacked on an etch target layer, forming a separation wall layer on the pillars to provide separation walls covering sidewalls of the pillars, forming a block copolymer layer on the separation wall layer, annealing the block copolymer layer to form first domains located between the pillars and a second domain surrounding and isolating the first domains, selectively removing the first domains to form second openings, selectively removing the pillars to form fourth openings, forming fifth openings that extend from the second and fourth openings to penetrate the underlying layer, forming a sealing pattern that covers and seals dummy openings among the fifth openings, and forming seventh openings that extend from the fifth openings exposed by the sealing pattern to penetrate the etch target layer.

According to another embodiment, there is provided a method of forming patterns. The method includes forming an array of pillars on an underlying layer stacked on an etch target layer, forming separation walls covering side walls of the pillars, selectively removing the pillars to form fourth openings, forming a block copolymer layer that fills the fourth openings and a space between the separation walls, annealing the block copolymer layer to form first domains located in gaps between the separation walls and second domains surrounding and isolating the first domains, selectively removing the first domains to form second openings, forming fifth openings that extend from the second openings to penetrate the underlying layer, forming a sealing pattern that covers and seals dummy openings among the fifth openings, and forming seventh openings that extend from the fifth openings exposed by the sealing pattern to penetrate the etch target layer.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
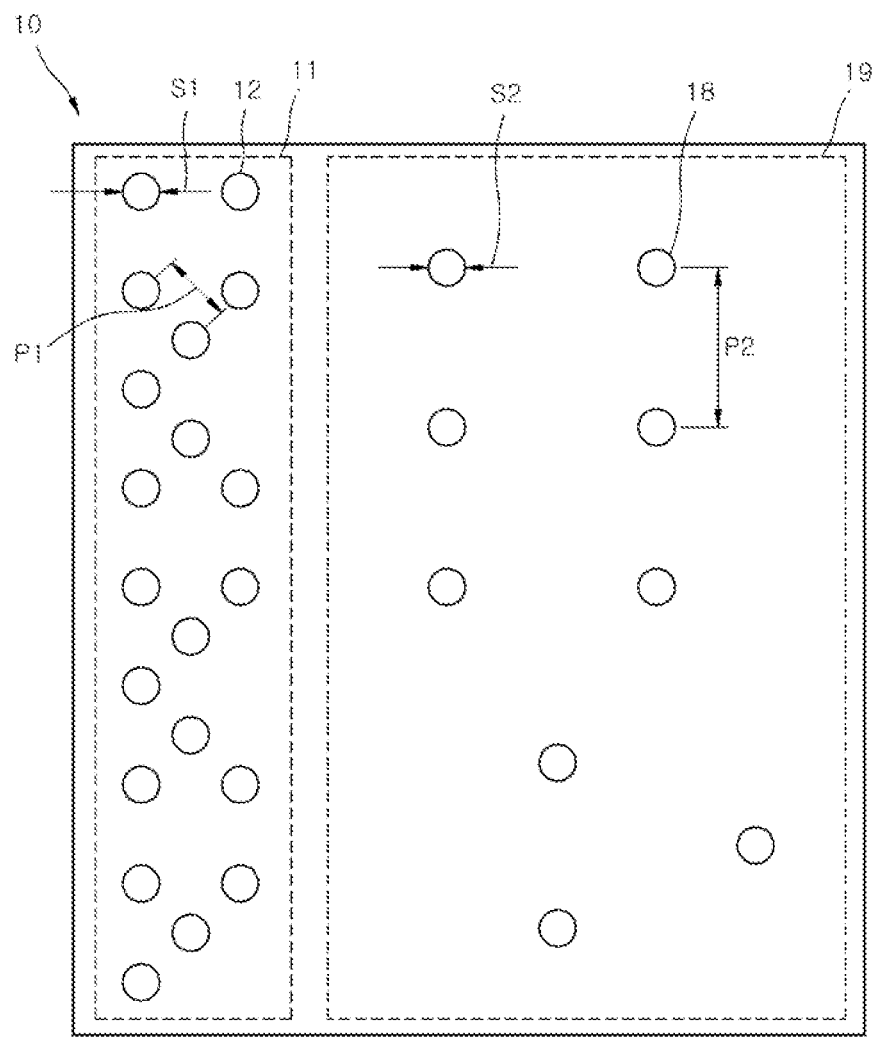
FIGS. 1 to 7 are plan views illustrating a process for obtaining a layout of a guide pattern used in method of forming patterns according to an embodiment.

It will be understood that although the terms first second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present disclosure. Other words used to describe the relationship between elements or layers should be interpreted in a like fashion for example, "between" versus "directly between" or "adjacent" versus "directly adjacent".

In the following embodiments, the term "dense patterns" may be used to describe patterns having a relatively small pitch size and a relatively short distance therebetween, and the term "isolated patterns" may be used to describe patterns having a relatively large pitch size and a relatively long distance therebetween. In addition, the term "regularly arrayed patterns" may be used to describe patterns arrayed to have a uniform pitch size and substantially the same distance therebetween, and the term "irregularly arrayed patterns" may be used to describe patterns arrayed to have non-uniform pitch sizes or different distances therebetween. The term "irregularly arrayed patterns" may also be used to describe patterns randomly arrayed without any regularity.

Some embodiments of the present disclosure may provide methods of forming fine patterns having a line width less than a resolution limit of exposure apparatuses using a phase separation of a block copolymer (BCP) layer. For example, some embodiments of the present disclosure may provide methods of forming an array of contact holes using a direct self-assembly (DSA) technique of a BCP layer. Specific polymer blocks constituting a BCP layer may be phase-separated from a matrix material thereof to form domain portions under a specific condition, and the phase-separated domain portions may be selectively removed to form spaces or patterns having a nano-scale feature size. The nano-scale feature size may mean a size of about a few nanometers to about several tens of nanometers.

A self-assembled structure of the BCP layer may be formed to have a cylindrical shape or a lamellar shape according to a volume ratio of two or more distinct polymer blocks constituting the BCP layer, an annealing temperature for the phase separation of the BCP layer, a molecule size of the polymer blocks constituting the BCP layer, and a molecular weight of the polymer blocks constituting the BCP layer. That is, the domain portions of the polymer blocks, which are phase-separated, may be formed to have a cylindrical shape or a lamellar shape. If the self-assembled structure of the BCP layer has a cylindrical shape, the BCP layer may be used to form a hole array pattern. If the self-assembled structure of the BCP layer has a lamellar shape, the BCP layer may be used to form a line and space pattern.

Various embodiments of the present disclosure may be applied to fabrication of highly integrated semiconductor devices, for example, dynamic random access memory (DRAM) devices, phase changeable random access memory (PcRAM) devices or resistive random access memory (ReRAM) devices. In addition, the following embodiments may be applied to fabrication of memory devices such as static random access memory (SRAM) devices, flash memory devices, magnetic random access memory (MRAM) devices or ferroelectric random access memory (FeRAM) devices. The following embodiments may also be applied to fabrication of logic devices such as control devices, central processing units (CPU) or arithmetic logic units (ALU).

FIGS. 1 to 7 are plan views illustrating a process for obtaining a layout of a guide pattern used in method of forming patterns according to an embodiment.

Referring to FIG. 1, a layout 10 may be set to include a layout 11 of first target features 12 transferred to a substrate and a layout 19 of second target features 18 transferred to the substrate. The layout 11 of the first target features 12 and the layout 19 of the second target features 18 may be designed to be located at different regions which are distinct from each other, respectively. For example, the layout 11 and the layout 19 may be designed to be adjacent to each other. The first target features 12 may be designed to provide seventh openings that penetrate any one of material layers which are formed on the substrate, and the second target features 18 may be designed to provide eighth openings that penetrate any one of material layers which are formed on the substrate. A size S1 of the first target features 12 may be identical to a size S2 of the second target features 18. Alternatively, the size S1 of the first target features 12 may be different from the size S2 of the second target features 18. The first target features 12 may be arrayed to have a first pitch P1.

Figure 2:
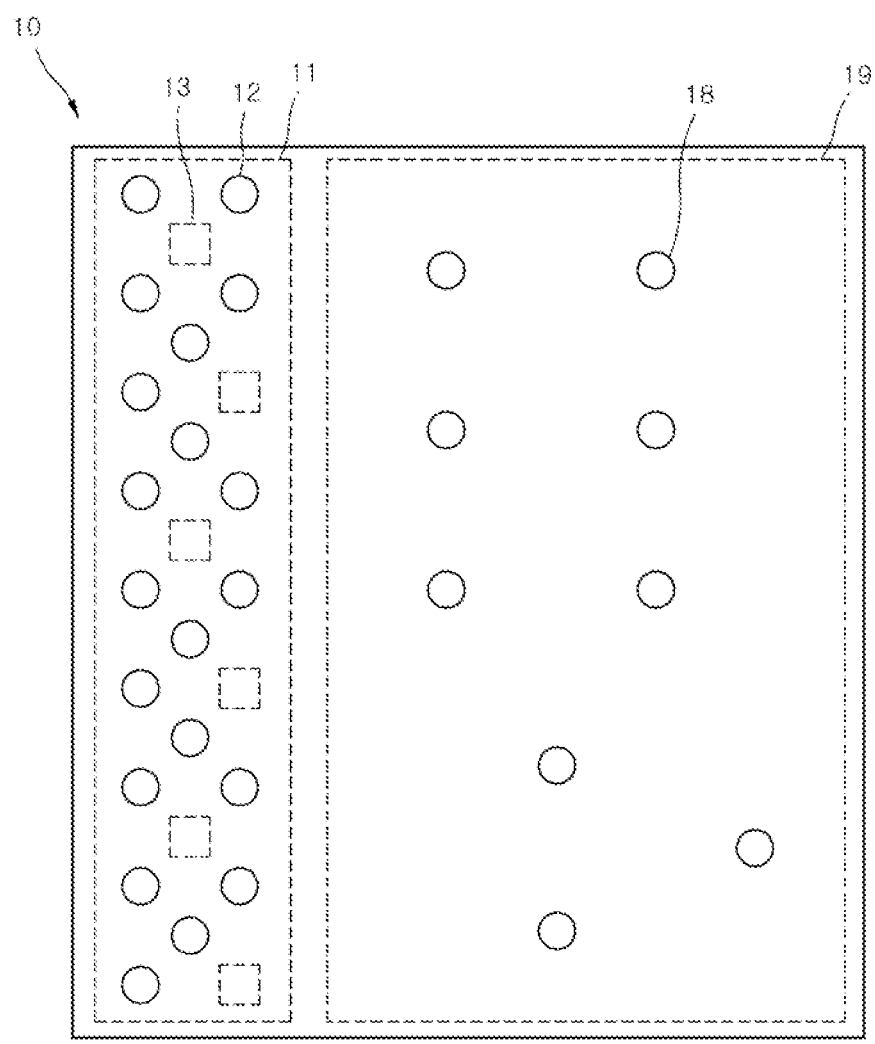

However, as illustrated in FIG. 2, the first target features 12 alone may be irregularly arrayed. Some empty portions 13 may be positioned between the first target features 12. The second target features 18 may be arrayed to have a second pitch P2, and the second pitch P2 may be set to be greater than the first pitch P1. For example, the second pitch P2 may be set to be at least twice the first pitch P1. Although the first target features 12 are not randomly arrayed, the first target features 12 may be irregularly arrayed and may be arrayed more densely than the second layout region 19. The second target features 18 may be arrayed in isolated pattern forms having a relatively large pitch size and spaced apart from each other by a relatively long distance as compared with the first target features 12.

Figure 3:
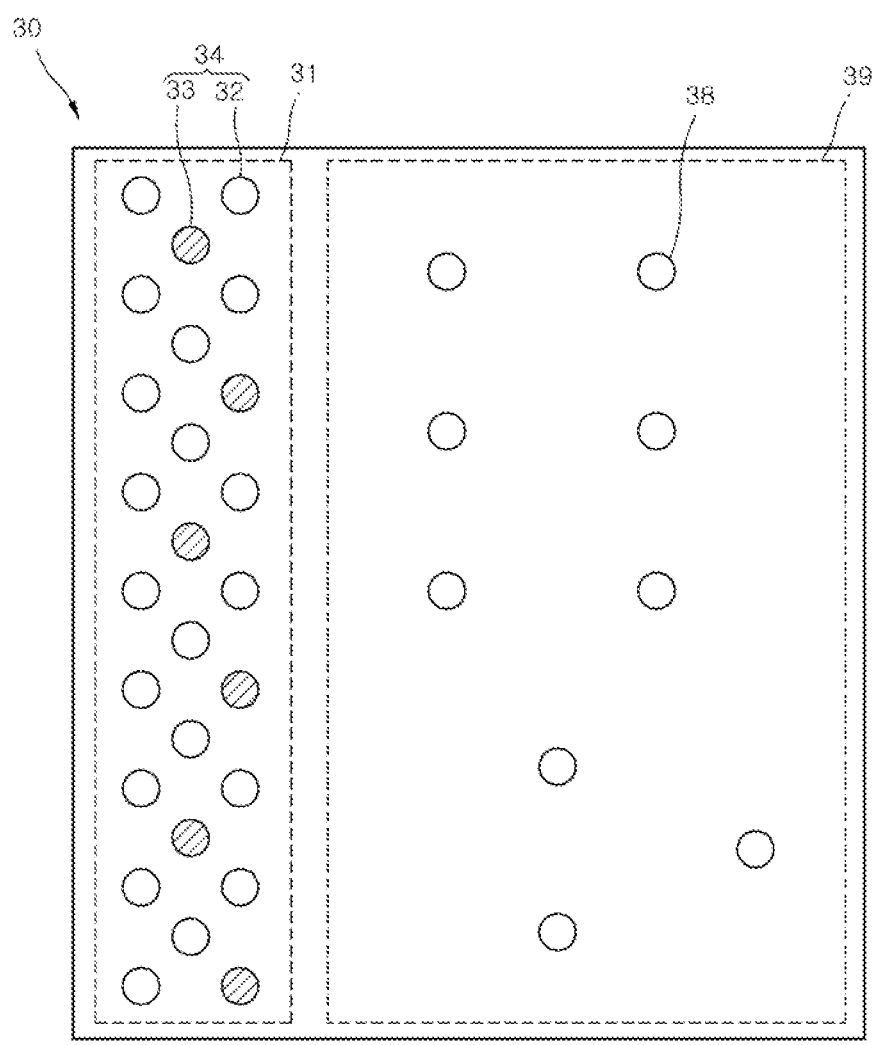

Referring to FIG. 3, a layout 30 may include a layout 31 of third target features 34 obtained by additionally disposing dummy patterns 33 between first target features 32 so that the first target features 32 and the dummy patterns 33, in combination, form a regularly arrayed pattern. A layout 39 of second target features 38 may be disposed to be adjacent to the layout 31 of the third target features 34.

Figure 4:
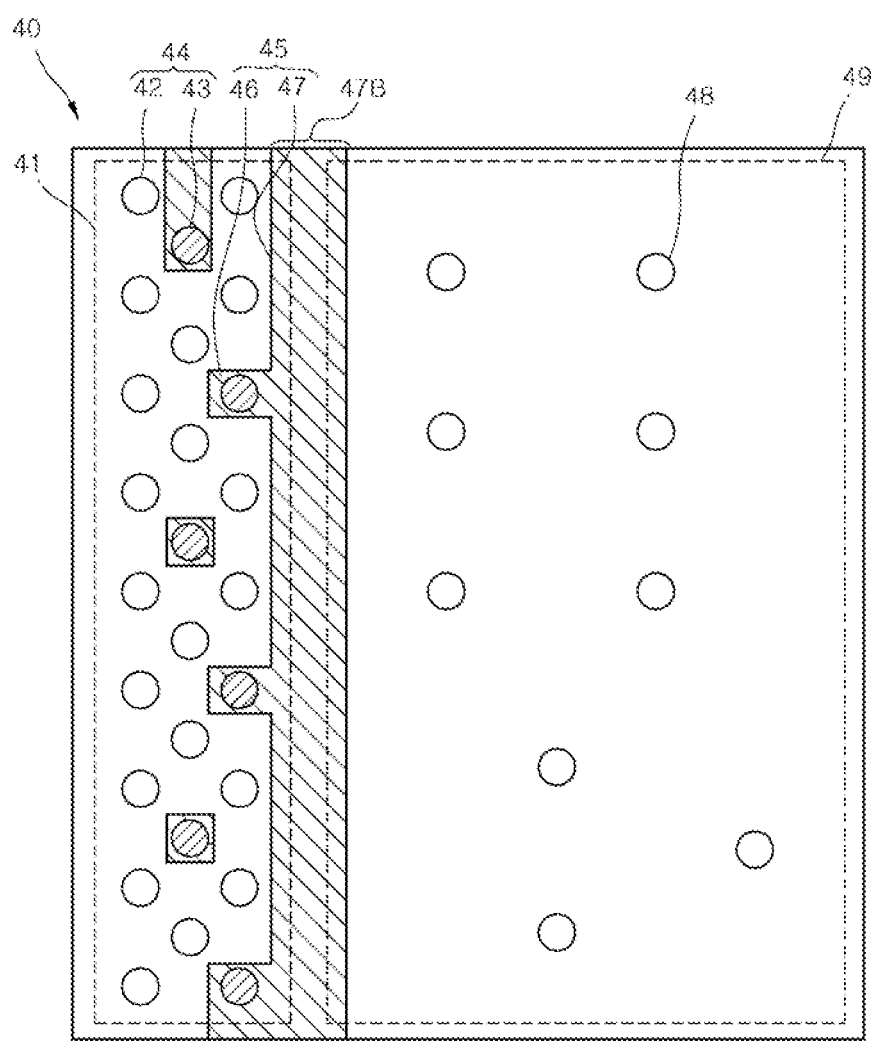

Referring to FIG. 4, a layout 40 may be obtained by adding a layout of a sealing pattern 45 to a layout 41. The layout 41 includes third target features 44, first target features 42, and dummy patterns 43. The sealing pattern 45 may include first portions 46 overlapping with the dummy patterns 43 to seal and conceal the dummy patterns 43 and a second portion 47 overlapping with a boundary region 47B between the layout 41 of the third target features 44 and a layout 49 of second target features 48 to conceal the boundary region 47B. The first portions 46 of the sealing pattern 45 may be designed to cover real patterns intentionally formed on a wafer or a substrate to correspond to the dummy patterns 43 so that the real patterns corresponding to the dummy patterns 43 are not transferred to the wafer or the substrate during a fabrication process. The second portion 47 of the sealing pattern 45 may be designed to cover the boundary region 47B so that undesired parasitic patterns induced in the boundary region 47B are not transferred to the wafer or the substrate during the fabrication process.

Figure 5:
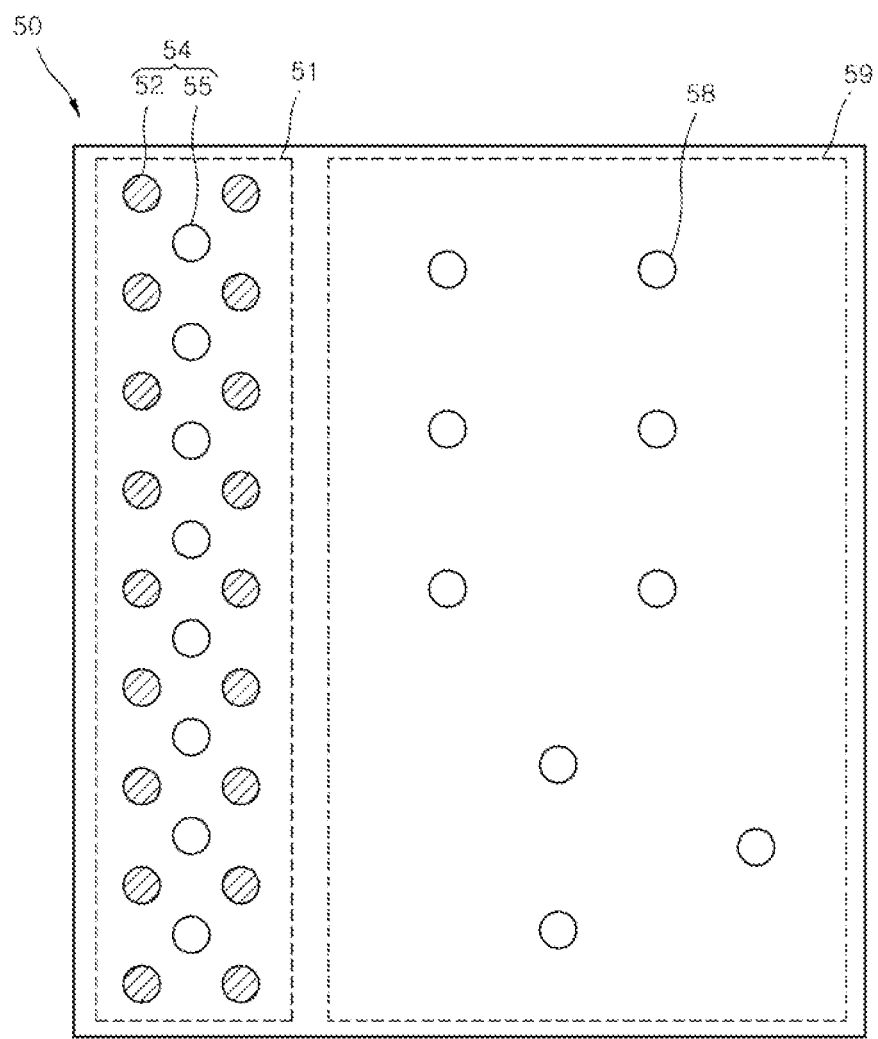

Referring to FIG. 5, a layout 50 may include a layout 59 of second target features 58 and a layout 51 of third target features 54. The layout 51 of the third target features 54 may be obtained by dividing the third target features 54 into pillar patterns 52 used as guide patterns and first domain patterns 55 corresponding to first domains of a phase-separated BCP layer disposed between the pillar patterns 52. In an embodiment, each of first domains of a phase-separated BCP layer may be formed at a central portion of a region surrounded by four adjacent pillars. Accordingly, each of the first domain patterns 55 may be designed to be located at a central portion of a region surrounded by four adjacent pillar patterns 52 among the pillar patterns 52, as illustrated in FIG. 5. Alternatively, each of the first domain patterns 55 may be designed to be located at a central portion of a region surrounded by three adjacent pillar patterns 52 among the pillar patterns 52.

Figure 6:
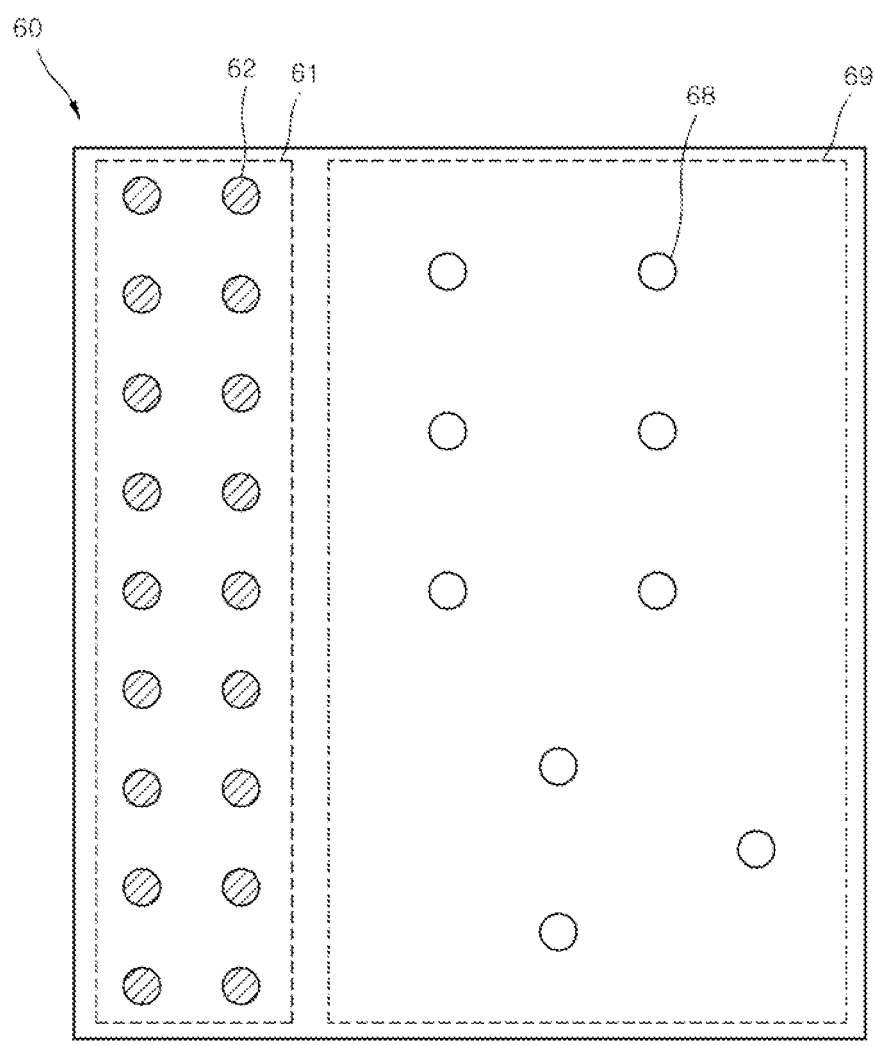

Referring to FIG. 6, a layout 60 may include a layout 61 of pillar patterns 62 and a layout 69 of second target features 68, which are adjacent to each other. The layout 61 of the pillar patterns 62 may be the same as the layout 51 shown in FIG. 5, except that no first domain pattern exists.

Figure 7:
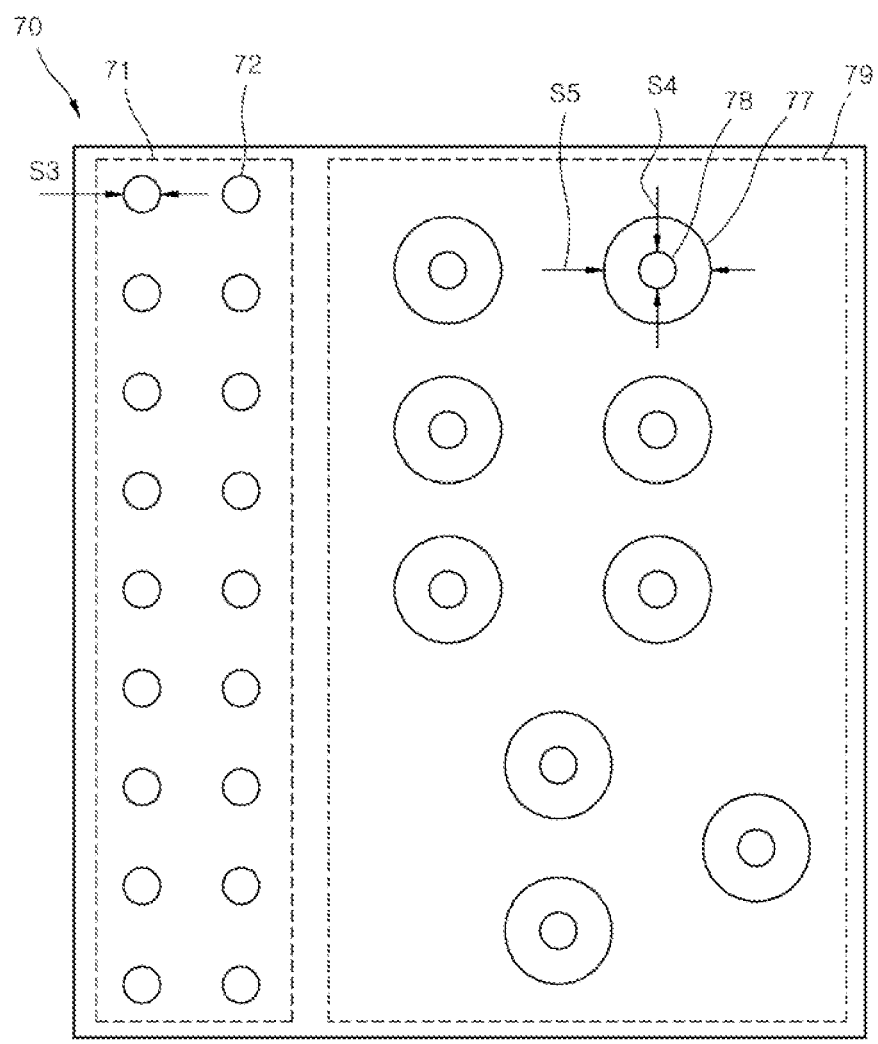

Referring to FIG. 7, a layout 70 may be designed to include a layout 71 of pillar patterns 72 and a layout 79 of fourth target features 77 obtained by resizing second target features 78. The layout 71 of the pillar patterns 72 and the layout 79 of the fourth target features 77 may be disposed to be adjacent to each other. Each of the pillar patterns 72 may be designed to have a size S3 and each of the fourth target features 77 may be designed to have a size S5 which is greater than a size S4 of the second target features 78 in consideration of a size of third domains and a size of fourth domains which surround the third domains and are formed while a BCP layer is phase-separated in a fabrication process. The layout 70 obtained by the above procedures may be used in formation of an array of actual pillars and a template part providing first openings, which are disposed on a substrate.

Figure 8:
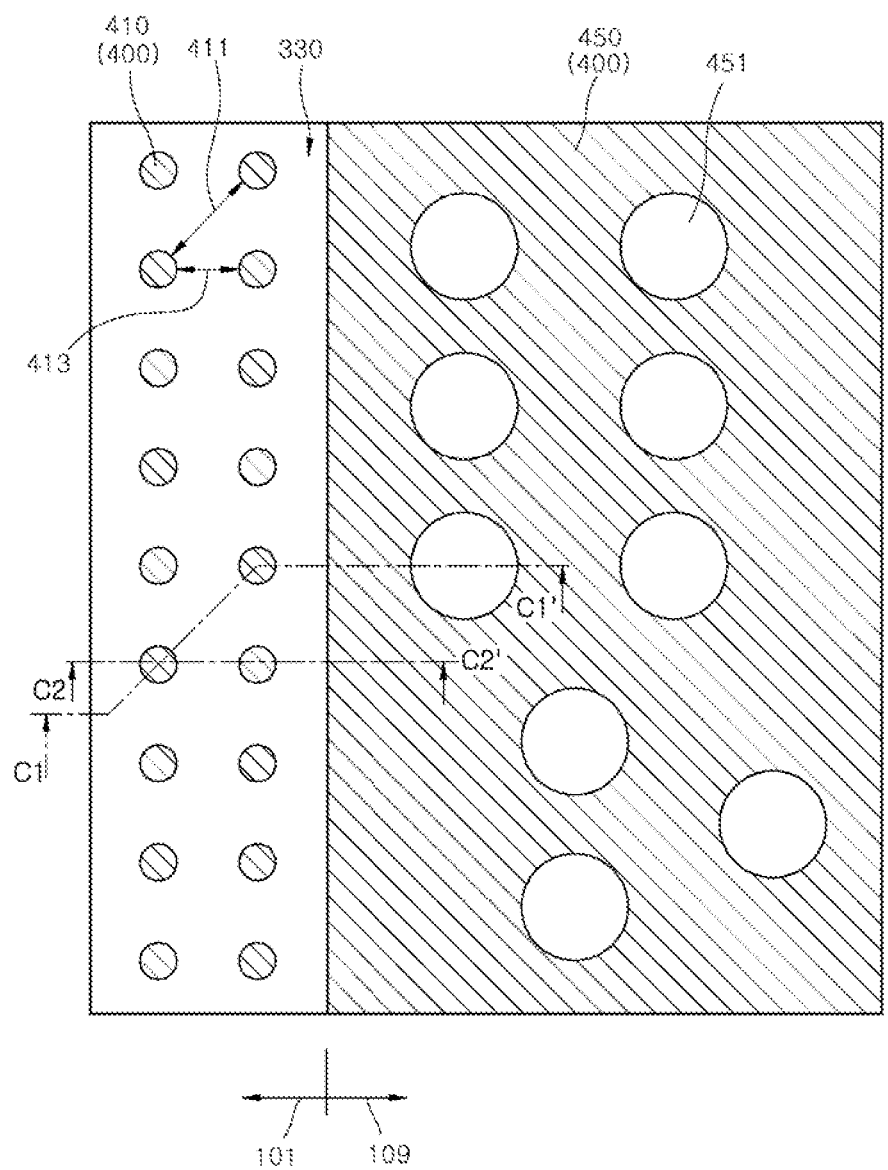
FIGS. 8 to 40 are plan views and cross-sectional views illustrating a method of forming patterns according to an embodiment.
Figure 9:
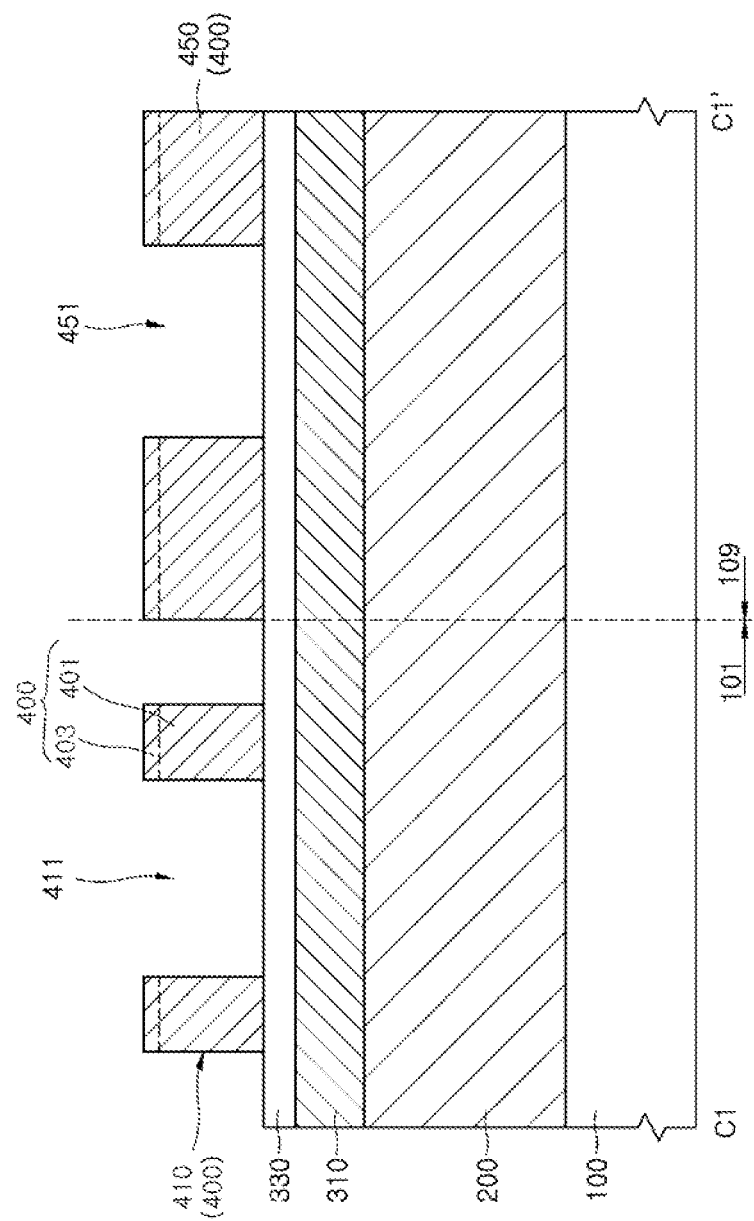

FIG. 8 is a plan view illustrating a step of forming an array of pillars 410 and a template part 450. FIG. 9 is a cross-sectional view taken along a line C1-C1' of FIG. 8, and FIG. 10 is a cross-sectional view taken along a line C2-C2' of FIG. 8.

Figure 10:
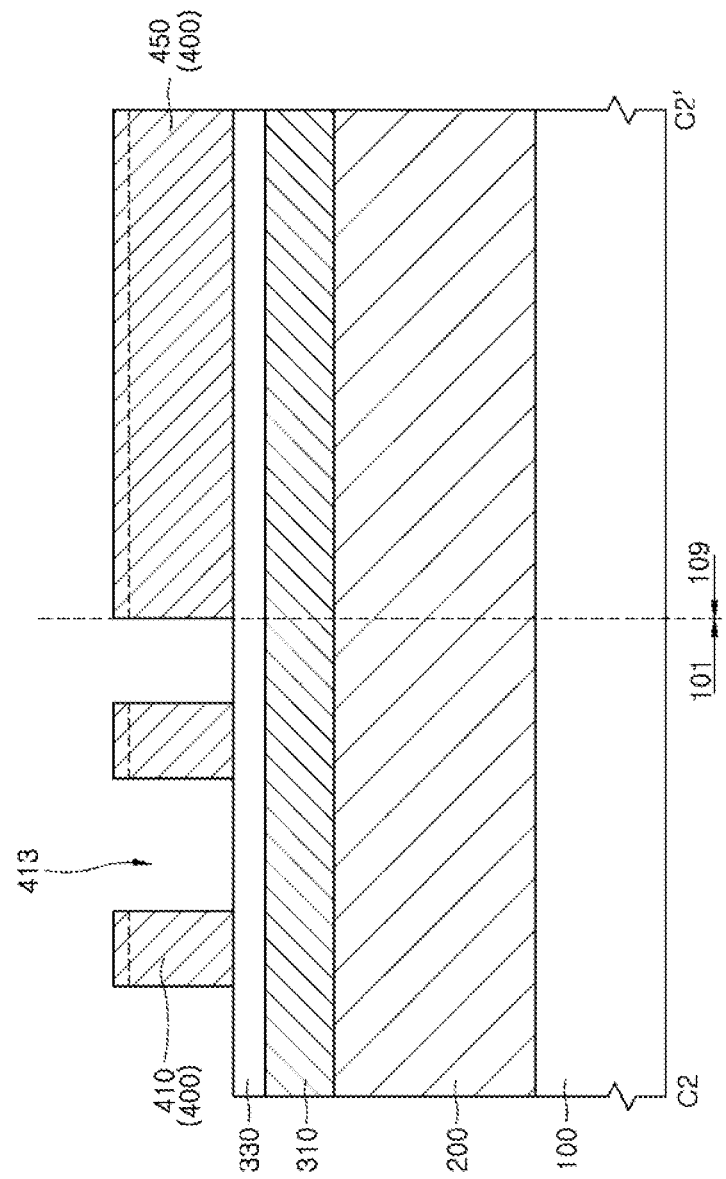

Referring to FIGS. 8, 9 and 10, the pillars 410 may be arrayed so that four adjacent pillars 410 are respectively located at four vertices of a rectangle. The pillars 410 may be arrayed to have a first gap 413 between two adjacent pillars 410. That is, the length of a first side of the rectangle is the first gap 413. For example, the pillars 410 may be arrayed to have the first gap 413 between two adjacent pillars 410 arrayed in a horizontal line, when viewed from a plan view of FIG. 8. In addition, the pillars 410 may be arrayed to have a second gap 411 between two adjacent pillars 410 arrayed in a diagonal line, when viewed from a plan view of FIG. 8. That is, the diagonal length of the rectangle is the second gap 411.

Accordingly, the pillars 410 may be arrayed along the line C2-C2' to be spaced apart from each other by the first gap 413 and may be arrayed along the line C1-C1' to be spaced apart from each other by the second gap 411. In an embodiment, the second gap 411 may be set to be wider than the first gap 413. If the pillars 410 for rectangle, diagonal lines with the length of the second gap 411 may pass a central point of the rectangle. In some embodiments, the pillars 410 may be formed to be located at vertices of a triangle.

The pillars 410 may be formed on an underlying layer 330 disposed on a semiconductor substrate 100. The pillars 410 may be formed in a first region 101 of the semiconductor substrate 100. The first region 101 of the semiconductor substrate 100 may correspond to a region in which relatively dense patterns such as the pillars 410 are arrayed. A template part 450 providing first openings 451 may also be formed on the underlying layer 330 disposed in a second region 109 of the semiconductor substrate 100. The second region 109 may be set to be distinct from and adjacent to the first region 101. The first openings 451 may be arrayed to have a pitch which is greater than a pitch of the pillars 410. In some embodiments, a distance between the first openings 451 may be greater than a distance for example, the first gap 413, between the pillars 410. The first openings 451 may be formed by transferring the layout 79 of the fourth target features 77 illustrated in FIG. 7 onto the semiconductor substrate 100, and the pillars 410 may be formed by transferring the layout 71 of the pillar patterns 72 illustrated in FIG. 7 onto the semiconductor substrate 100.

The pillars 410 and the template part 450 may serve as guide patterns 400 that induce a self-assembly of a BCP layer which is formed in a subsequent process.

The underlying layer 330 may be a hard mask layer. The hard mask layer is patterned to form a hard mask in a subsequent patterning process. In some embodiments, the underlying layer 330 may be a multi-layer. A second etch target layer 310 may be formed between the underlying layer 330 and the semiconductor substrate 100. In addition, a first etch target layer 200 may be formed between the second etch target layer 310 and the semiconductor substrate 100. The first or second etch target layer 200 or 310 may be selectively etched using the hard mask system as an etch mask in a subsequent process. The pillars 410 and the template part 450 may be formed after the first etch target layer 200, the second etch target layer 310 and the underlying layer 330 are sequentially stacked on the semiconductor substrate 100.

The first etch target layer 200 may be formed of an interlayer insulation layer including a silicon oxide layer such as a tetra-ethyl-ortho silicate (TEOS) layer. The first etch target layer 200 may be formed to a thickness of about 2200 angstroms. Alternatively, the first etch target layer 200 may be formed of a conductive layer such as a doped polysilicon layer. The second etch target layer 310 may be formed on the first etch target layer 200 to include an amorphous spin-on-carbon (SOC) layer having a thickness of about 730 angstroms to about 1000 angstroms. The underlying layer 330 may be formed on the second etch target layer 310 for example, an SOC layer, to include a silicon oxynitride (SiON) layer having a thickness of about 300 angstroms to about 350 angstroms.

A material layer such as, a guide layer, including an SOC layer 401 may be formed on the underlying layer 330, and the material layer may be patterned to form the pillars 410 and the template part 450. The SOC layer 401 may have a thickness of about 700 angstroms to about 800 angstroms. In some embodiments, a capping layer 403 may be additionally formed on the SOC layer 401 before the guide layer is patterned. The capping layer 403 may be formed of a silicon oxynitride (SiON) layer. The silicon oxynitride (SiON) layer may have a thickness of about 300 angstroms.

Figure 11:
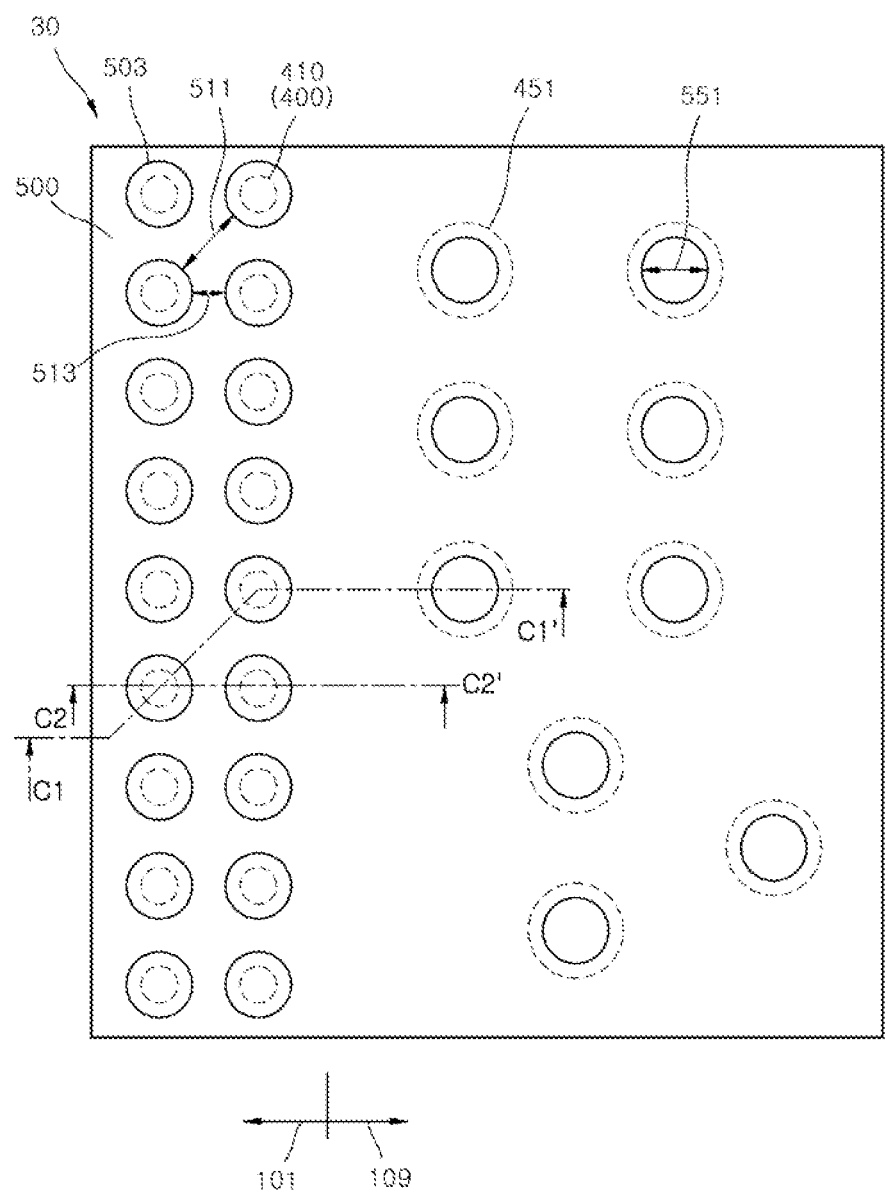
Figure 12:
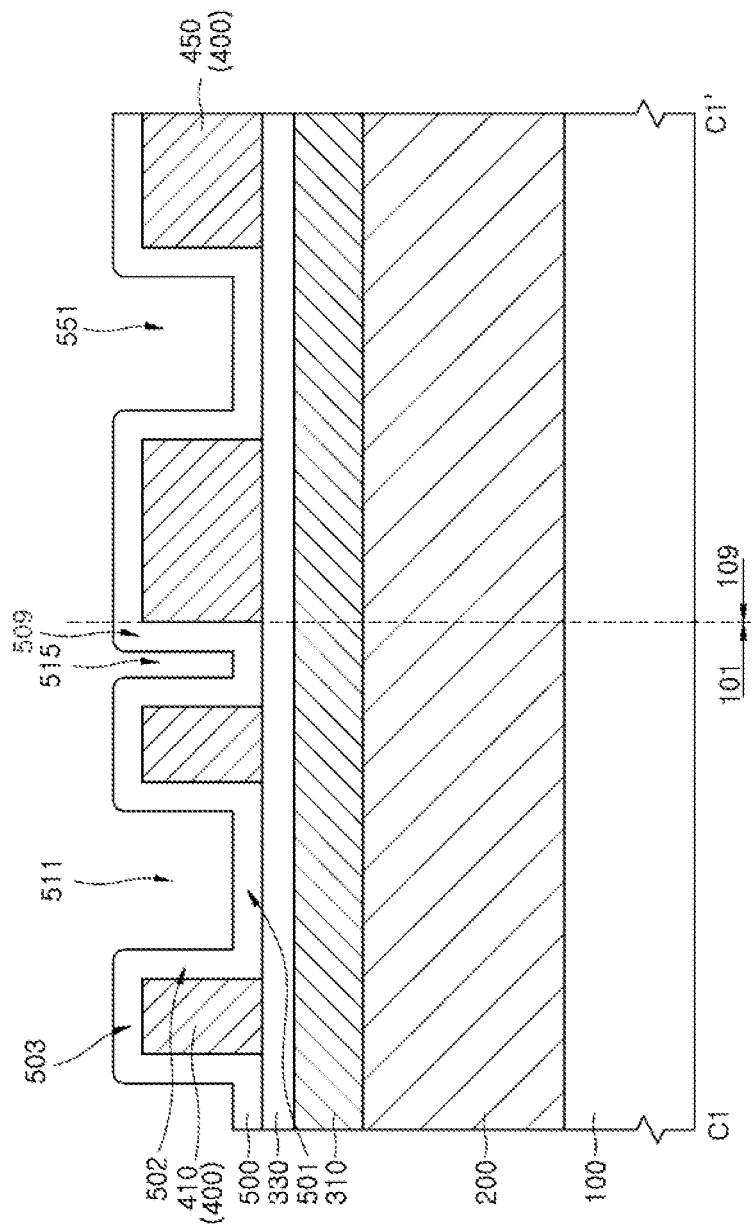

FIG. 11 is a plan view illustrating a step of forming a separation wall layer 500. FIG. 12 is a cross-sectional view taken along a line C1-C1' of FIG. 11, and FIG. 13 is a cross-sectional view taken along a line C2-C2' of FIG. 11.

Figure 13:
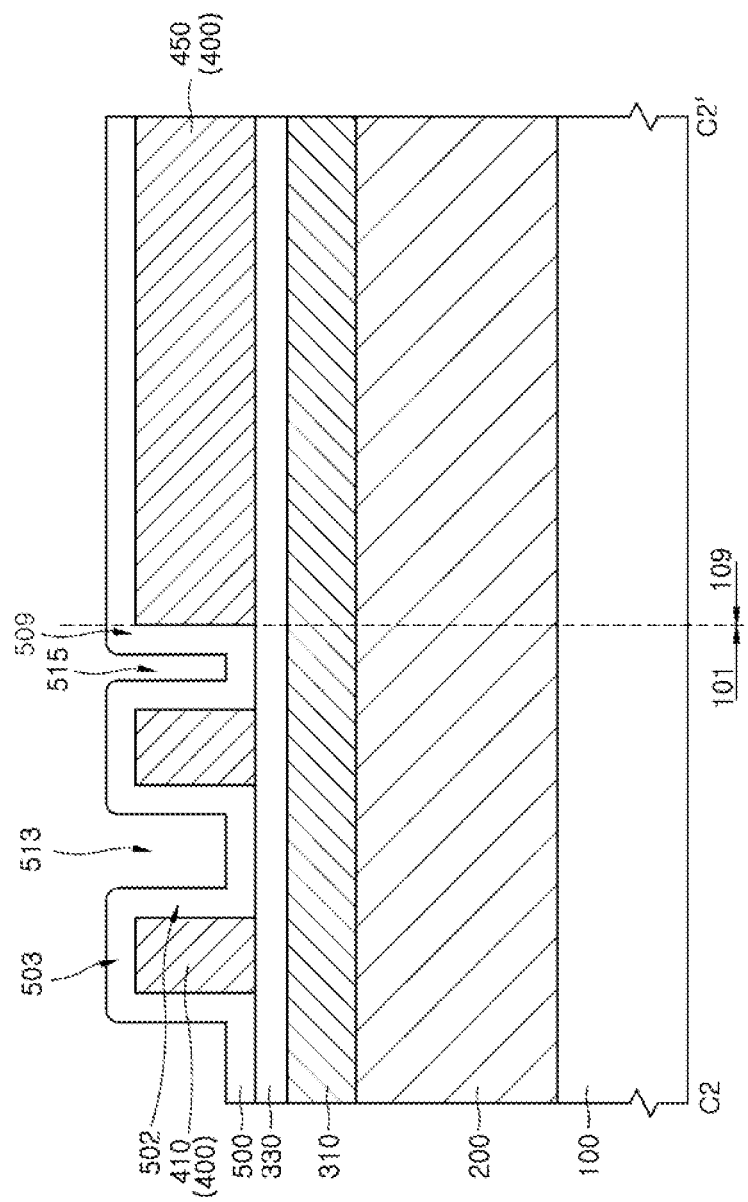

Referring to FIGS. 11, 12 and 13, the separation wall layer 500 may be formed on surfaces of the pillars 410 and the template part 450. The separation wall layer 500 is patterned to form separation walls 502 covering sidewalls of the pillars 410 and sidewalls of the first openings 451. The separation wall layer 500 may be formed to include first extensions 501 covering portions of the underlying layer 330 exposed by the first and second gaps (413 and 411 of FIGS. 8, 9 and 10) and the first openings (451 of FIGS. 8 and 9), second extensions 503 covering top surfaces of the pillars 410, and a boundary wall 509 covering an outer sidewall of the template part 450 located at a boundary between the first region 101 and the second region 109. The separation wall layer 500 may be formed to provide recessed regions defined by a third gap 513 between the pillars 410 arrayed in the horizontal line C2-C2', a fourth gap 511 between the pillars 410 arrayed in the diagonal line C1-C1', a fifth gap 515 between the template part 450 and the pillar 410 in the boundary, and a sixth gap 551 in the first opening 451. The recessed regions are formed using uneven surface profiles of the pillars 410 and the template part 450.

The separation wall layer 500 may be formed of an insulation layer having an etch selectivity with respect to the pillars 410 and the template part 450. For example, the separation wall layer 500 may be formed of an ultra-low temperature oxide (ULTO) layer having a thickness of about 200 angstroms.

Figure 14:
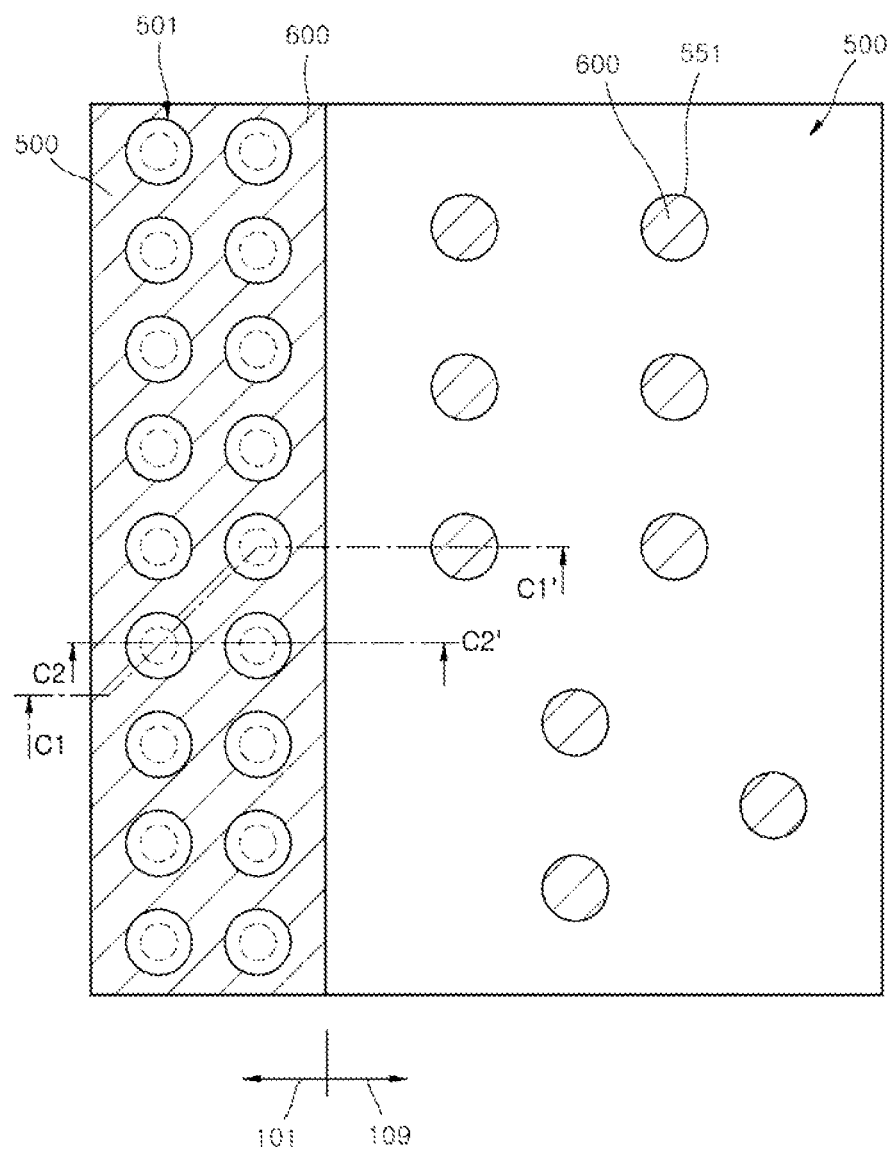
Figure 15:
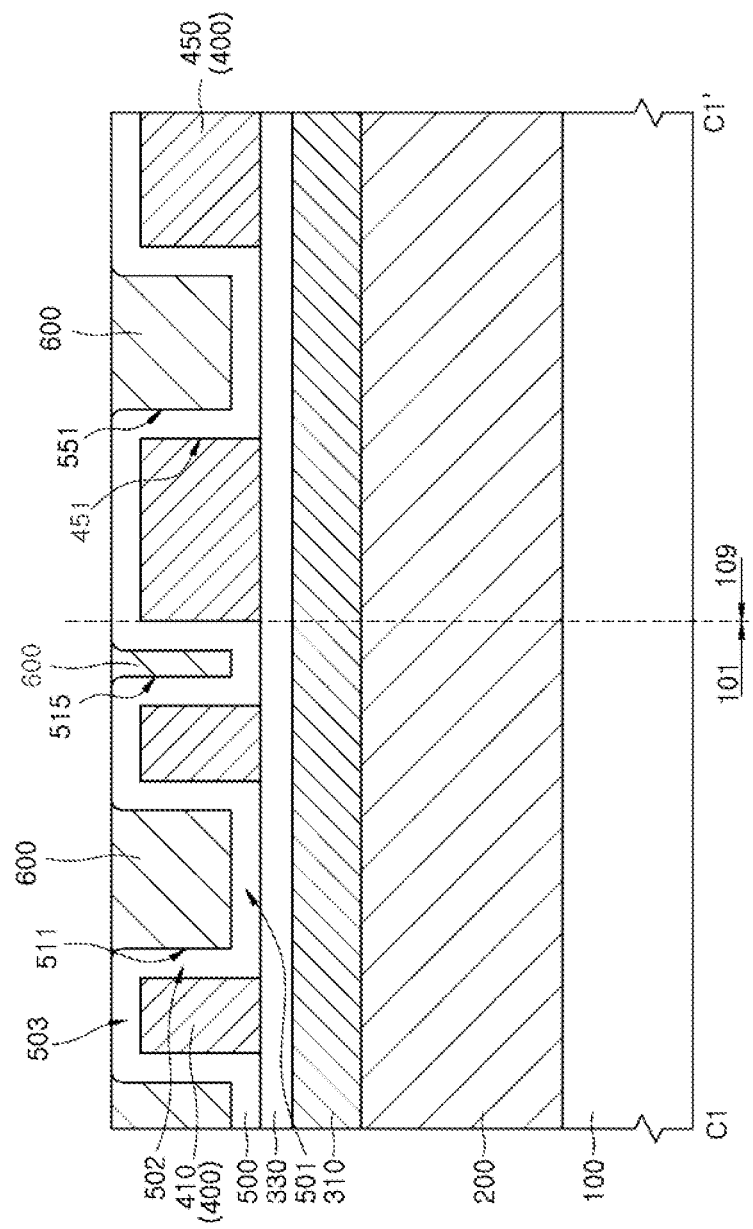

FIG. 14 is a plan view illustrating a step of forming a BCP layer 600. FIG. 15 is a cross-sectional view taken along a line C1-C1' of FIG. 14, and FIG. 16 is a cross-sectional view taken along a line C2-C2' of FIG. 14.

Figure 16:
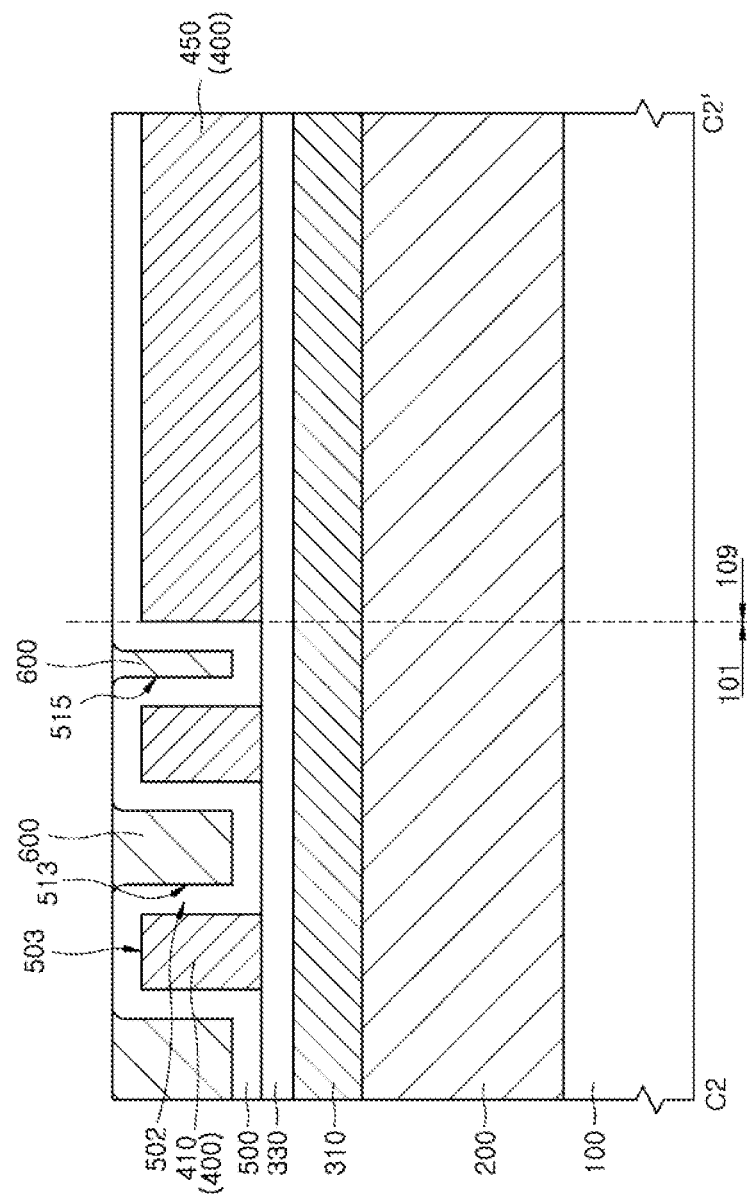

Referring to FIGS. 14, 15 and 16, the BCP layer 600 may be formed to fill the gaps 511, 513, 515 and 551 which are provided by the separation wall layer 500. The BCP layer 600 may be formed to include a polystyrene-poly(meta methyl acrylate) block copolymer (PS-b-PMMA) material or a polystyrene-poly(di methyl siloxane) (PS-PDMS) block copolymer material. In the event that the BCP layer 600 is formed of a PS-b-PMMA material including PS blocks and PMMA blocks, a volume ratio of the PS blocks to the PMMA blocks may be controlled to be within the range of about 7:3 to about 5:5. The volume ratio of the PS blocks to the PMMA blocks or the molecular weights of the PS and the PMMA may be appropriately controlled according to a process scheme. For example, the PS-b-PMMA material may have a PS block content of about 60 vol. % to about 80 vol. % and a PMMA block content of about 20 vol. % to about 40 vol. %.

Figure 41:
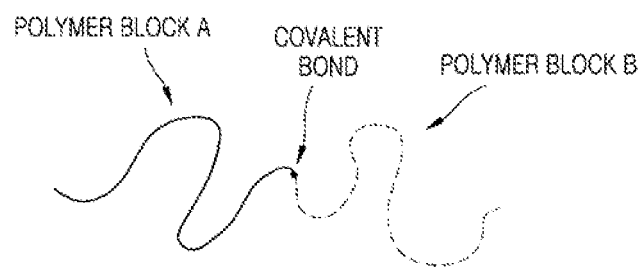
FIGS. 41, 42 and 43 are schematic views illustrating phase separations of block copolymer (BCP) layers used in some embodiments.
Figure 42:
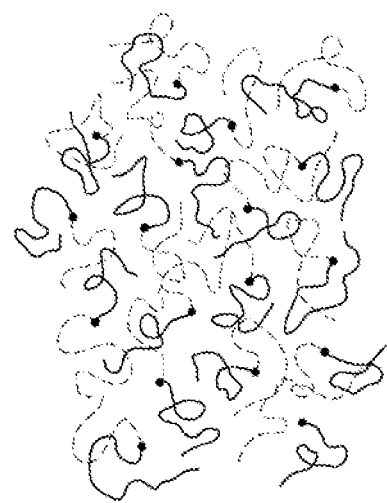
Figure 43:
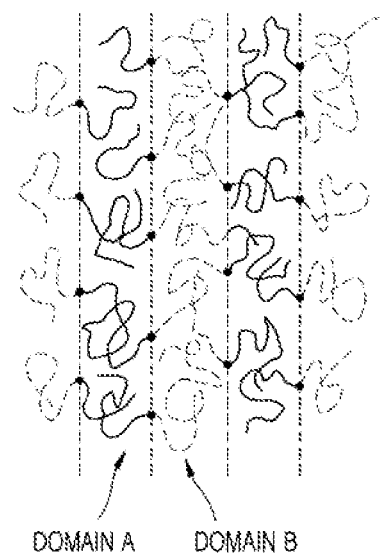

The BCP layer 600 may be a functional polymer material, Polymer blocks having two or more distinct structures are combined with each other by a covalent bond to constitute a single block copolymer material, as illustrated in FIG. 41. FIGS. 41, 42 and 43 are schematic views illustrating a phase separation of the BCP layer 600 used in some embodiments. As illustrated in FIG. 41, the BCP layer 600 may have a chain shape so that a polymer block 'A' and a polymer block. 'B' are connected to each other by a covalent bond through a connection point. That is, the BCP layer 600 may include two or more moieties, for example, the polymer block 'A' and the polymer block 'B'. The BCP layer 600 may be in a homogeneous phase, as illustrated in FIG. 42. The polymer blocks have distinct structures from each other and may have different miscibility and different solubility from each other due to a difference in chemical structure.

For example, the polymer blocks having distinct structures are immiscible with each other at a certain temperature. Thus, the BCP layer 600 may be phase-separated using an annealing process to provide a self-aligned structure, as illustrated in FIG. 43. Accordingly, the BCP layer 600 having a homogeneous phase may be phase-separated into a domain 'A' mainly formed of the polymer blocks 'A' and a domain 'B' mainly formed of the polymer blocks 'B' by an annealing process. As such, polymer blocks of the BCP layer 600 may be phase-separated or selectively dissolved in a liquid state or in a solid state to form a self-assembled structure.

Forming a nano-scale structure having a specific shape through a self-assembly of the BCP layer 600 may be influenced by a physical property and/or a chemical property of the polymer blocks forming the BCP layer 600. When a BCP layer consisting of two distinct polymer blocks, that is, two moieties, is self-assembled on a substrate, the self-assembled structure of the BCP layer may be formed to have a three dimensional cubic shape, a three dimensional double helix shape, a two dimensional hexagonal packed column shape, or a two dimensional lamella shape according to a volume ratio of the polymer blocks constituting the BCP layer, an annealing temperature applied for phase separation of the BCP layer, a molecule size of the polymer blocks constituting the BCP layer, etc.

In some embodiments, the BCP layer 600 may include polybutadiene-polybutylmethacrylate block, polybutadiene-polydimethylsiloxane block copolymer, polybutadiene-polymethylmethacrylate block copolymer, polybutadienepolyvinylpyridine block copolymer, polybutylacrylate-polymethylmethacrylate block copolymer, polybutylacrylate-polyvinylpyridine block copolymer, polyisoprene-polyvinylpyridine block copolymer, polyisoprene-polymethylmethacrylate block copolymer, polyhexylacrylatepolyvinylpyridine block copolymer, polyisobutylene-polybutylmethacrylate block copolymer, polyisobutylene-polymethylmethacrylate block copolymer, polyisobutylene-polybutylmethacrylate block copolymer, polyisobutylenepolydimethylsiloxane block copolymer, polybutylmethacrylatepolybutylacrylate block copolymer, polyethylethylene-polymethylmethacrylate block copolymer, polystyrene-polybutylmethacrylate block copolymer, polystyrene-polybutadiene block copolymer, polystyrene-polyisoprene block copolymer, polystyrene-polydimethylsiloxane block copolymer, polystyrene-polyvinylpyridine block copolymer, polyethylethylene-polyvinylpyridine block copolymer, polyethylene-polyvinylpyridine block copolymer, polyvinylpyridinepolymethylmethacrylate block copolymer, polyethyleneoxide-polyisoprene block copolymer, polyethyleneoxide-polybutadiene block copolymer, polyethyleneoxide-polystyrene block copolymer, polyethyleneoxidepolymethylmethacrylate block copolymer, polyethyleneoxide-polydimethylsiloxane block copolymer, or polystyrene-polyethyleneoxide block copolymer.

Figure 17:
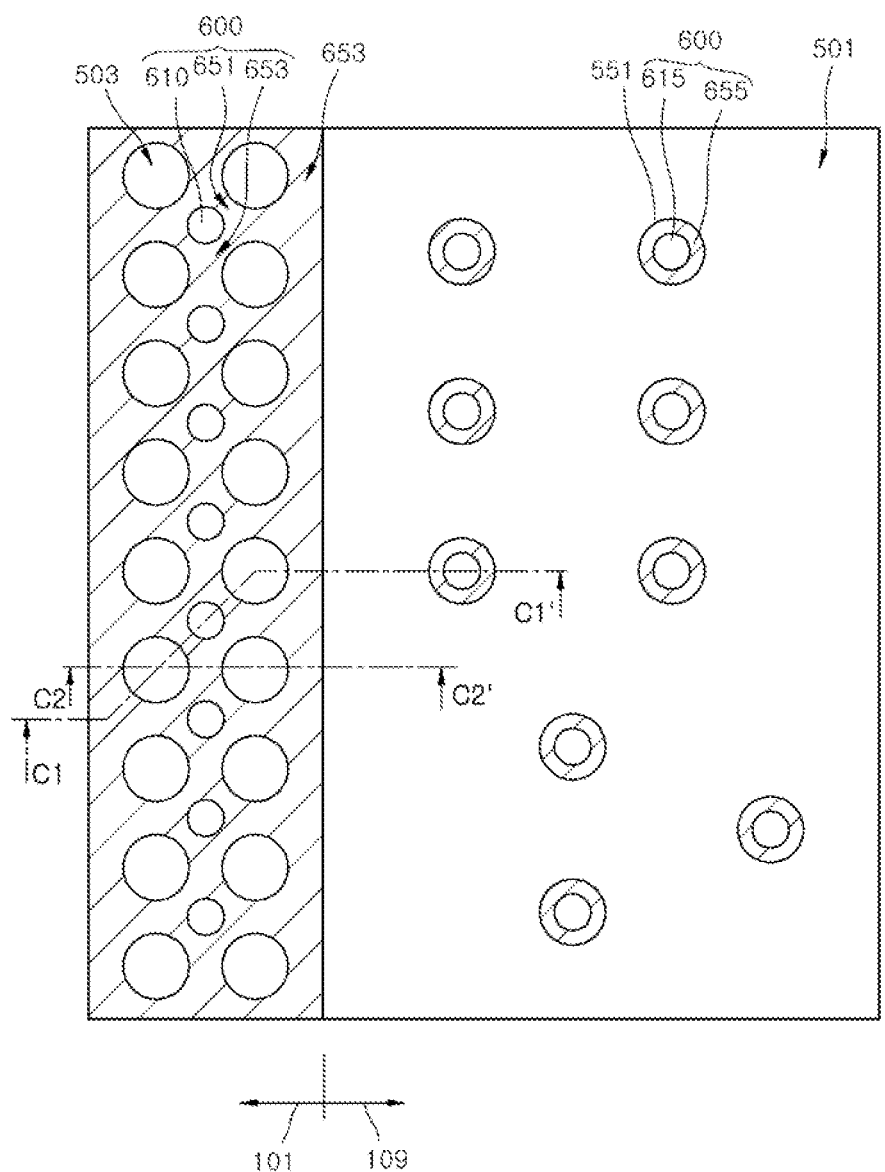
Figure 18:
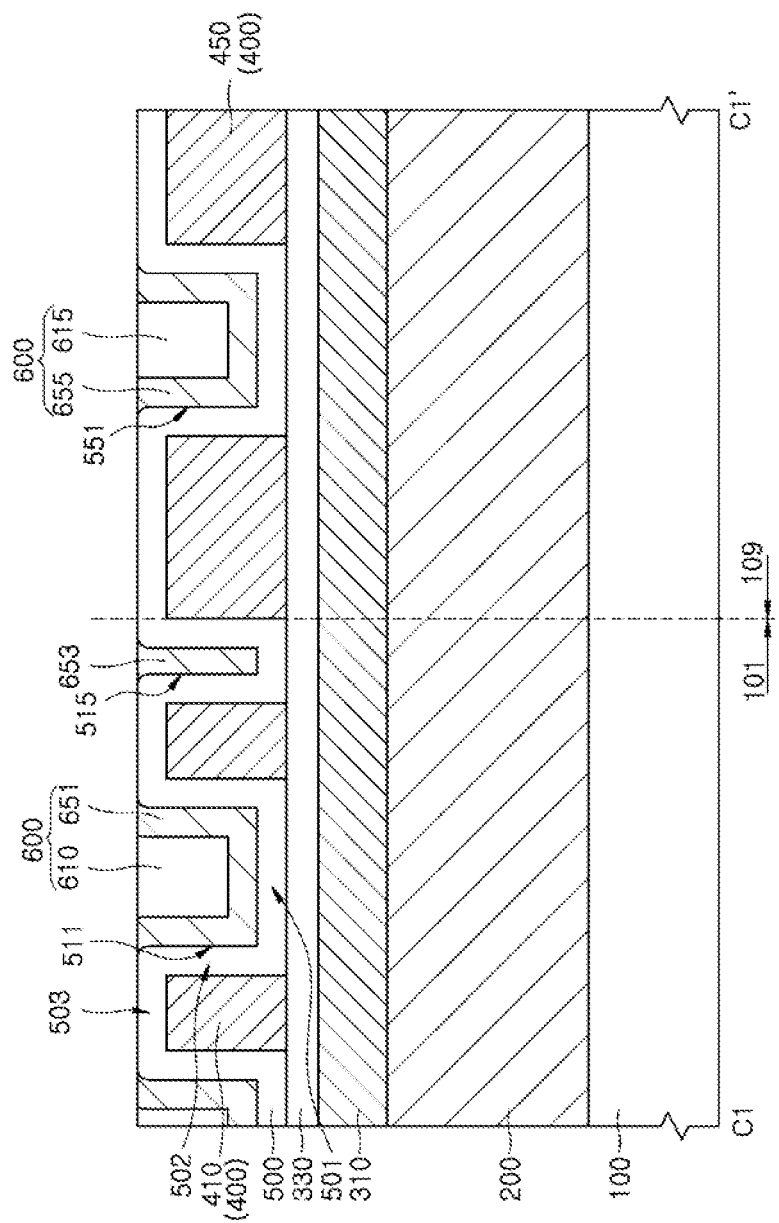

FIG. 17 is a plan view illustrating a step of phase-separating the BCP layer 600. FIG. 18 is a cross-sectional view taken along a line C1-C1' of FIG. 17, and FIG. 19 is a cross-sectional view taken along a line C2-C2' of FIG. 17.

Figure 19:
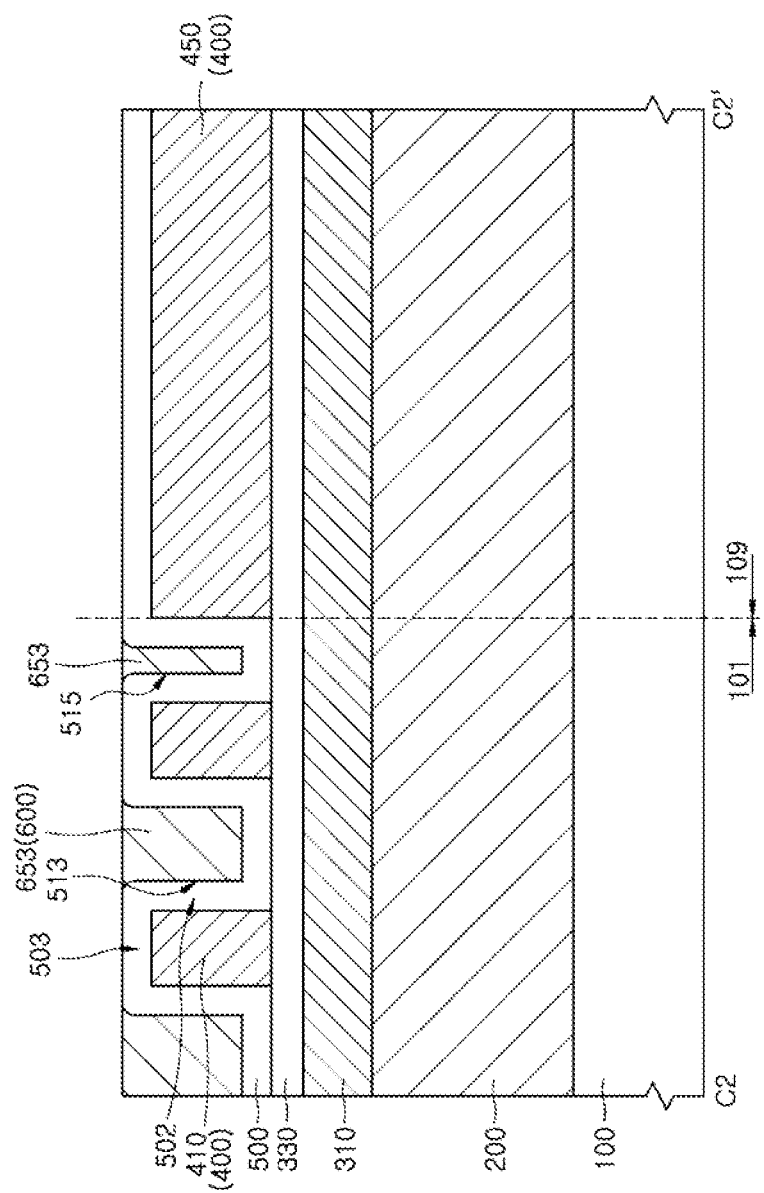

Referring to FIGS. 17, 18 and 19, the BCP layer 600 may be phase-separated using an annealing process to form a first domain or an inner domain 610 located at a central portion of each of the fourth gaps 511 between the separation walls 502 of the BCP layer 600 and a second domain or an outer domain 651 disposed in each of the fourth gaps 511 to surround the first domain 610. During the annealing process, portions 653 of the BCP layer 600 filling the third gaps 513 and the fifth gaps 515 provided by the separation wall layer 500 may be phase-separated to form only the second domains or may not be phase-separated to maintain the original homogeneous phase thereof. This is due to each of the third gaps 513 and the fifth gaps 515 being designed to have an insufficient space for full phase separation of the BCP layer 600.

During the annealing process, the BCP layer 600 filling each of the sixth gaps 551 in the first openings (451 of FIG. 8) may be phase separated to form a third domain or an inner domain 615 located at a central portion of each of the sixth gaps 551 and a fourth domain or an outer domain 655 disposed in each of the third gaps 513 to surround the third domain 615. The first and third domains 610 and 615 may be formed to have substantially the same polymer component. Each of the second and fourth domains 651 and 655 may be formed to cover the first extension 501 and the separation walls adjacent to the first extension 501 to have a concave structure for example, a cylinder structure, surrounding a bottom surface and a sidewall of the first domain 610 or the third domain 615. Each of the first and third domains 610 and 615 may be formed to have a post shape and be surrounded by the second or fourth domain 651 or 655.

The phase separation of the BCP layer 600 may be achieved by annealing the BCP layer 600 at a temperature exceeding a glass transition temperature Tg of the BCP layer 600 to rearrange the polymer blocks of the BCP layer 600. For example, the BCP layer 600 may be annealed at a temperature of about 100 degrees Celsius to about 300 degrees Celsius for about six minutes to about twenty four hours to rearrange the polymer blocks of the BCP layer 600.

Figure 20:
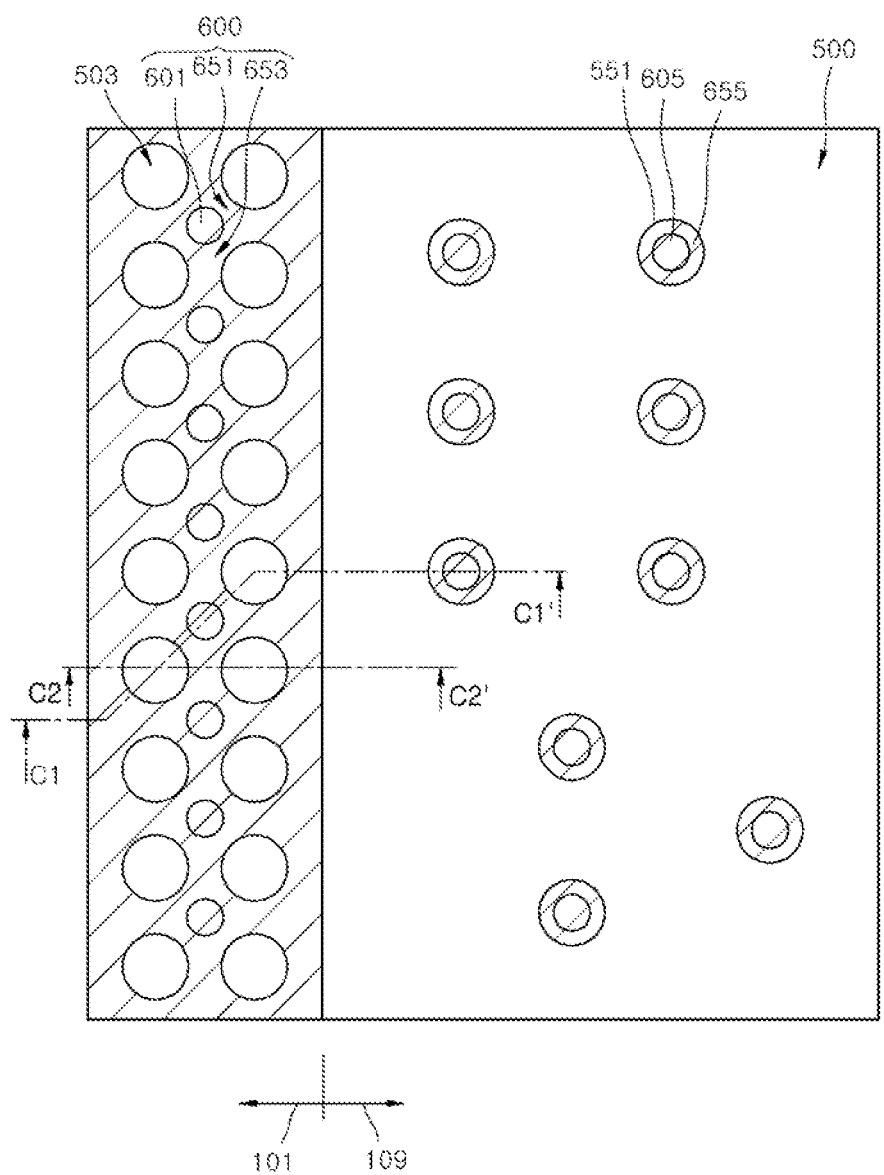
Figure 21:
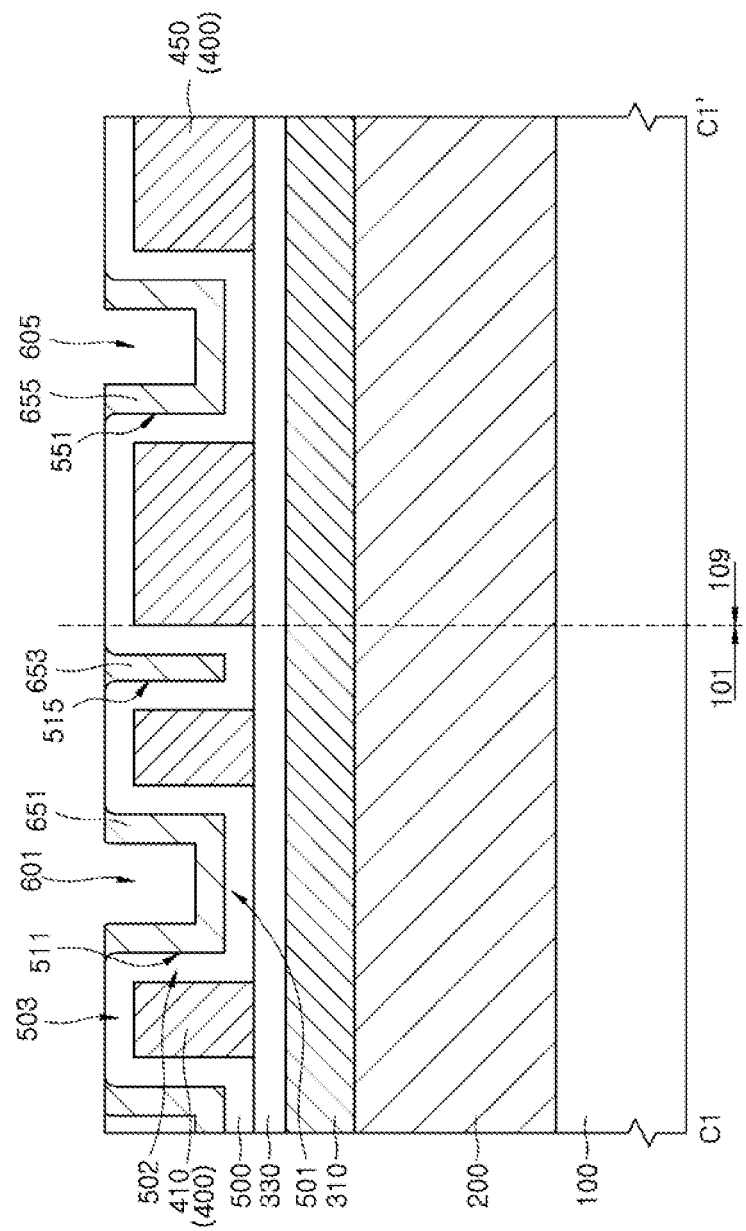

FIG. 20 is a plan view illustrating a step of forming a plurality of second openings 601 and a plurality of third openings 605. FIG. 21 is a cross-sectional view taken along a line C1-C1' of FIG. 20, and FIG. 22 is a cross-sectional view taken along a line C2-C2' of FIG. 20.

Figure 22:
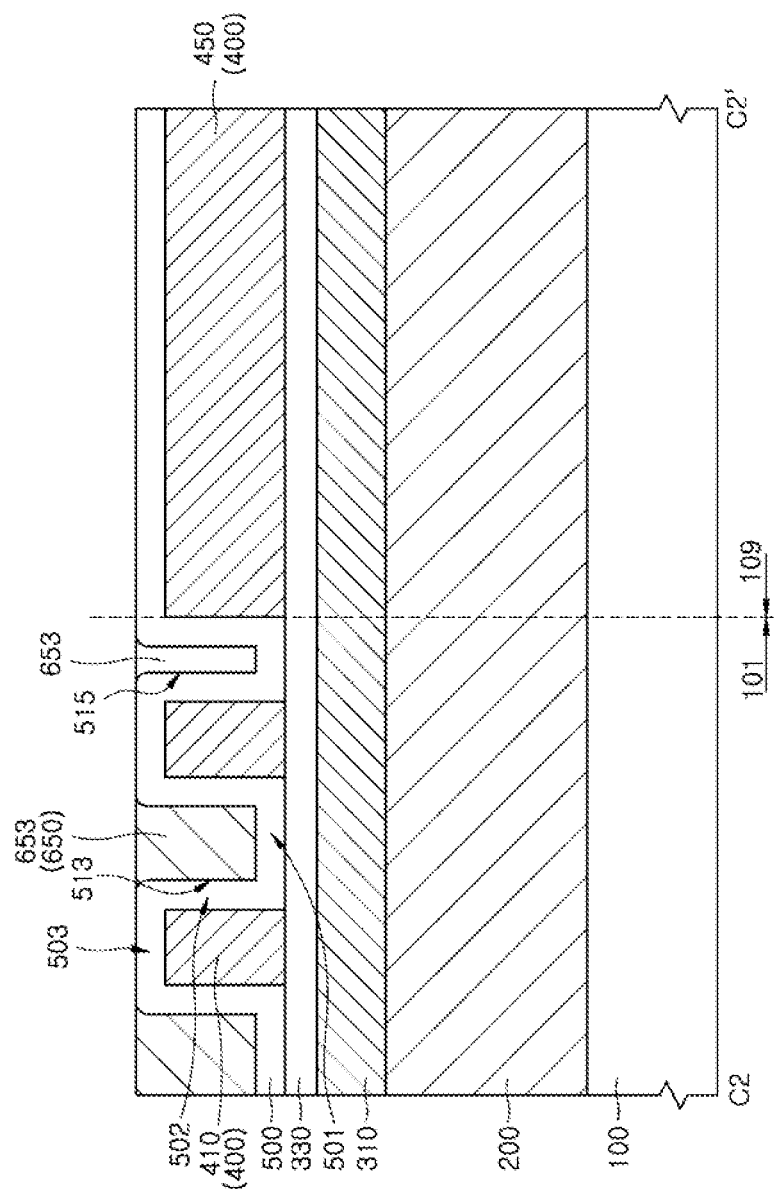

Referring to FIGS. 20, 21 and 22, the first and third domains (610 and 615 of FIG. 18) may be selectively removed to form the plurality of second openings 601 located between the pillars 410 and the plurality of third openings 605 located in the first openings (451 of FIG. 8).

Figure 23:
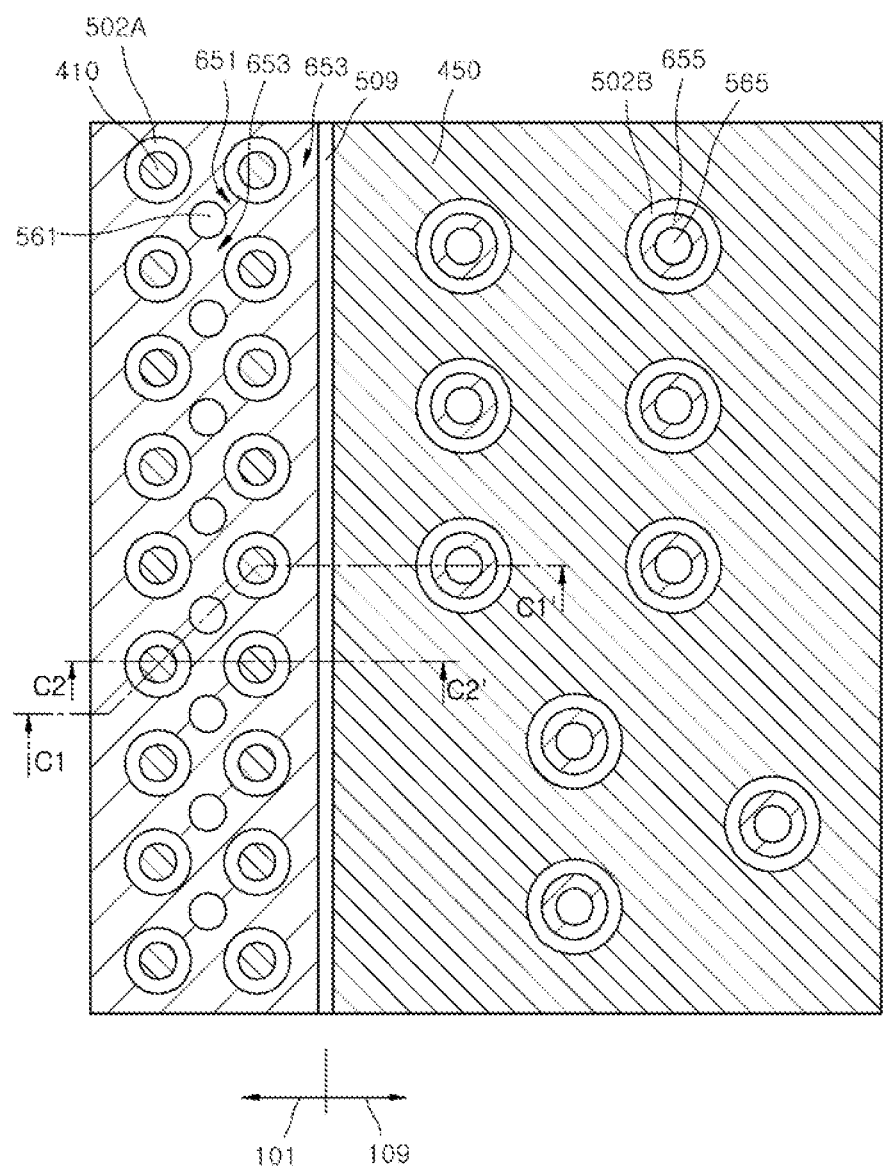
Figure 24:
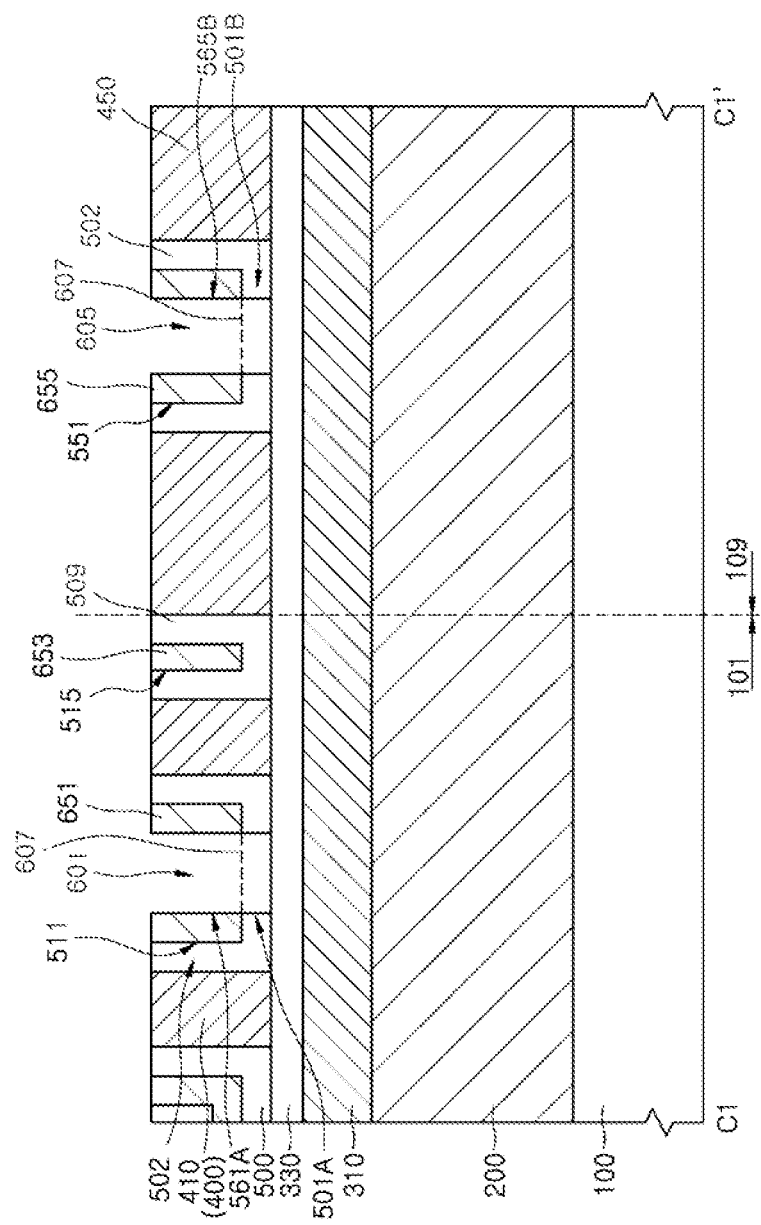

FIG. 23 is a plan view illustrating a step of forming a plurality of ninth openings 561A and a plurality of tenth openings 565B. FIG. 24 is a cross-sectional view taken along a line C1-C1' of FIG. 23, and FIG. 25 is a cross-sectional view taken along a line C2-C2' of FIG. 23.

Figure 25:
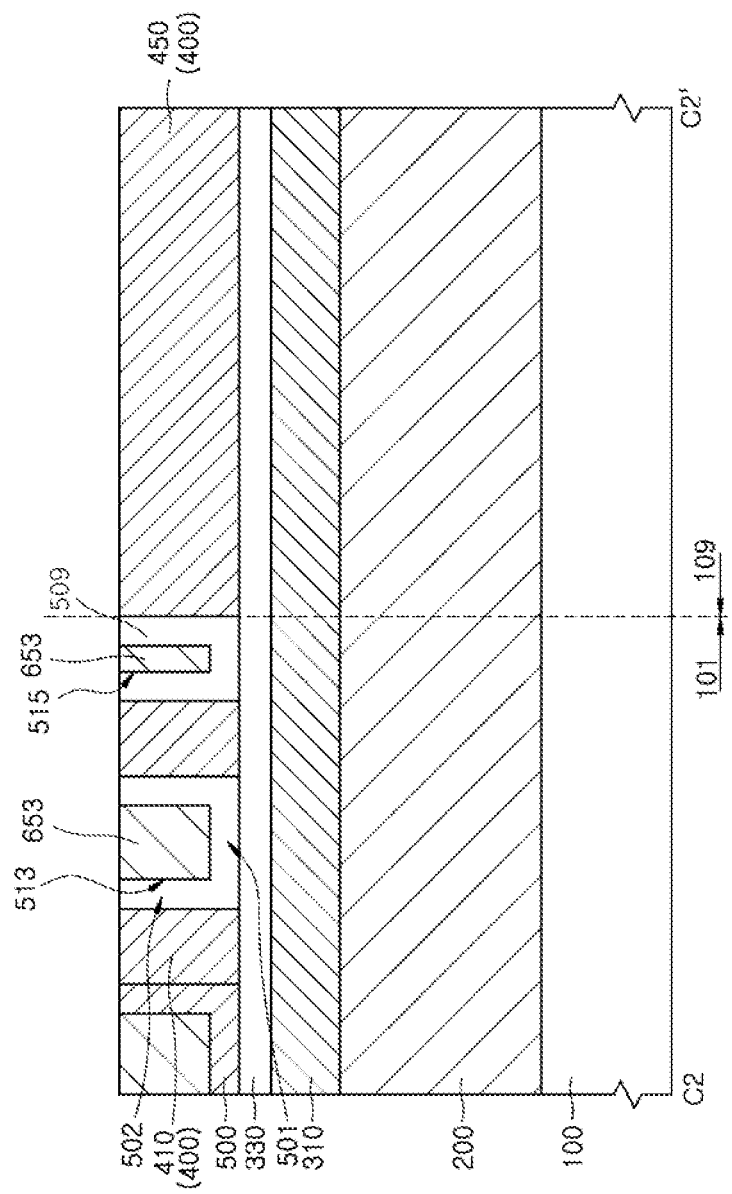

Referring to FIGS. 23, 24 and 25, bottom portions 607 of the second and fourth domains 651 and 655 exposed by the second and third openings 601 and 605 may be selectively removed to form the ninth openings 561A extending from the second openings 601 and the tenth openings 565B extending from the third openings 605. The first extensions 501 of the separation wall layer 500 exposed by the ninth openings 561A and the tenth openings 565B may be selectively removed to form eleventh openings 501A further extending from the second openings 601 and twelfth openings 501B further extending from the third openings 605. While the eleventh openings 501A and the twelfth openings 501B are formed, the second extensions 503 of the separation wall layer 500 covering the top surfaces of the pillars 410 may also be removed to expose the top surfaces of the pillars 410.

Figure 26:
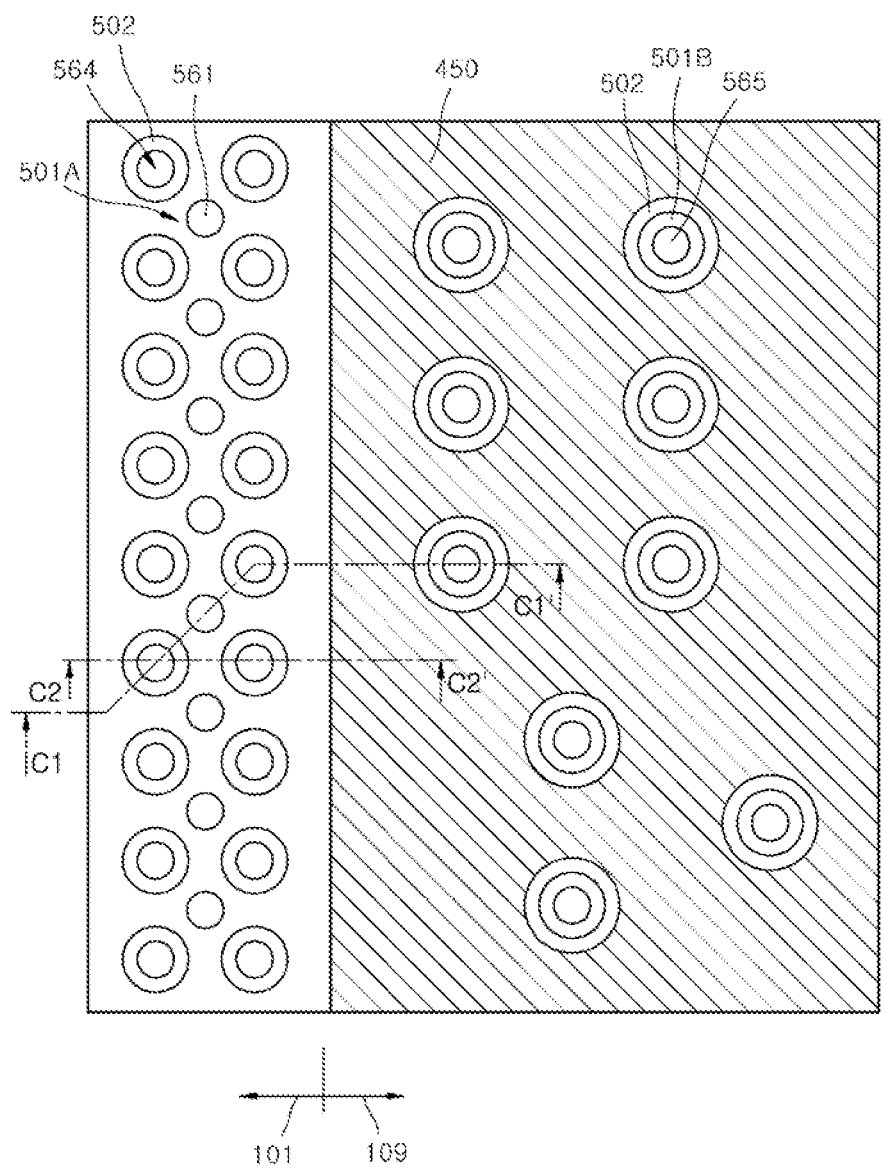
Figure 27:
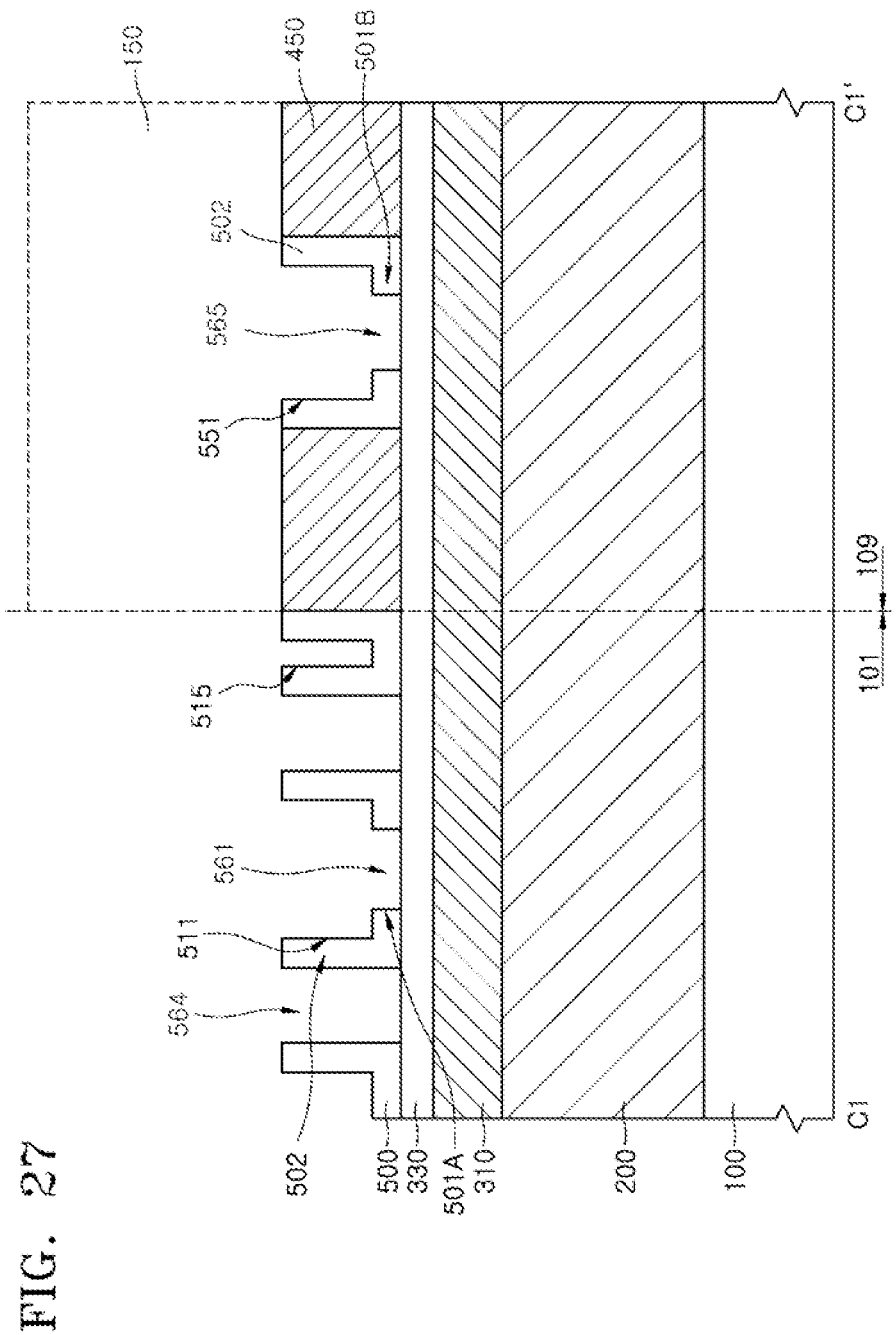

FIG. 26 is a plan view illustrating a step of forming fourth openings 564. FIG. 27 is a cross-sectional view taken along a line C1-C1' of FIG. 26, and FIG. 28 is a cross-sectional view taken along a line C2-C2' of FIG. 26.

Figure 28:
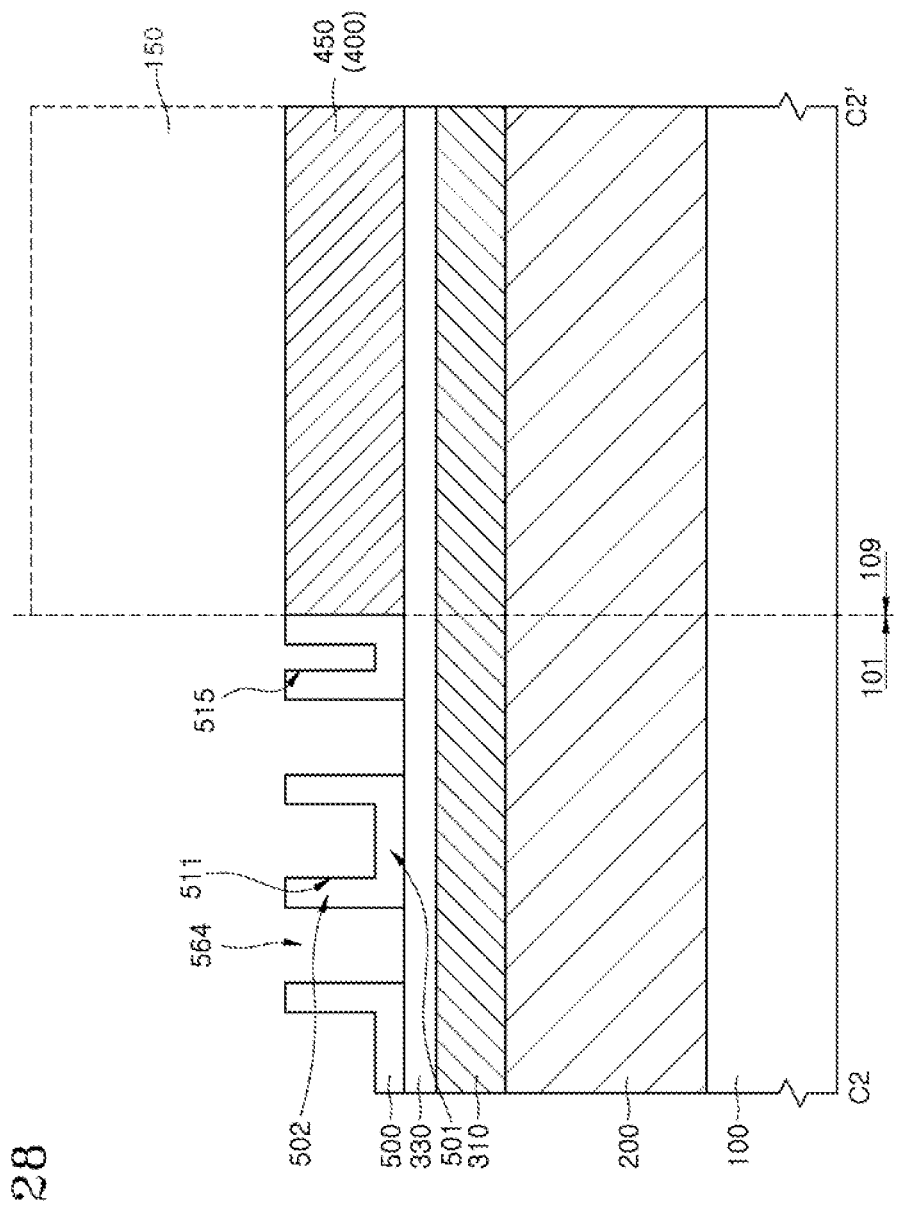

Referring to FIGS. 26, 27 and 28, the pillars 410 may be selectively removed to form the fourth openings 564. A mask 150 covering the template part 450 may be formed prior to removal of the pillars 410 to prevent the template part 450 from being removed while the pillars 410 are removed. The mask 150 may be formed to include a photoresist layer. The mask 150 may be removed after the fourth openings 564 are formed.

Figure 29:
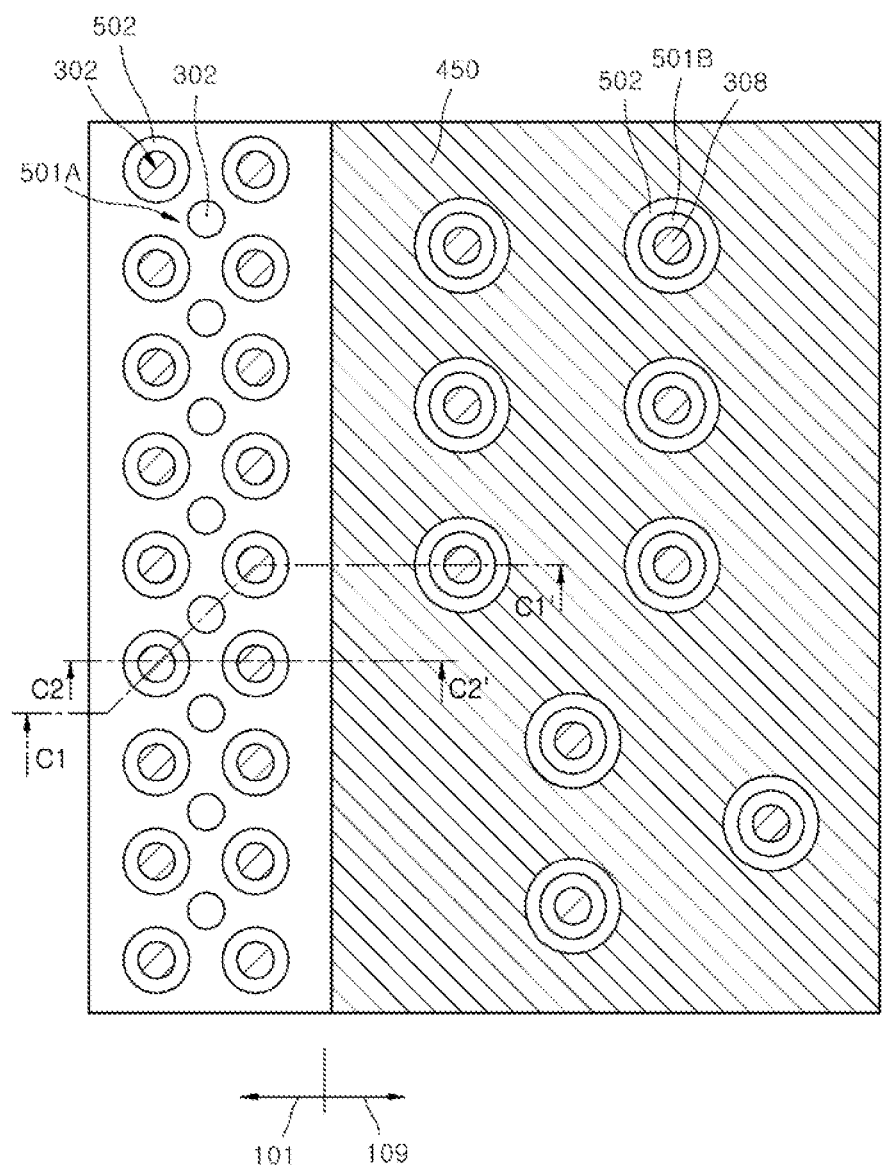
Figure 30:
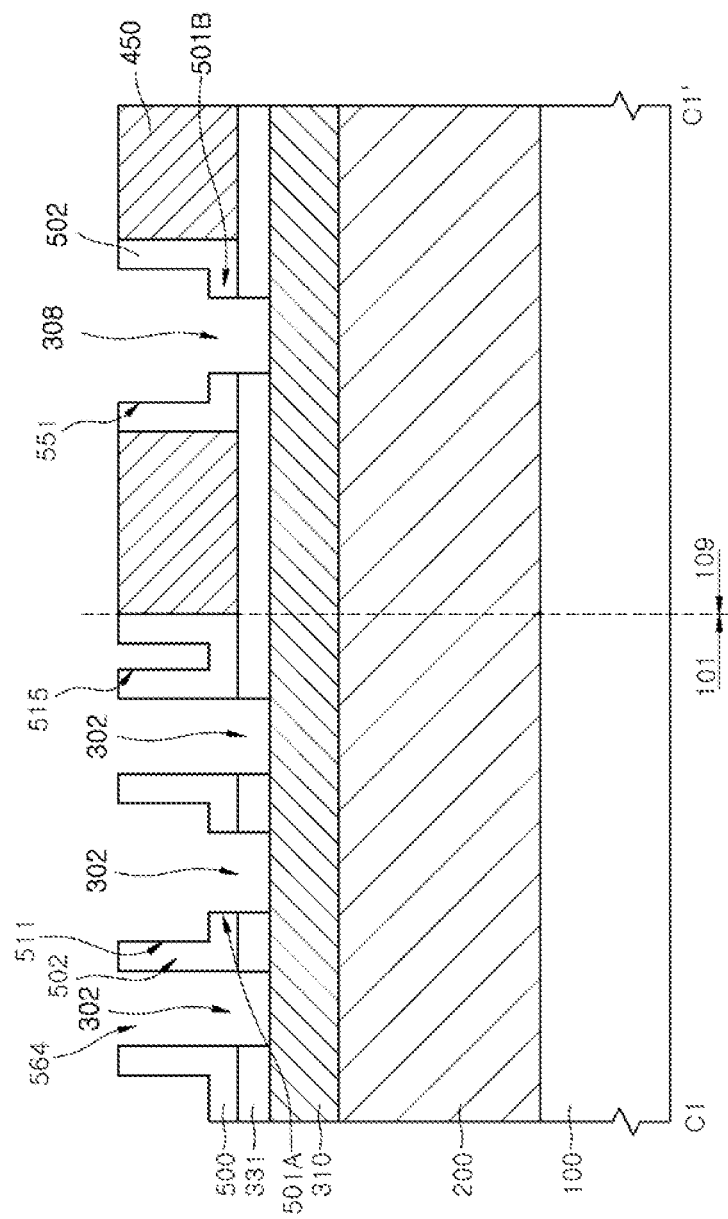

FIG. 29 is a plan view illustrating a step of forming fifth openings 302 and sixth openings 308. FIG. 30 is a cross-sectional view taken along a line C1-C1' of FIG. 29, and FIG. 31 is a cross-sectional view taken along a line C2-C2' of FIG. 29.

Figure 31:
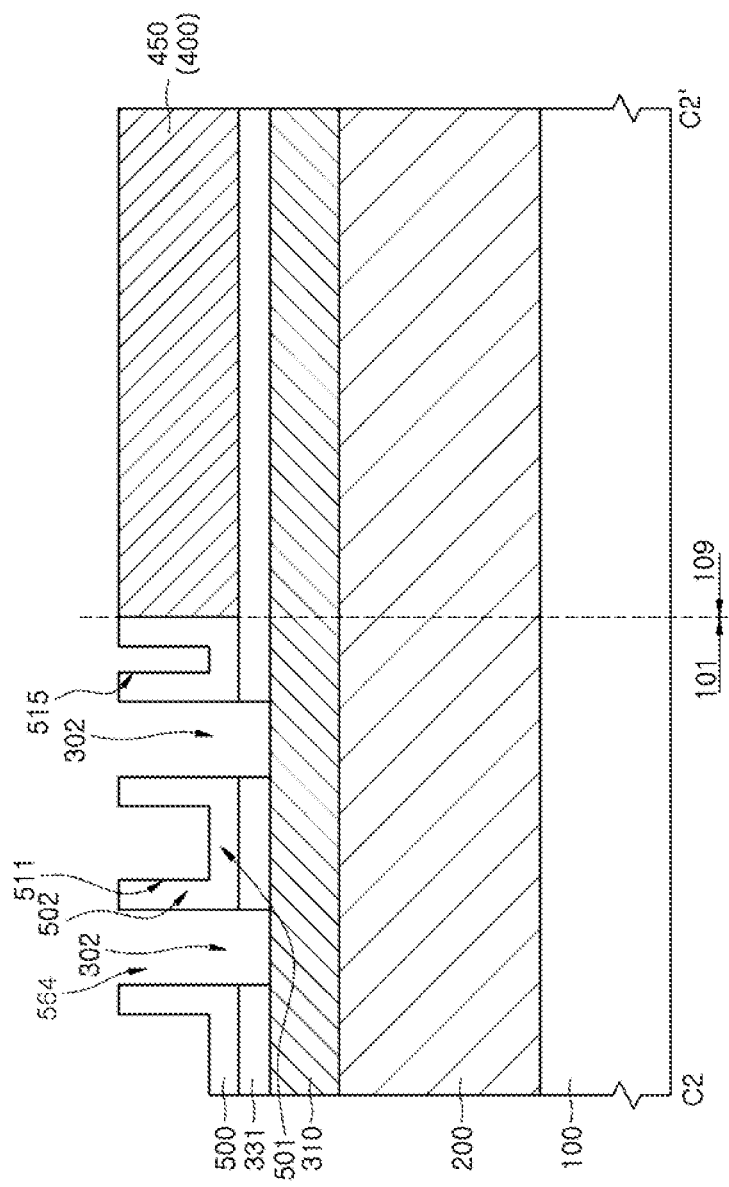

Referring to FIGS. 29, 30 and 31, portions of the underlying layer 330 exposed by the eleventh openings 501A and the fourth openings 564 may be selectively etched to form the fifth openings 302, and portions of the underlying layer 330 exposed by the twelfth openings 501B may be selectively etched to form the sixth openings 308. While the fifth openings 302 and the sixth openings 308 are formed, the separation walls 502 of the separation wall layer 500, the first extensions 501 laterally extending from separation walls 502, and the template part 450 may serve as etch masks to protect portions of the underlying layer 330 located under the separation walls 502, the first extensions 501 and the template part 450. The fifth openings 302 may be formed to substantially extend from the second opening 601 of FIG. 21 and the fourth openings 564 of FIG. 27, and the sixth openings 308 may be formed to substantially extend from the third openings 605 of FIG. 21. As a result of the etch process for forming the fifth and sixth openings 302 and 308, an underlying pattern 331 providing the fifth and sixth openings 302 and 308 may be formed.

Figure 32:
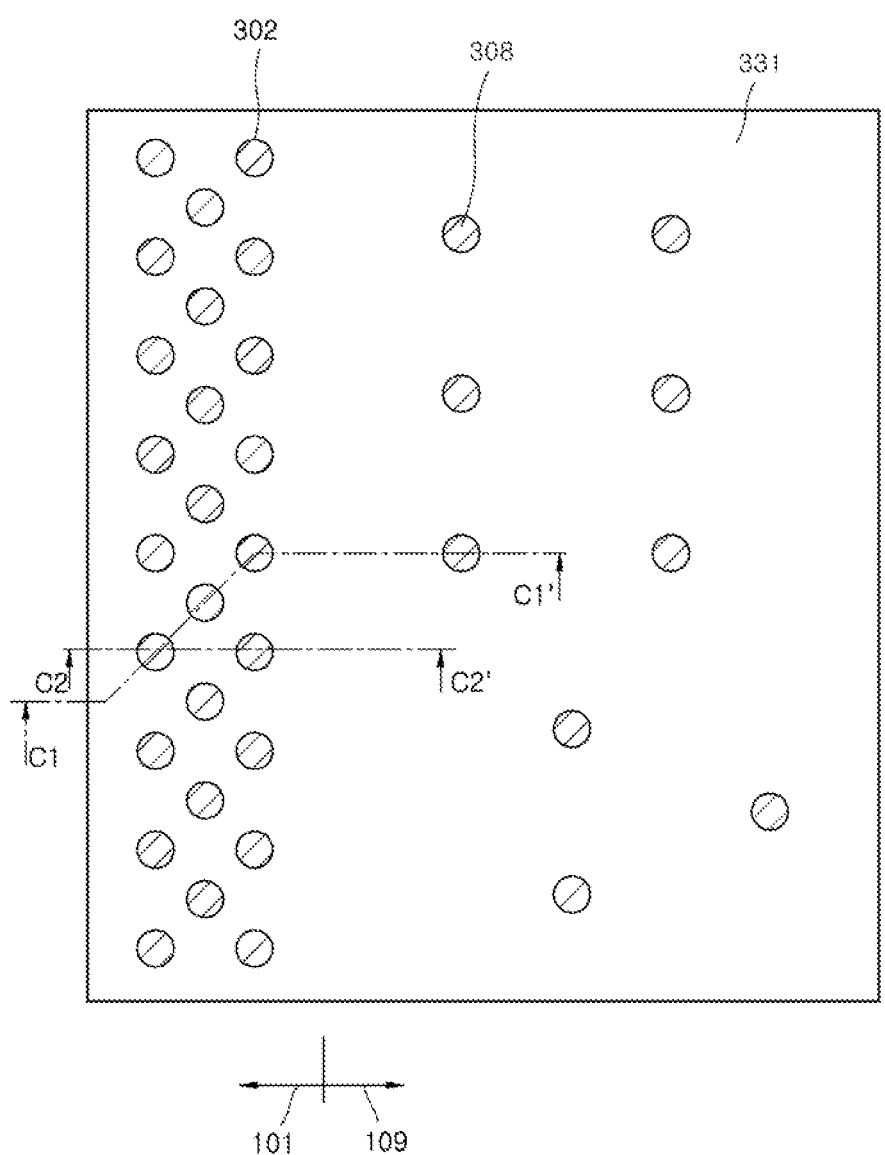
Figure 33:
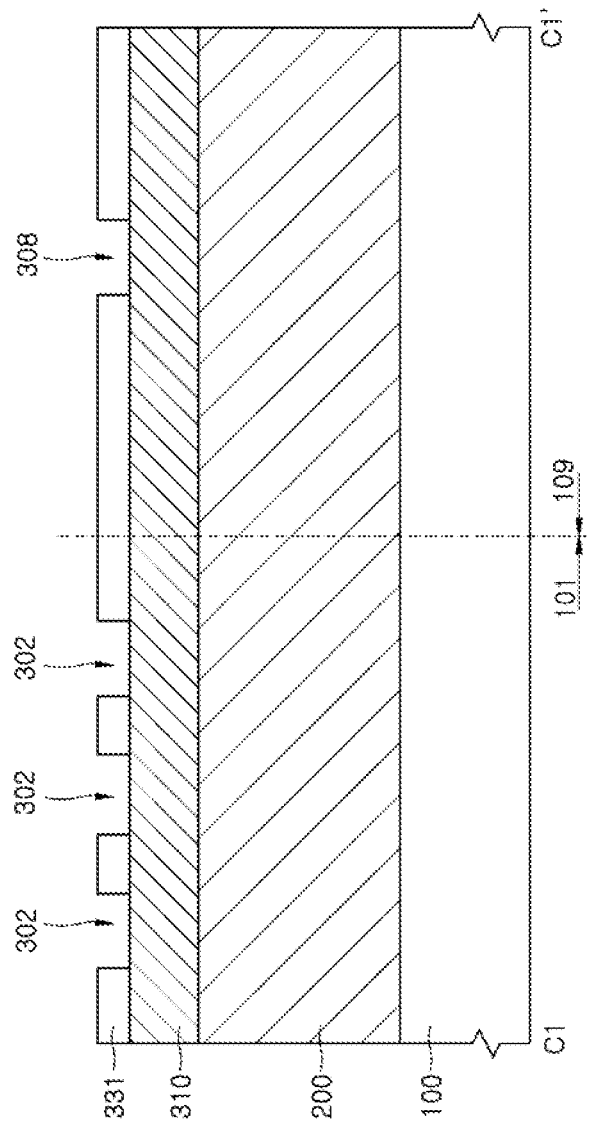

FIG. 32 is a plan view illustrating the underlying pattern 331. FIG. 33 is a cross-sectional view taken along a line C1-C1' of FIG. 32, and FIG. 34 is a cross-sectional view taken along a line C2-C2' of FIG. 32.

Figure 34:
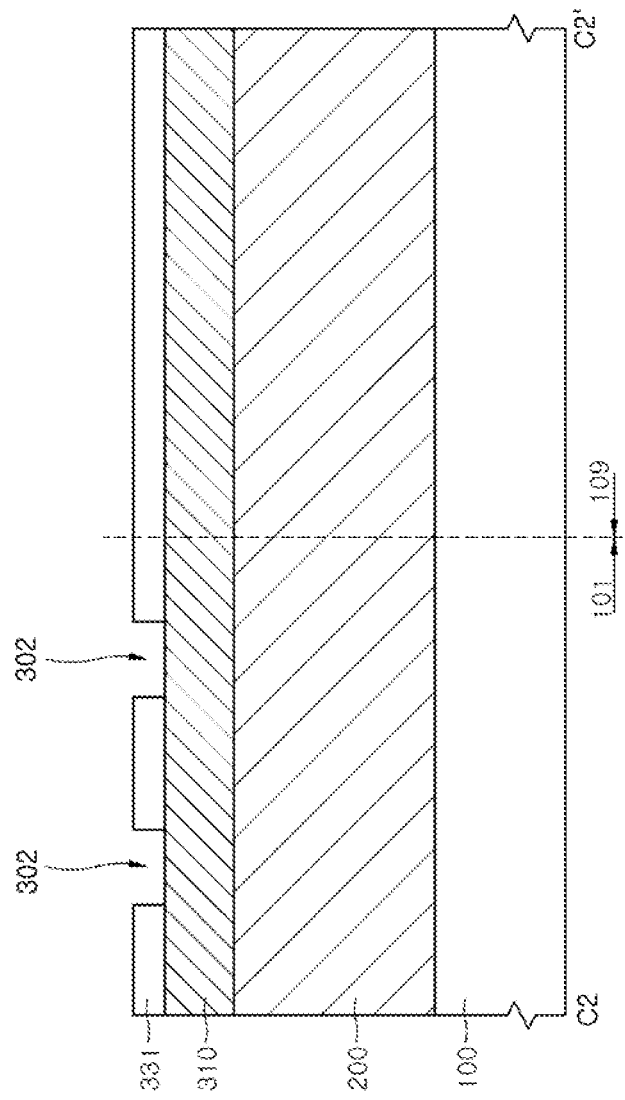

Referring to FIGS. 32, 33 and 34, the separation walls 502, the first extensions 501 and the template part 450 may be removed to expose a top surface of the underlying pattern 331. The underlying pattern 331 may provide an array of the fifth openings 302 and an array of the sixth openings 308.

The array of the fifth openings 302 and the array of the sixth openings 308 may be formed by transferring the layout 30 of FIG. 3 onto the substrate 100.

Figure 35:
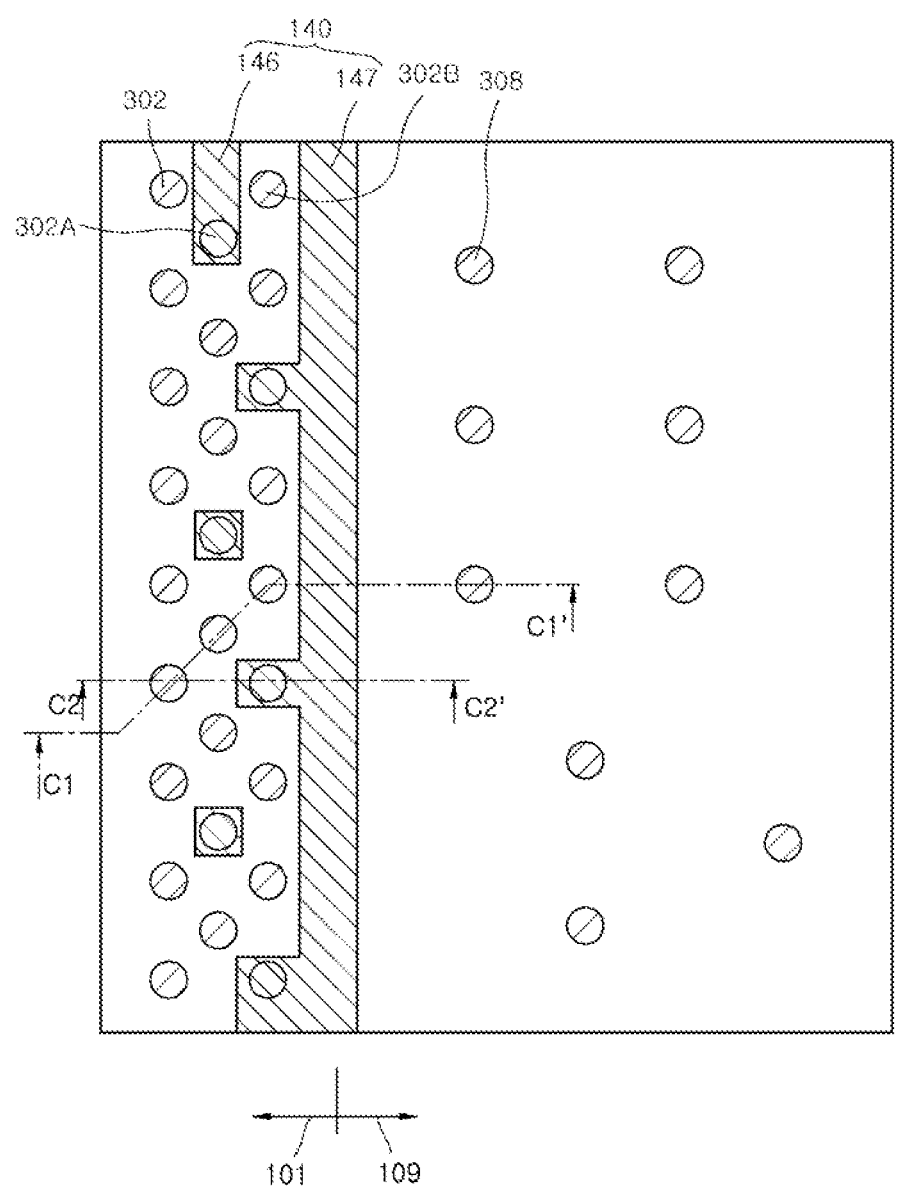
Figure 36:
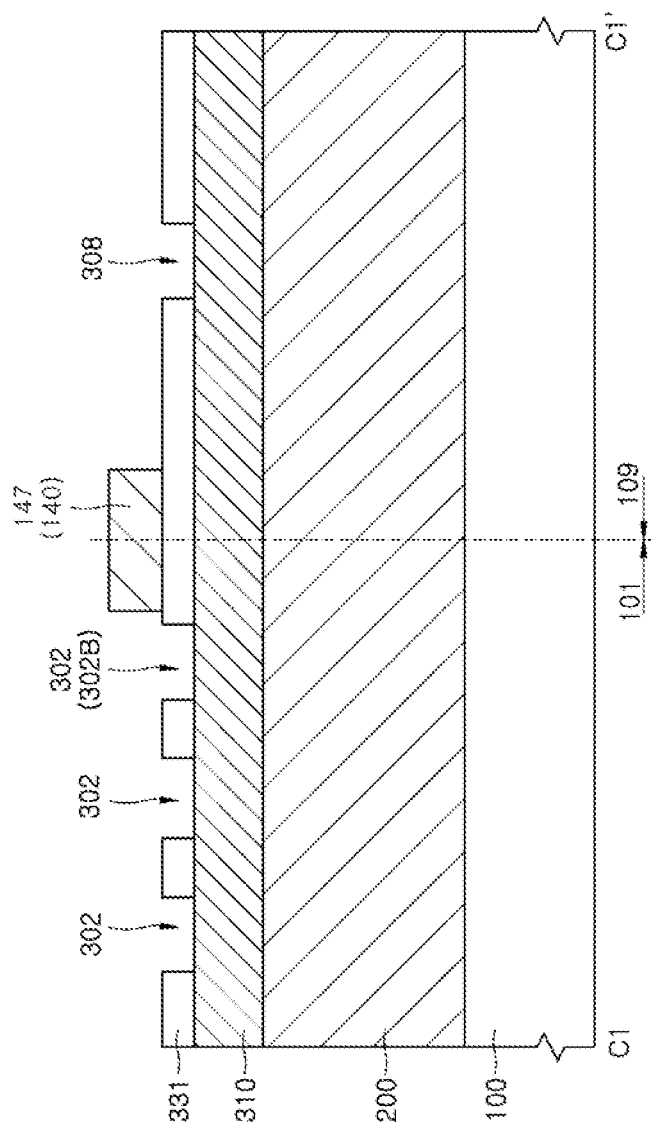
Figure 37:
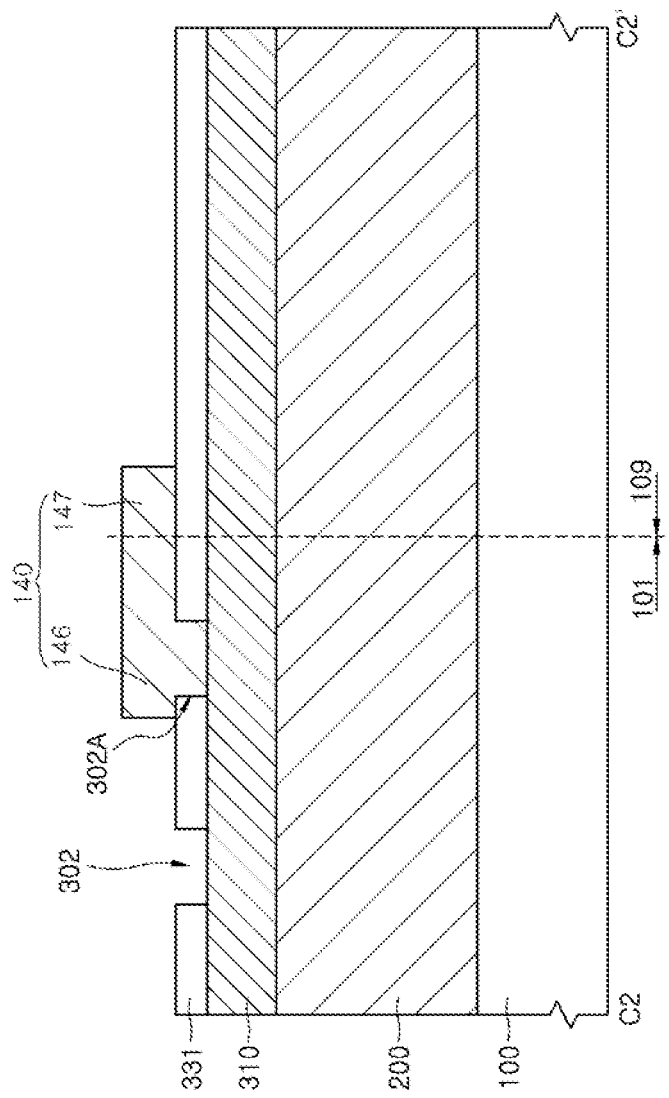

FIG. 35 is a plan view illustrating a step of forming a sealing pattern 140 FIG. 36 is a cross-sectional view taken along a line C1-C1' of FIG. 35, and FIG. 37 is a cross-sectional view taken along a line C2-C2' of FIG. 35.

Referring to FIGS. 35, 36 and 37, the sealing pattern 140 may be formed to cover some dummy openings 30A among the fifth openings 302. The sealing pattern 140 may be formed by transferring the sealing pattern 45 of FIG. 4 onto the substrate 100. The sealing pattern 140 may be formed to include a silicon oxynitride (SiON) layer or a silicon nitride (SiN) layer. The sealing pattern 140 may be formed to cover the dummy openings 302A corresponding to the dummy patterns (43 of FIG. 4) so that the dummy openings 302A are not transferred onto the substrate 100. The sealing pattern 140 may be formed to include first portions 146 covering the dummy openings 302A and a second portion 147 covering a boundary region between the first region 101 that is, the fifth openings 302 and the second region 109 that is, the template part 450. The second portion 147 of the sealing pattern 140 may fill undesired parasitic holes located in the boundary region to prevent the undesired parasitic holes from being transferred to the substrate in a subsequent etch process.

When the BCP layer 600 is phase-separated to form the first to fourth domains 610, 651, 615 and 655 (see FIGS. 17, 18 and 19), undesired phase separation of the BCP layer 600 may occur in the boundary region between the template part 450 and the pillars 410 adjacent to the template part 450 to generate parasitic holes. The second portion 147 of the sealing pattern 140 may prevent the parasitic holes in the boundary region from being transferred onto the substrate 100.

Figure 38:
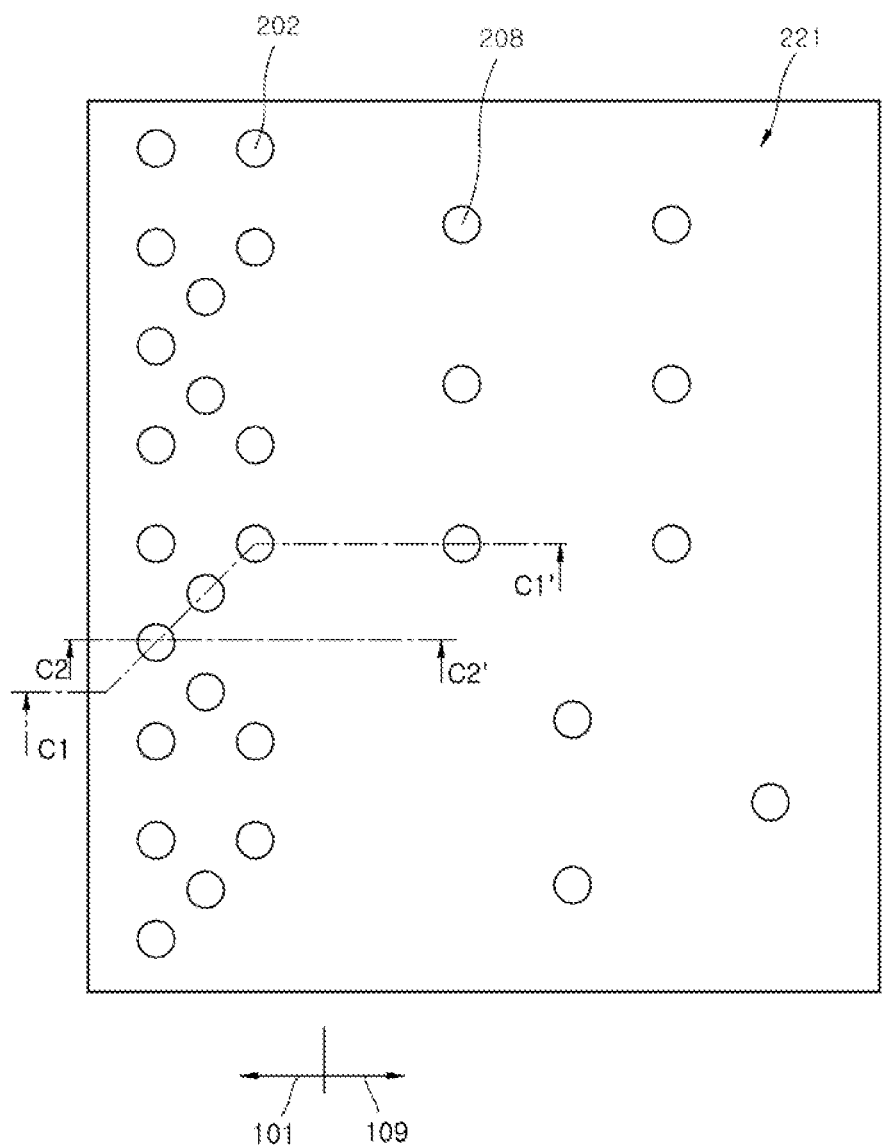
Figure 39:
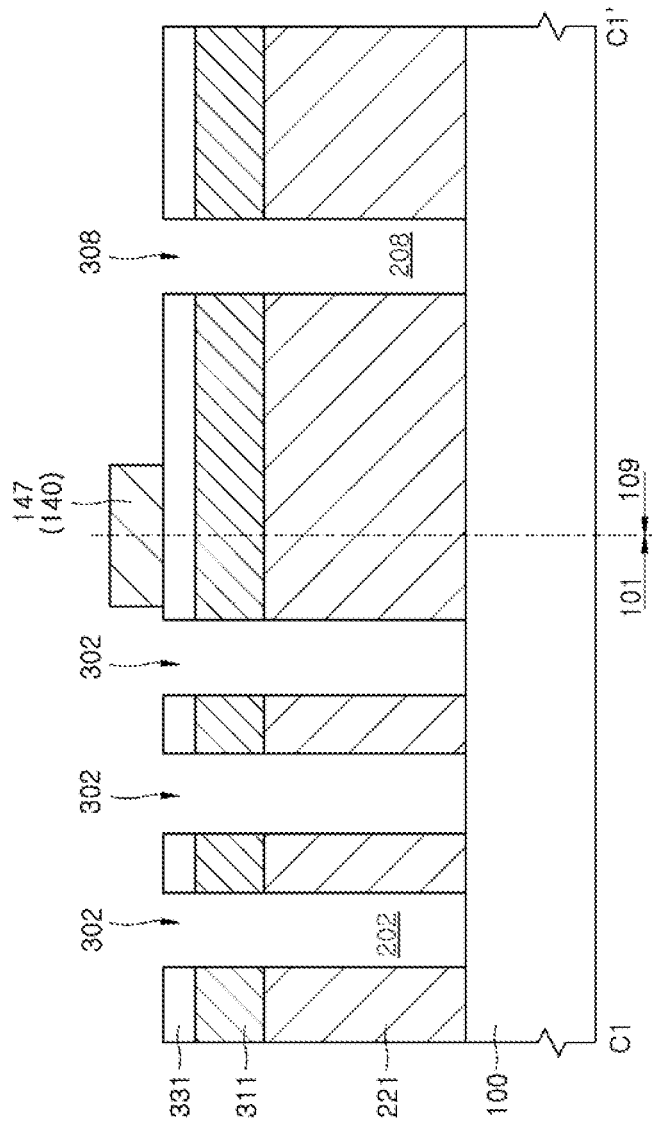

FIG. 38 is a plan view illustrating a step of forming seventh openings 202 and eighth openings 208. FIG. 39 is a cross-sectional view taken along a line C1-C1' of FIG. 38, and FIG. 40 is a cross-sectional view taken along a line C2-C2' of FIG. 38.

Figure 40:
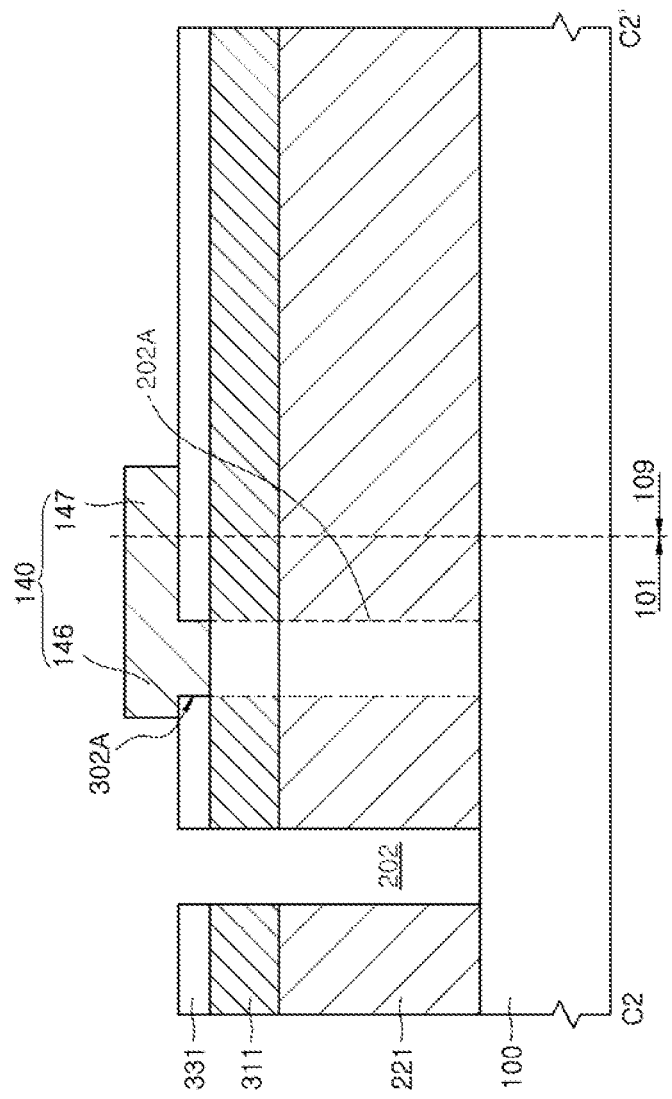

Referring to FIGS. 38, 39 and 40, the second etch target layer 310 may be etched using the sealing pattern 140 and the underlying pattern 331 as etch masks to form a second etch target pattern 311 through which the fifth openings 302 and the sixth openings 308 extend. Subsequently, portions of the first etch target layer 200 exposed by the second etch target pattern 311 may be etched to form a first etch target pattern 221 that provides the seventh openings 202 extending from the fifth openings 302 and the eighth openings 208 extending from the sixth openings 308. The seventh openings 202 and the eighth openings 208 substantially penetrating the first etch target pattern 221 may serve, for example, as contact holes that electrically connect lower conductive lines (not shown) to upper conductive lines (not shown). While the seventh openings 202 and the eighth openings 208 are formed, the dummy openings 302A are not transferred onto the substrate 100 because of the presence of the sealing pattern 140. Thus, seventh dummy openings 202A corresponding to the dummy openings 302A are not formed in the first etch target pattern 221.

Figure 44:
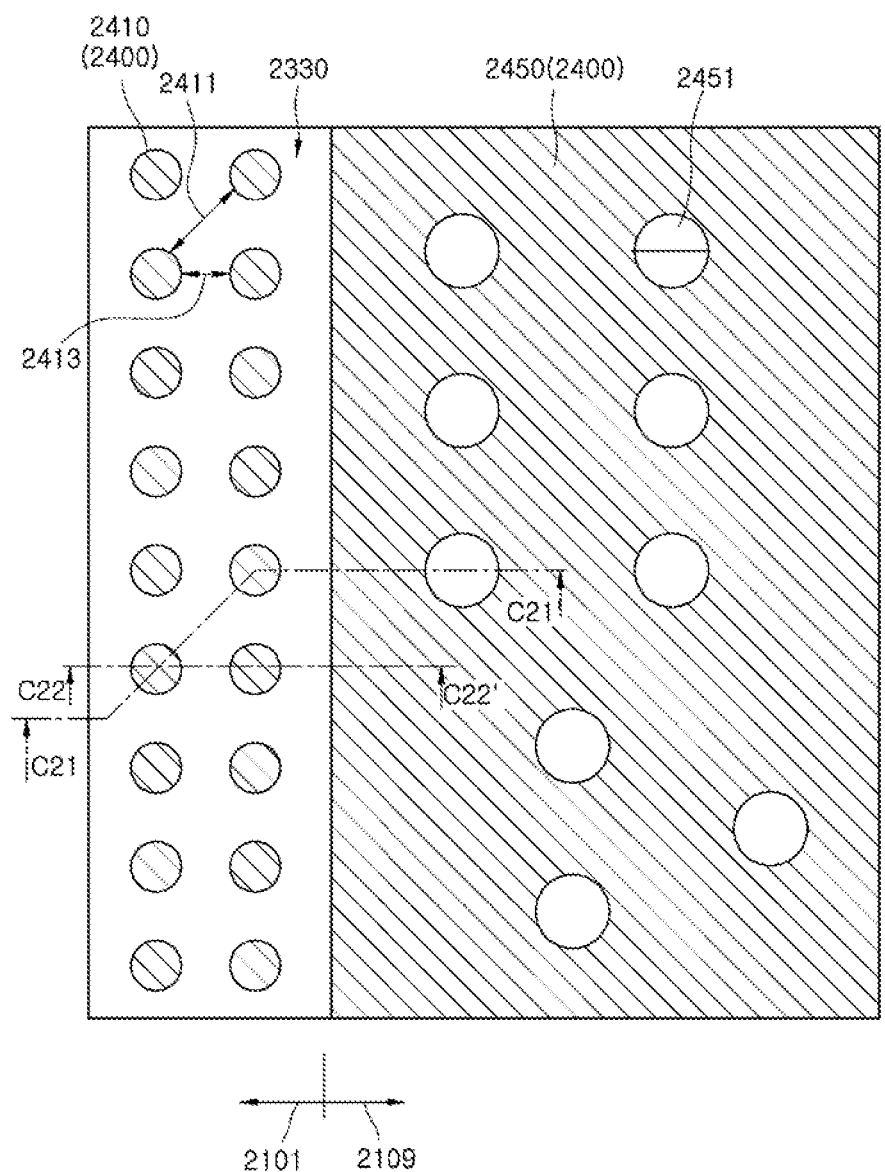
FIGS. 44 to 76 are plan views and cross-sectional views illustrating a method of forming patterns according to another embodiment.
Figure 45:
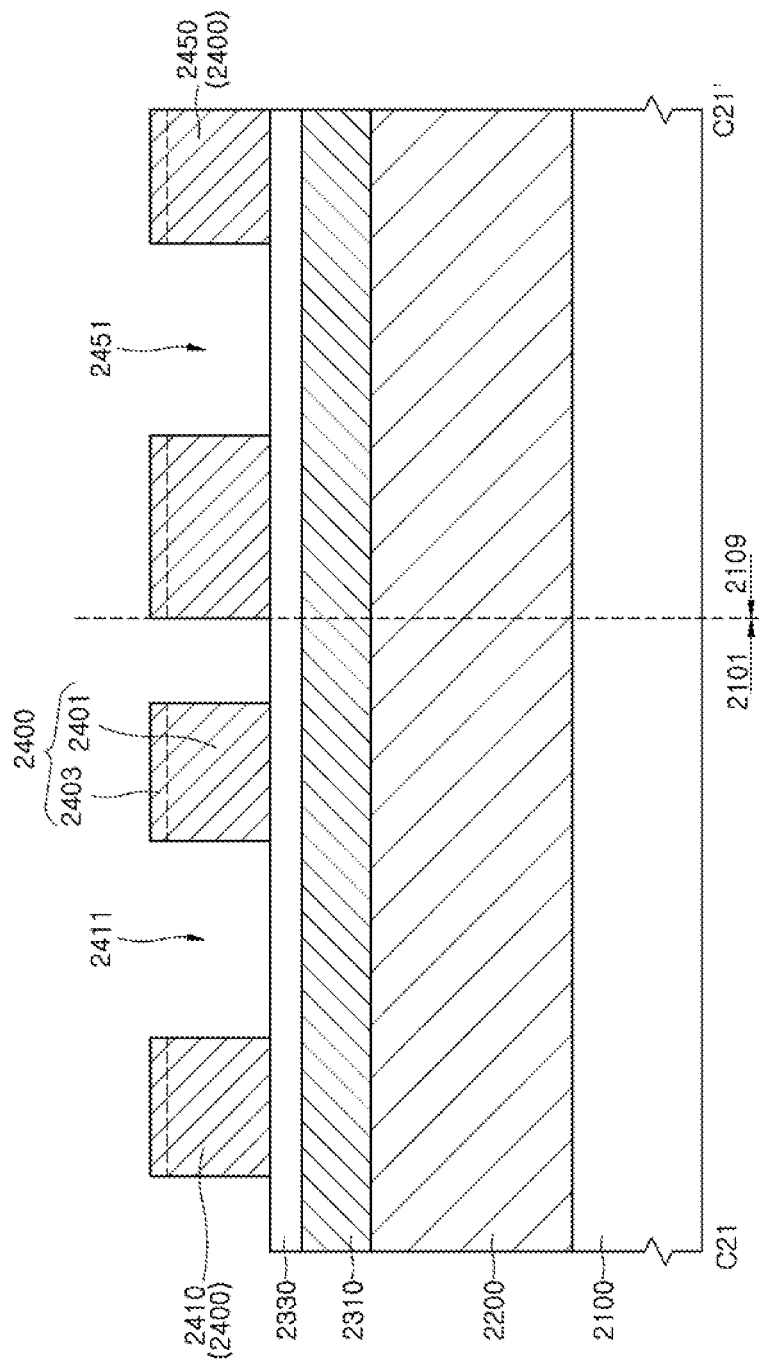

FIG. 44 is a plan view illustrating a step of forming an array of pillars 2410 and a template part 2450. FIG. 45 is a cross-sectional view taken along a line C21-C21' of FIG. 44, and FIG. 46 is a cross-sectional view taken along a line C22-C22' of FIG. 44.

Figure 46:
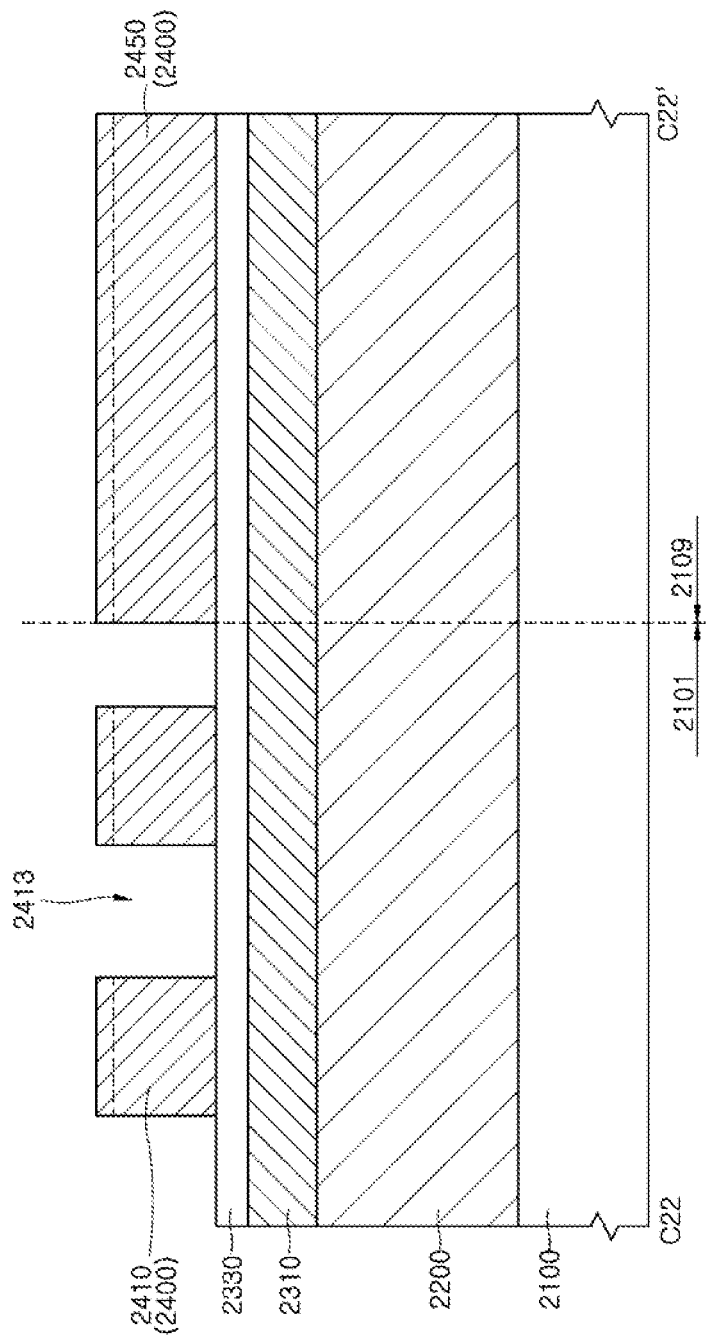

Referring to FIGS. 44, 45 and 46, the pillars 2410 may be arrayed so that four adjacent pillars 2410 are respectively located at four vertices of a rectangle. The pillars 2410 may be arrayed to have a first gap 2413 between two adjacent pillars 2410 which are disposed to be closest to each other. For example, the pillars 2410 may be arrayed to have the first gap 2413 between two adjacent pillars 2410 arrayed in a horizontal line, when viewed from a plan view of FIG. 44. In addition, the pillars 2410 may be arrayed to have a second gap 2411 between two adjacent pillars 2410 arrayed in a diagonal line, when viewed from a plan view of FIG. 44. That is, the pillars 2410 may be arrayed along the line C22-C22' to be spaced apart from each other by the first gap 2413 and may be arrayed along the line C21-C21' spaced apart from each other by the second gap 2411. In such a case, the second gap 2411 may be set to be wider than the first gap 2413. If the pillars 2410 are formed to be located at vertices of rectangles two-dimensionally arrayed to be adjacent to each other, diagonal lines defining the second gap 2411 may pass central points of the rectangles. In some embodiments, the pillars 2410 may be formed to be located at vertices of triangles two-dimensionally arrayed to be adjacent to each other.

The pillars 2410 may be formed on an underlying layer 2330 disposed on a semiconductor substrate 2100. The pillars 2410 may be formed on a first region 2101 of the semiconductor substrate 2100. The first region 2101 of the semiconductor substrate 2100 may correspond to a region in which pattern density is relatively high. A template part 2450 providing first openings 2451 may also be formed on the underlying layer 2330 disposed in a second region 2109 of the semiconductor substrate 2100. The second region 2109 may be set to be distinct from and adjacent to the first region 2101. The pillars 2410 and the template part 2450 may serve as guide patterns 2400 that induce a self-assembly of a BCP layer which is formed in a subsequent process.

The underlying layer 2330 may be patterned to form a hard mask in a subsequent patterning process. A second etch target layer 2310 may be formed between the underlying layer 2330 and the semiconductor substrate 2100. In addition, a first etch target layer 2200 may be formed between the second etch target layer 2310 and the semiconductor substrate 2100. The pillars 2410 and the template part 2450 may be formed after the first etch target layer 2200, the second etch target layer 2310 and the underlying layer 2330 are sequentially stacked on the semiconductor substrate 2100. A material layer that is, a guide layer, including an SOC layer 2401 having a thickness of about 700 angstroms to about 800 angstroms may be formed on the underlying layer 2330, and the material layer may be patterned to form the pillars 2410 and the template part 2450. In some embodiments, a capping layer 2403 may be additionally formed on the SOC layer 2401 before the guide layer is patterned. The capping layer 2403 may be formed of a silicon oxynitride (SiON) layer having a thickness of about 300 angstroms.

Figure 47:
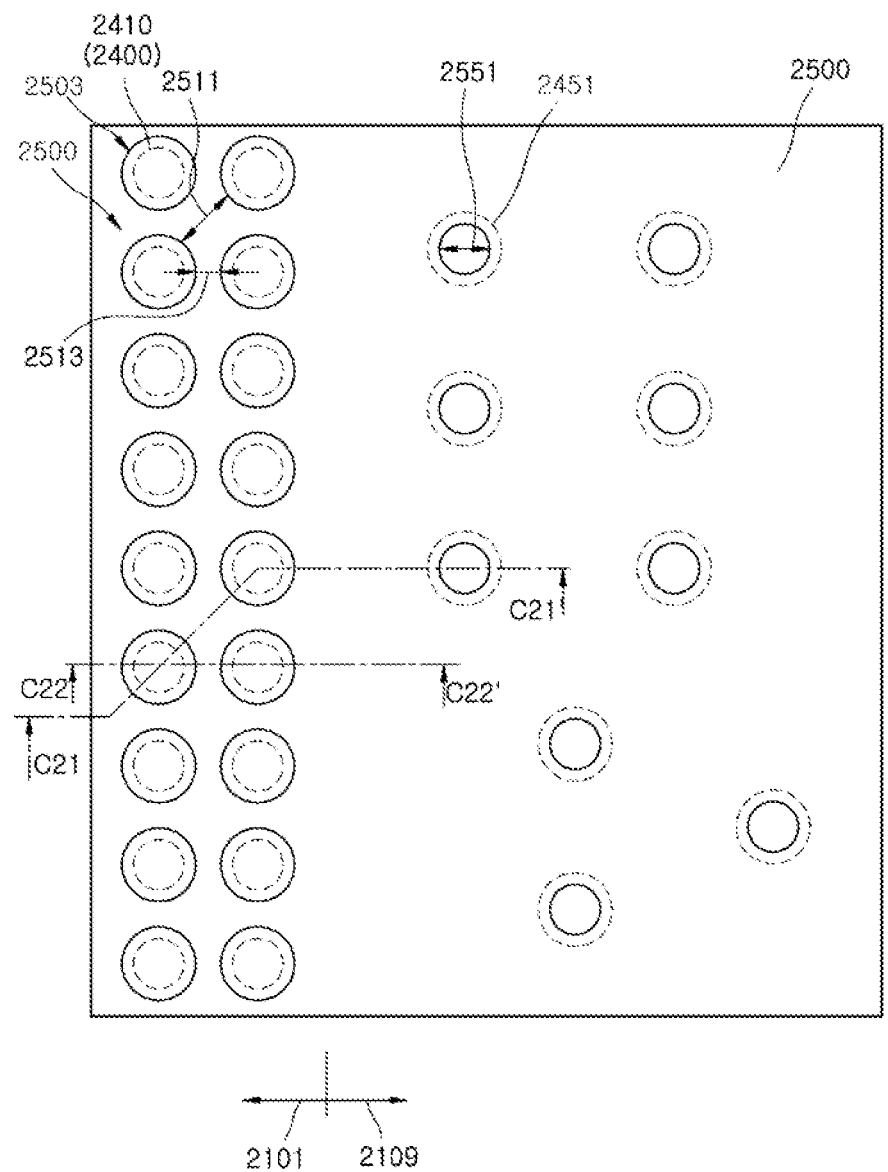
Figure 48:
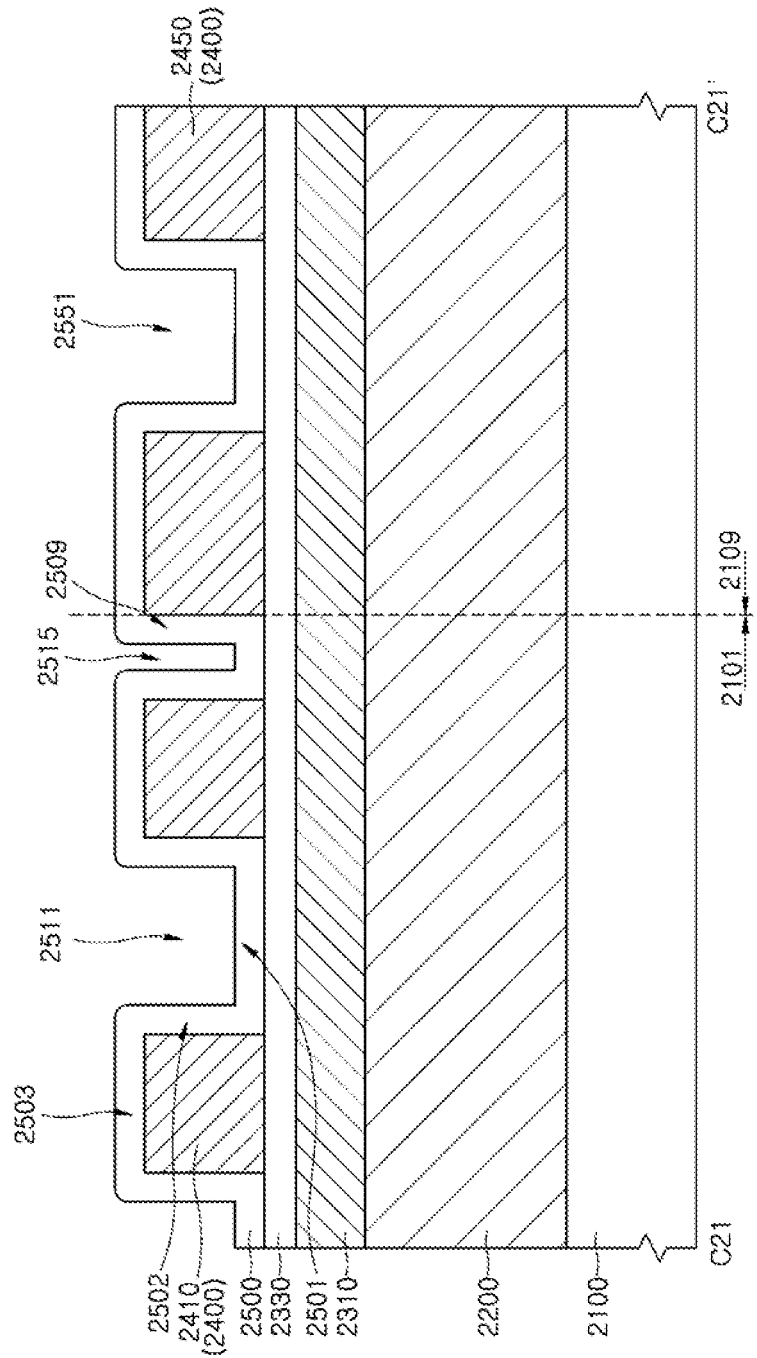

FIG. 47 is a plan view illustrating a step of forming a separation wall layer 2500. FIG. 48 is a cross-sectional view taken along a line C21-C21' of FIG. 47, and FIG. 49 is a cross-sectional view taken along a line C22-C22' of FIG. 47.

Figure 49:
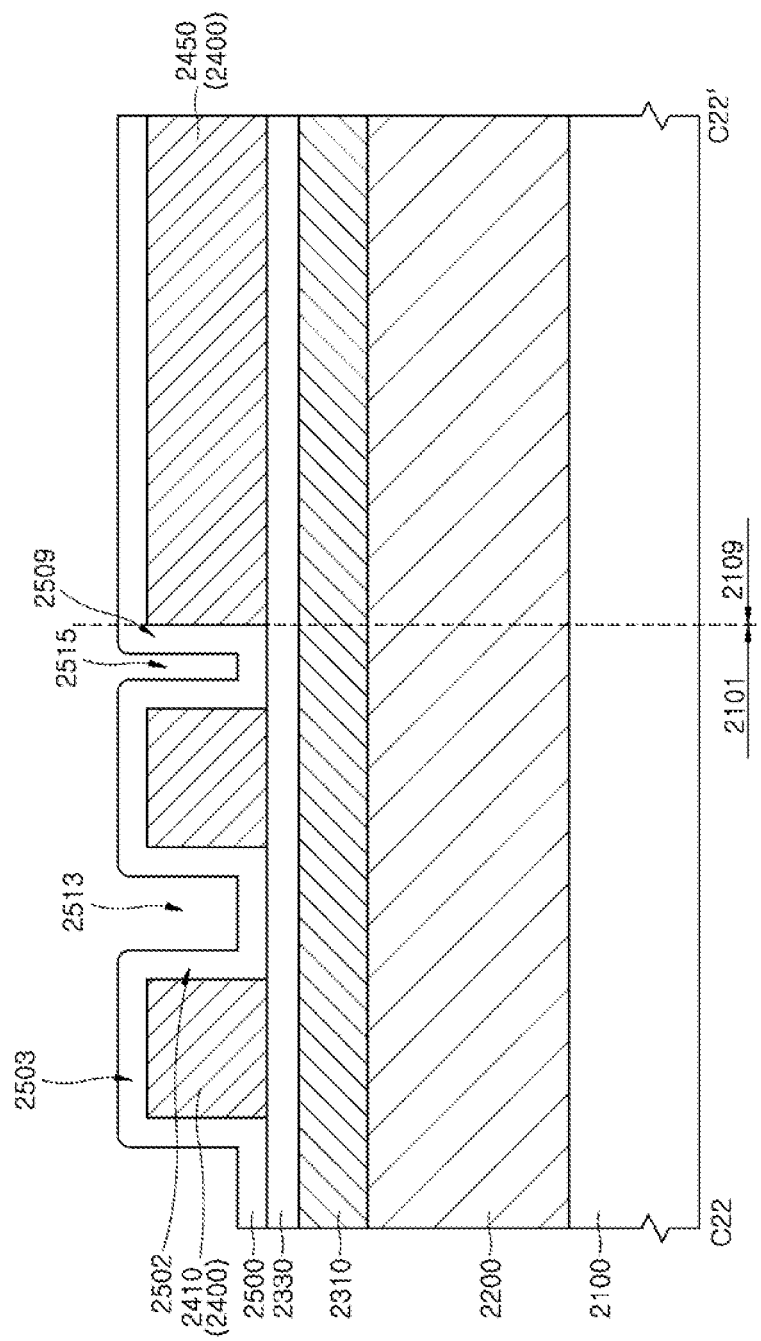

Referring to FIGS. 47, 48 and 49, the separation wall layer 2500 may be formed on surfaces of the pillars 2410 and the template part 2450 to provide separation walls 2502 covering sidewalls of the pillars 2410 and sidewalls of the first openings 2451. The separation wall layer 2500 may be formed to include first extensions 2501 covering portions of the underlying layer 2330 exposed by the first and second gaps (2413 and 2411 of FIGS. 44, 45 and 46) and the first openings (2451 of FIGS. 44 and 45), second extensions 2503 covering top surfaces of the pillars 2410, and a boundary wall 2509 covering an outer sidewall of the template part 2450 facing the pillars 2410. The separation wall layer 2500 may be formed to provide recessed regions defined by a third gap 2513 between the pillars 2410 arrayed in the horizontal line C22-C22', a fourth gap 2511 between the pillars 2410 arrayed in the diagonal line C21-C21', a fifth gap 2515 between the template part 2450 and the pillar 2410 adjacent to the template part 2450, and a sixth gap 2551 in the first opening 2451.

Figure 50:
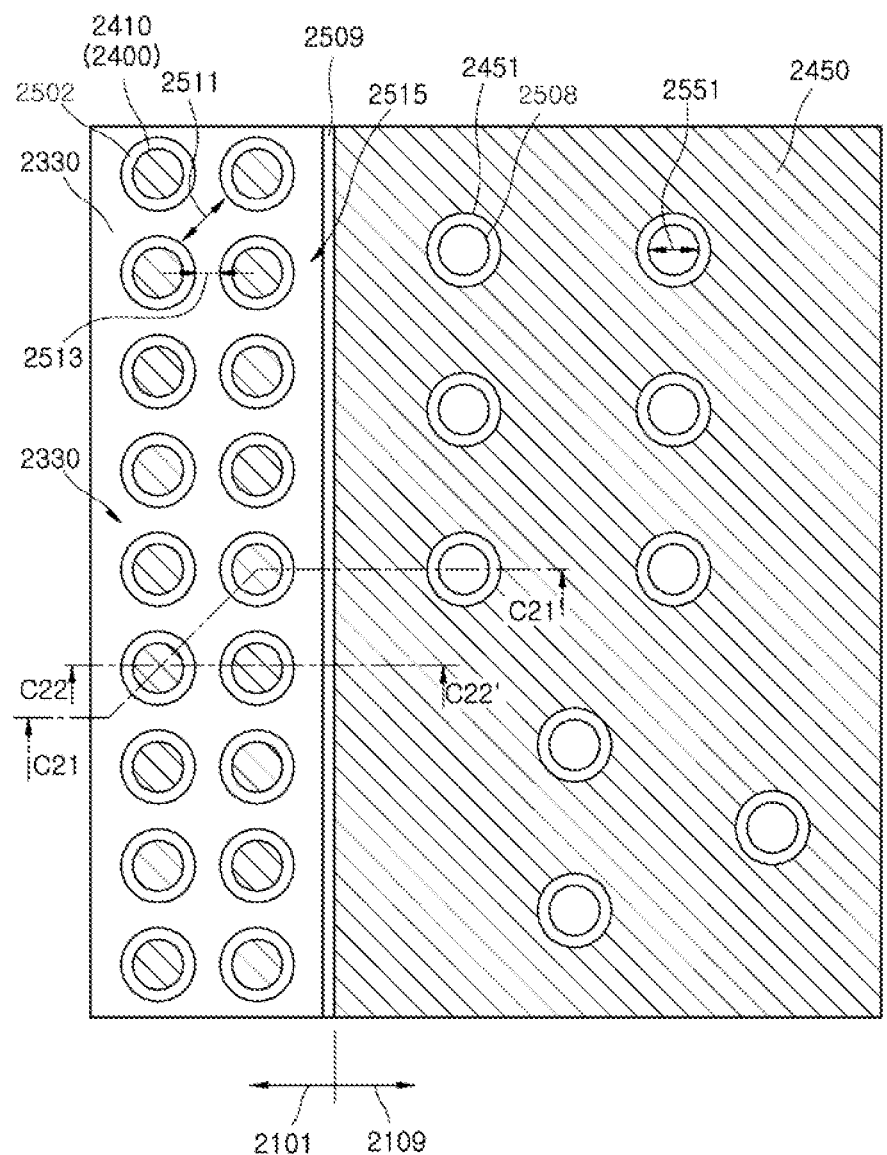
Figure 51:
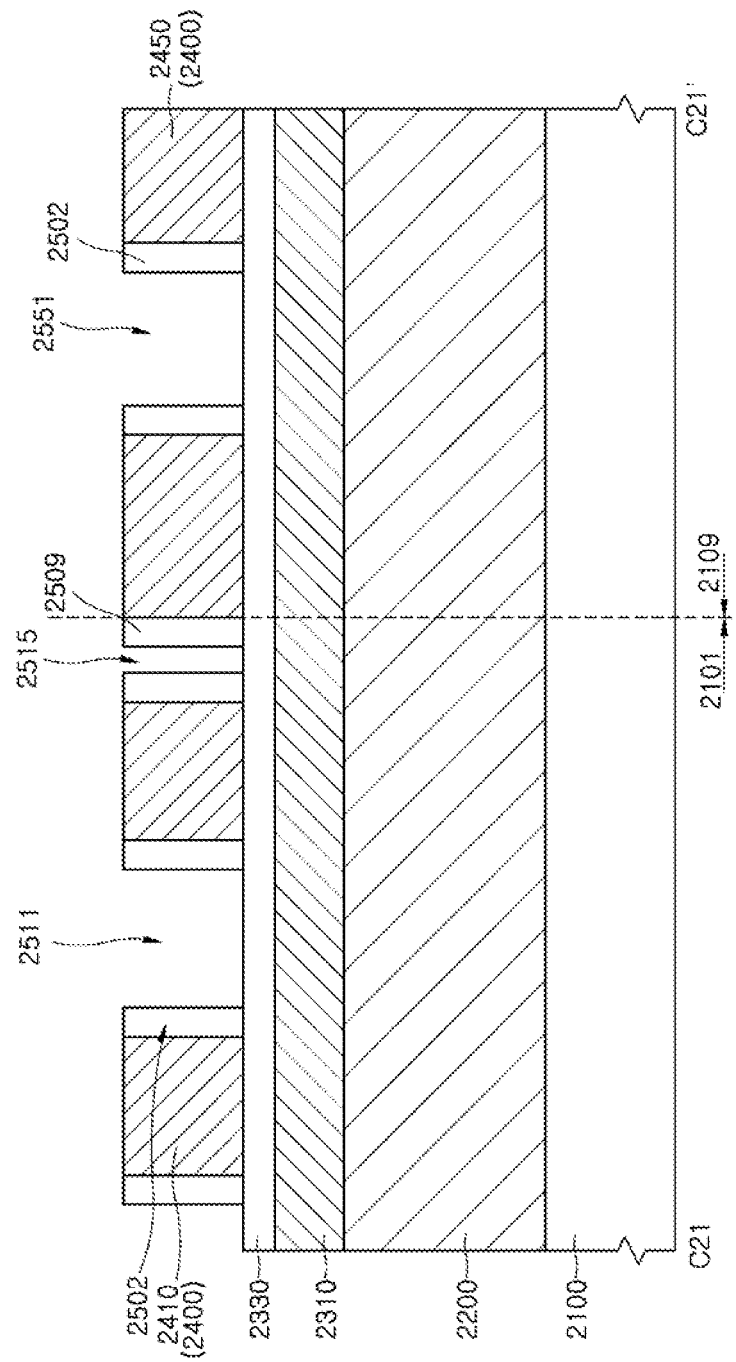

FIG. 50 is a plan view illustrating a step of patterning the separation wall layer 2500. FIG. 51 is a cross-sectional view taken along a line C21-C21' of FIG. 50, and FIG. 52 is a cross-sectional view taken along a line C22-C22' of FIG. 50.

Figure 52:
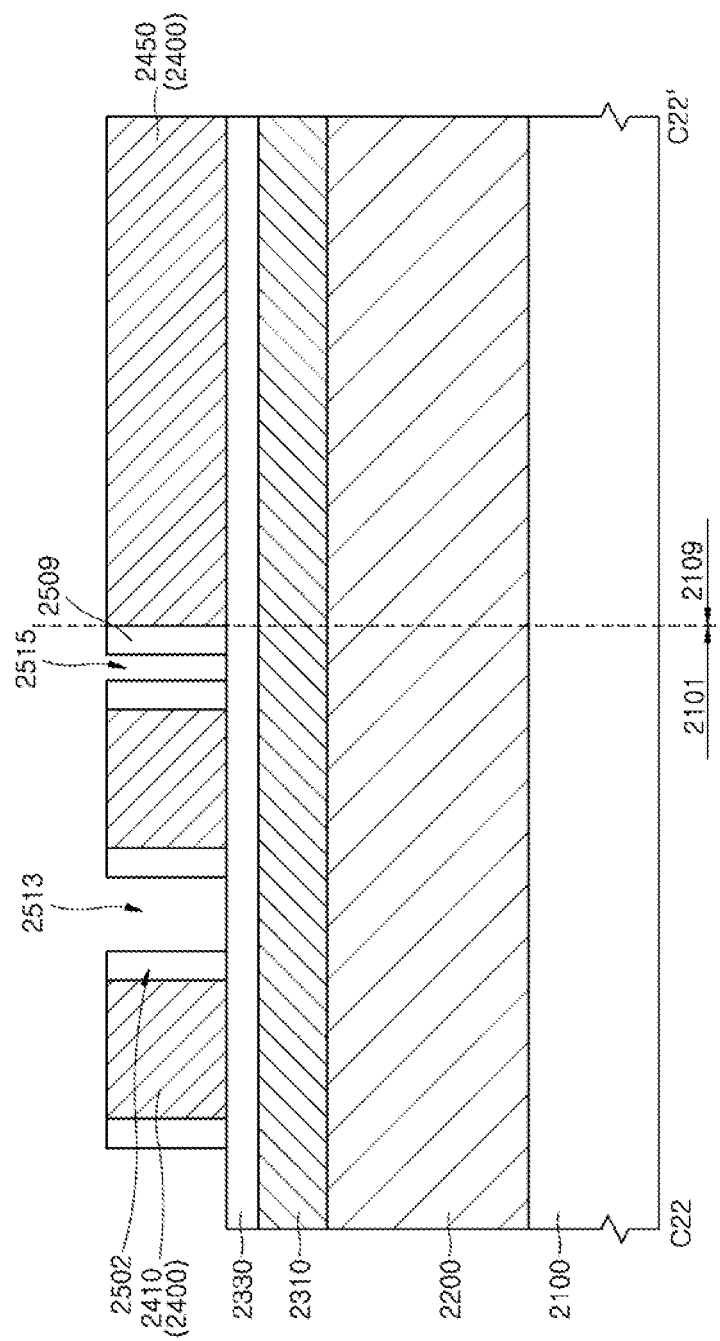

Referring to FIGS. 50, 51 and 52, the separation wall layer 2500 may be anisotropically etched to form the separation walls 2502, in a spacer shape, on the sidewalls of the pillars 2410 and the first opening 2451. As a result of the anisotropic etch process for forming the separation walls 2502, portions of the underlying layer 2330 may be exposed.

Figure 53:
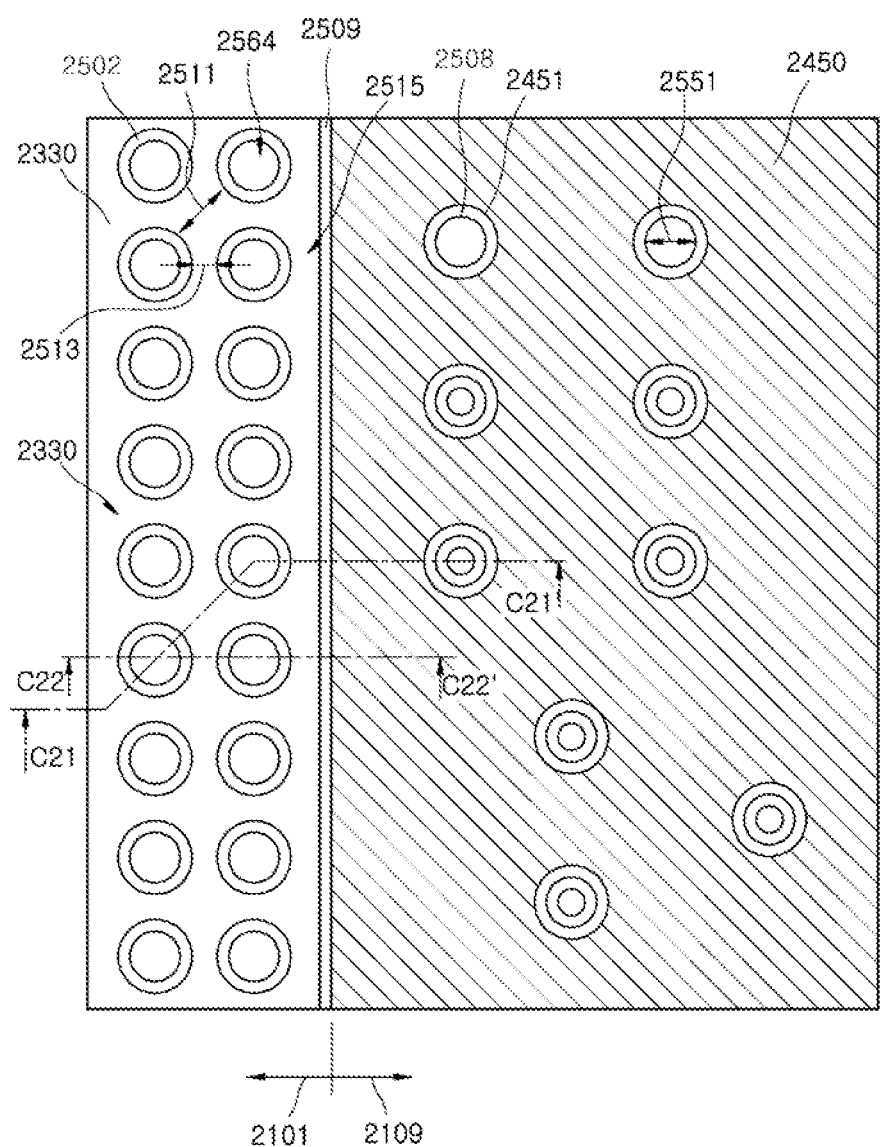
Figure 54:
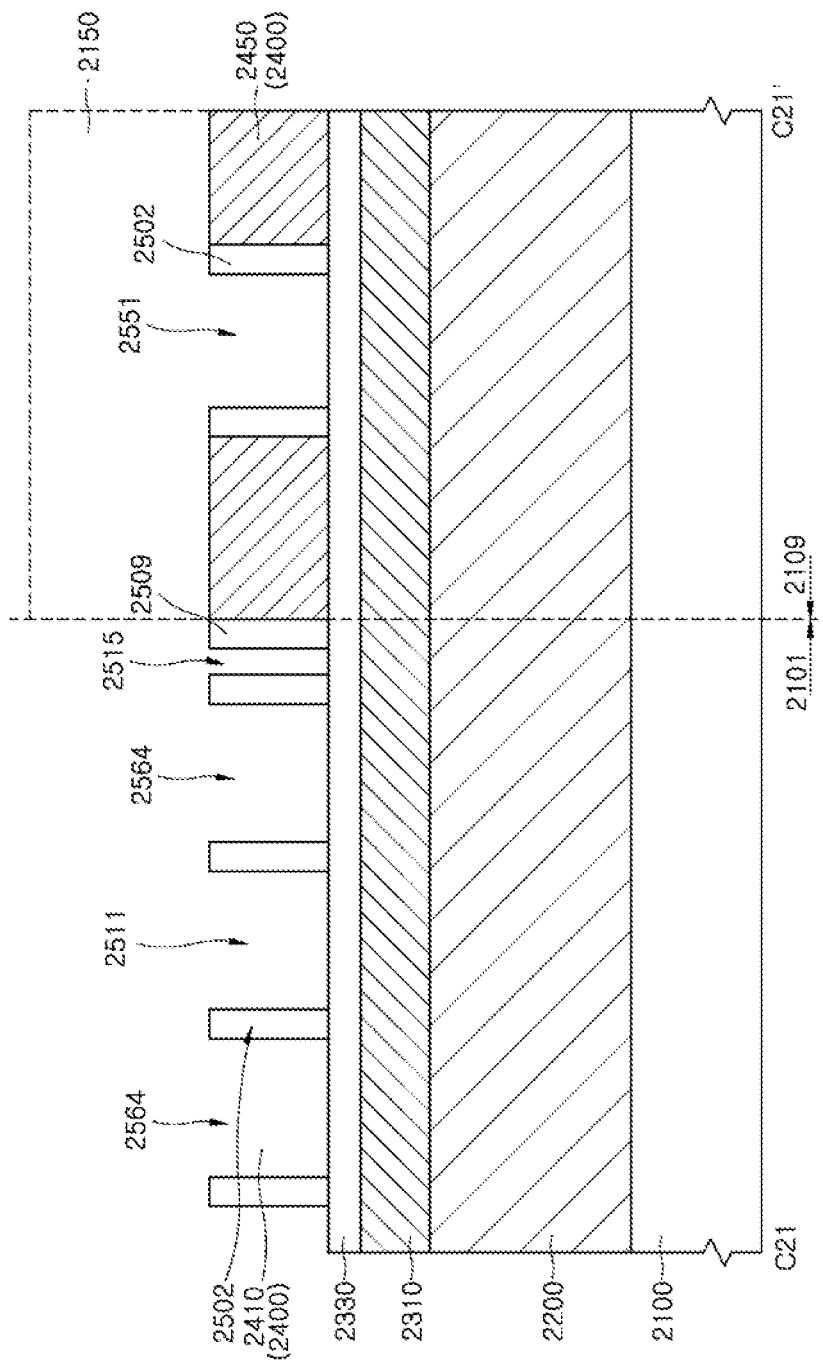

FIG. 53 is a plan view illustrating a step of forming fourth openings 2564. FIG. 54 is a cross-sectional view taken along a line C21-C21' of FIG. 53, and FIG. 55 is a cross-sectional view taken along a line C22-C22' of FIG. 53.

Figure 55:
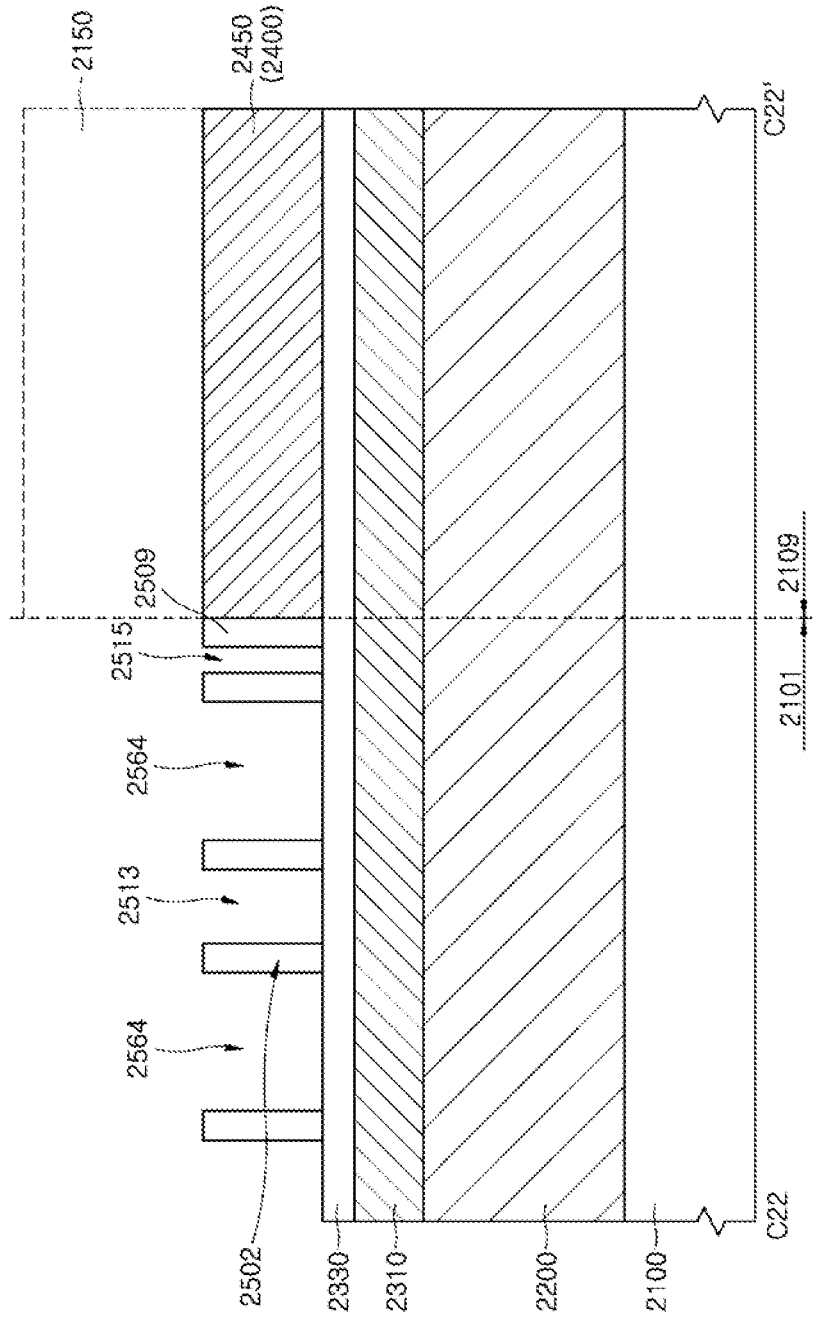

Referring to FIGS. 53, 54 and 55, the pillars 2410 may be selectively removed to form the fourth openings 2564. A mask 2150 covering the template part 2450 may be formed prior to removal of the pillars 2410 to prevent the template part 2450 from being removed while the pillars 2410 are removed. The mask 2150 may be formed to include a photoresist layer. The mask 2150 may be removed after the fourth openings 2564 are formed.

Figure 56:
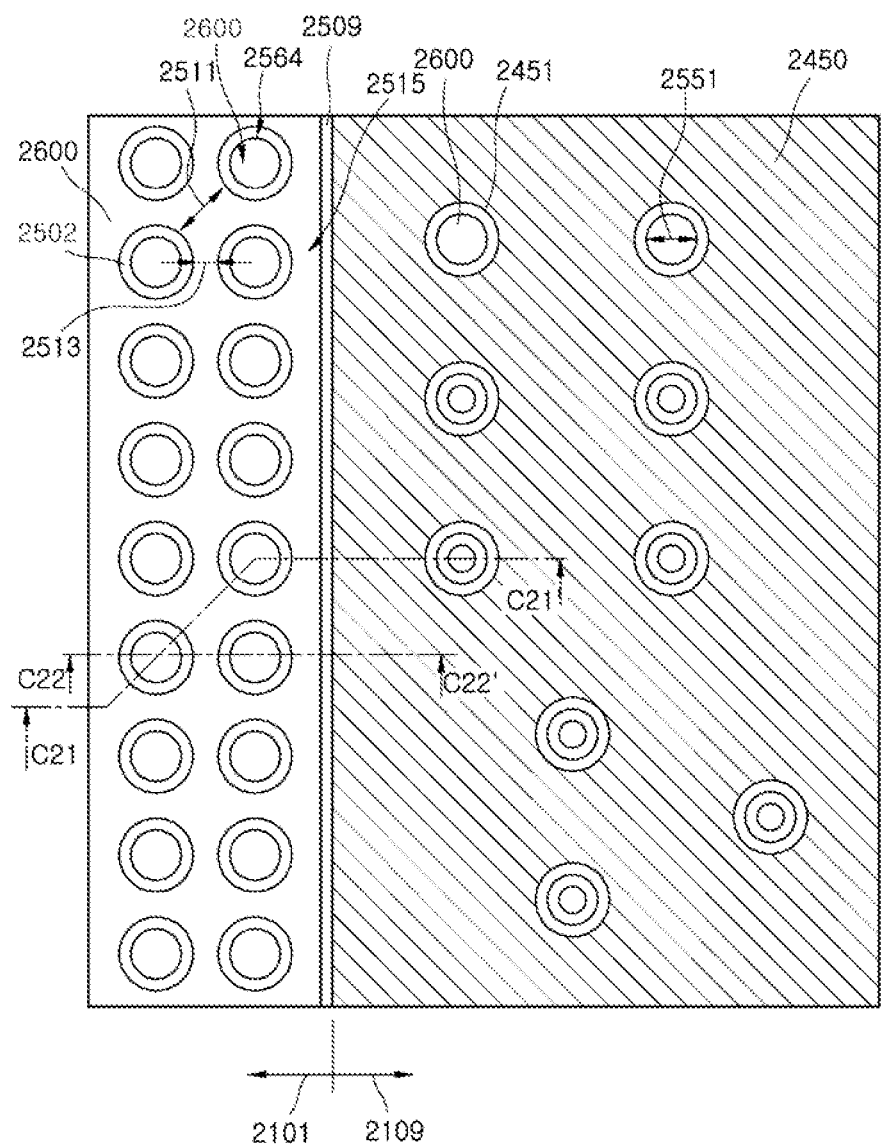
Figure 57:
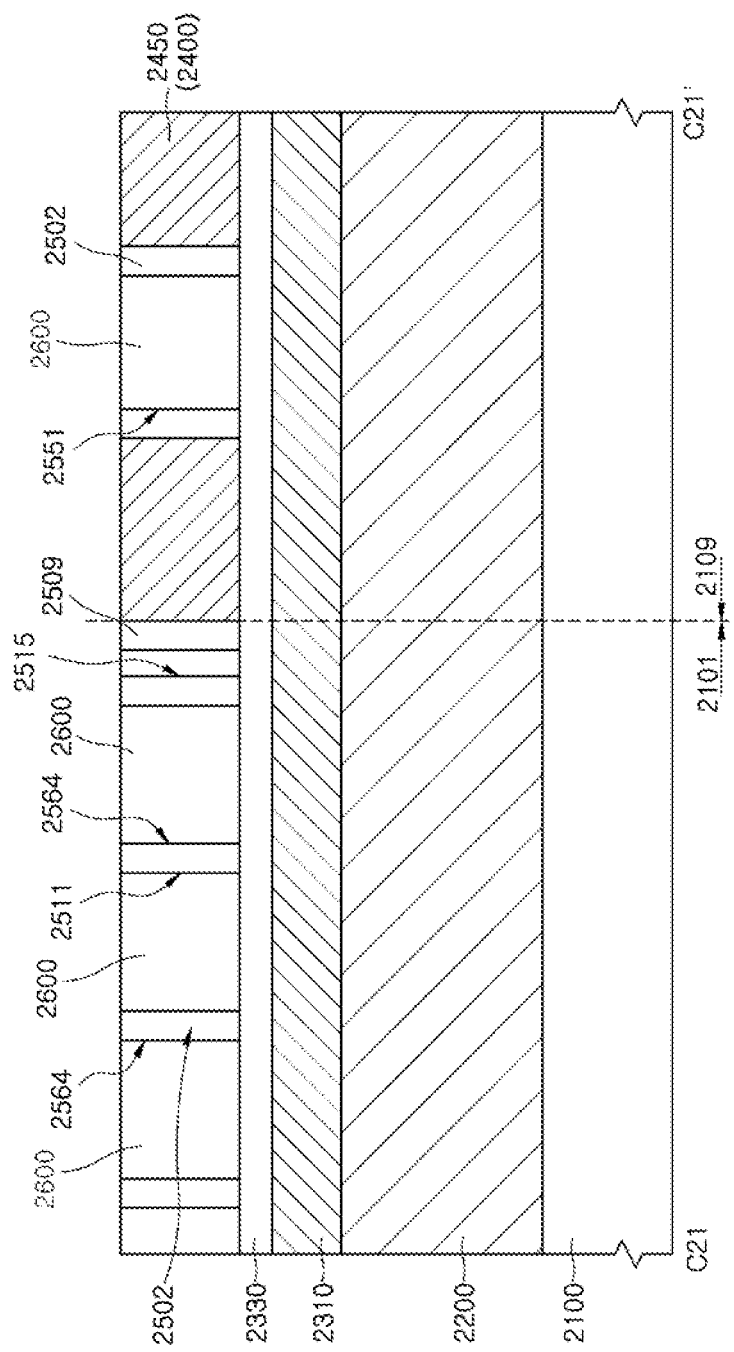

FIG. 56 is a plan view illustrating a step of forming a BCP layer 2600. FIG. 57 is a cross-sectional view taken along a line C21-C21' of FIG. 56, and FIG. 58 is a cross-sectional view taken along a line C22-C22' of FIG. 56.

Figure 58:
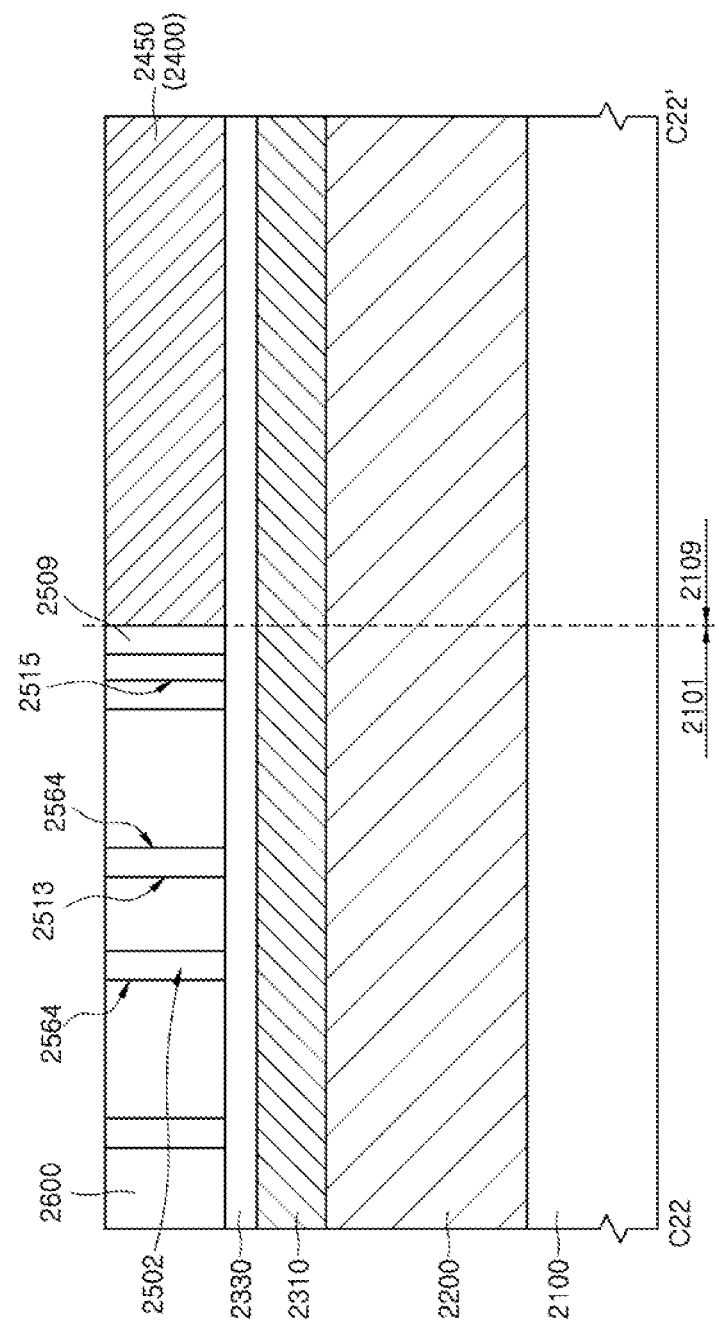

Referring to FIGS. 56, 57 and 58, the BCP layer 2600 may be formed to fill the fourth openings 2564 and the gaps 2511, 2513, 2515 and 2551 which are provided by the separation walls 2502.

Figure 59:
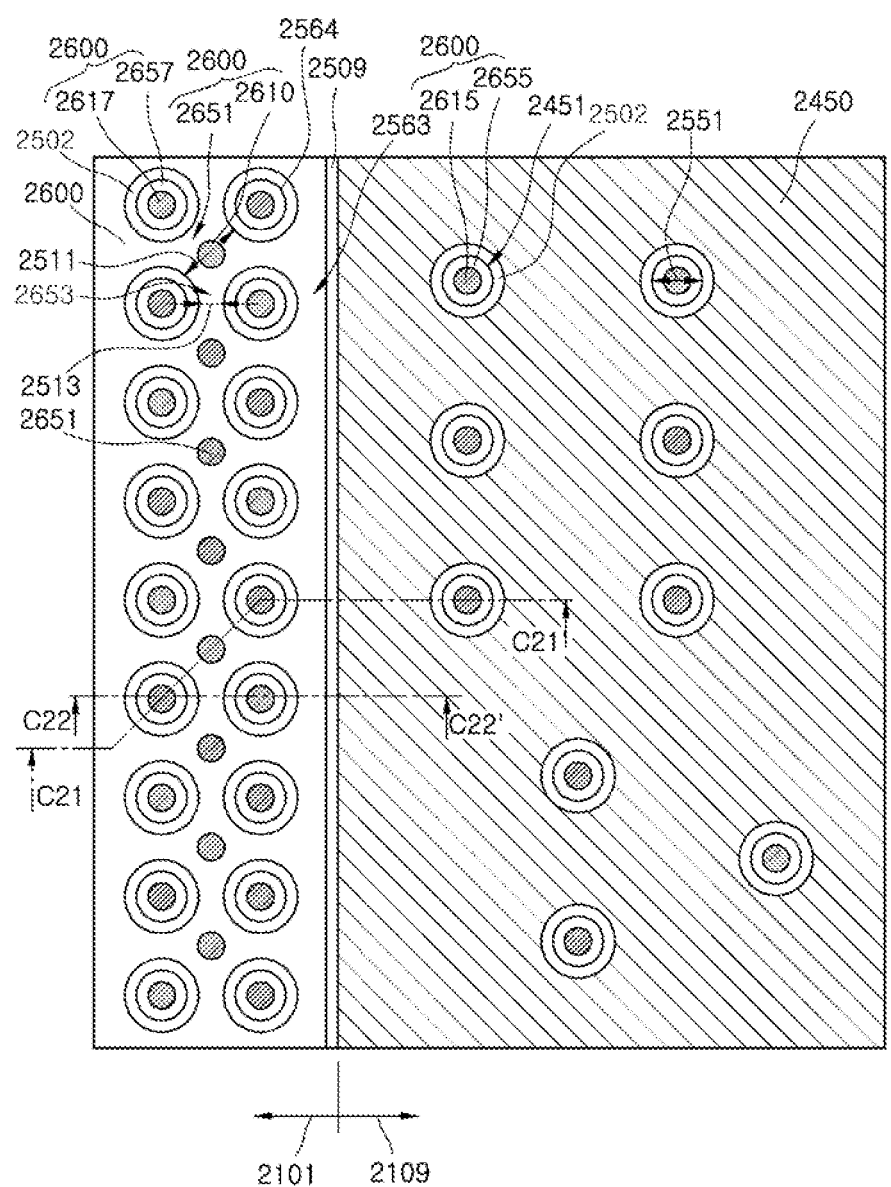
Figure 60:
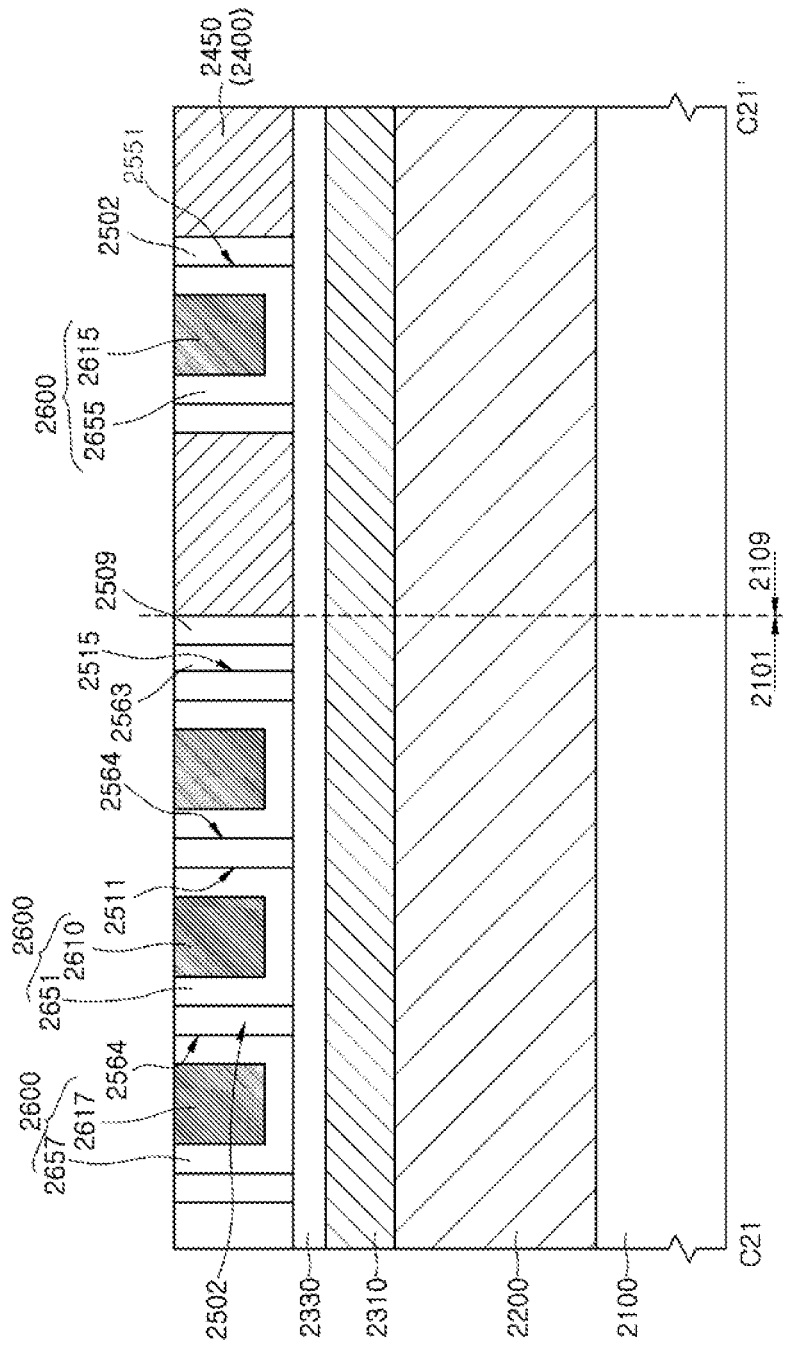

FIG. 59 is a plan view illustrating a step of phase-separating the BCP layer 2600. FIG. 60 is a cross-sectional view taken along a line C21-C21' of FIG. 59, and FIG. 61 is a cross-sectional view taken along a line C22-C22' of FIG. 59.

Figure 61:
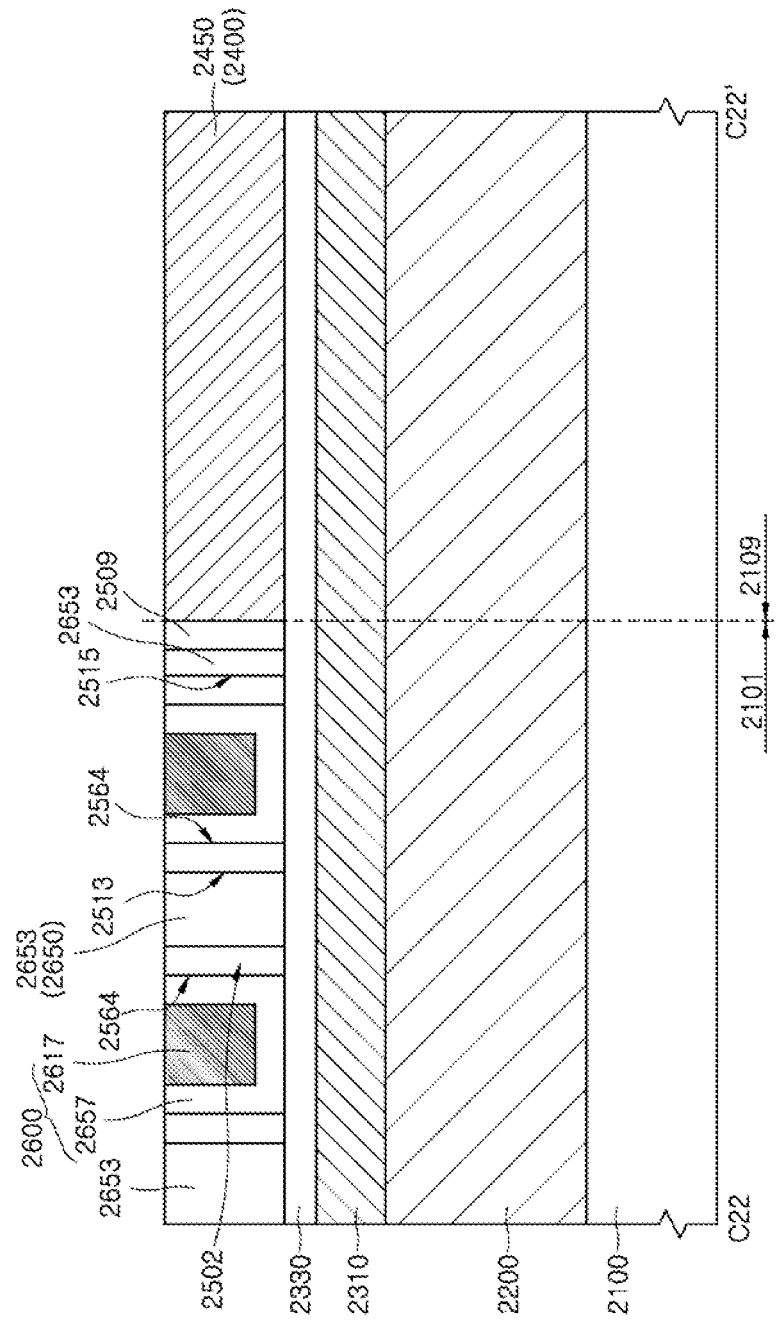

Referring to FIGS. 59, 60 and 61, the BCP layer 2600 may be phase-separated using an annealing process to form a fifth domain 2617 located at a central portion of each of the fourth openings 2564, a sixth domain 2657 surrounding the fifth domain 2617, a first domain 2610 located at a central portion of each of the fourth gaps 2511, and a second domain 2651 surrounding the first domain 2610. During the annealing process, portions 2653 of the BCP layer 2600 filling the third gaps 2513 and the fifth gaps 2515 provided by the separation walls 2502 may be phase-separated to form only the second domains or may not be phase-separated to maintain the original homogeneous phase thereof. This is due to each of the third gaps 2513 and the fifth gaps 2515 being designed to have an insufficient space for full phase separation of the BCP layer 2600. During the annealing process, the BCP layer 2600 filling each of the sixth gaps 2551 in the first openings (2451 of FIG. 45) may also be phase separated to form a third domain 2615 located at a central portion of each of the sixth gaps 2551 and a fourth domain 2655 disposed in each of the sixth gaps 2551 and surrounding the third domain 2615. The first, third and fifth domains 2610, 2615 and 2617 may be formed to have substantially the same polymer component. Each of the second, fourth and sixth domains 2651, 2655 and 2657 may be formed to cover a portion of the underlying layer 2330 and the separation walls 2502 to have a concave structure for example, a cylinder structure, surrounding a bottom surface and a sidewall of the first, third or fifth domain 2610, 2615 or 2617.

Figure 62:
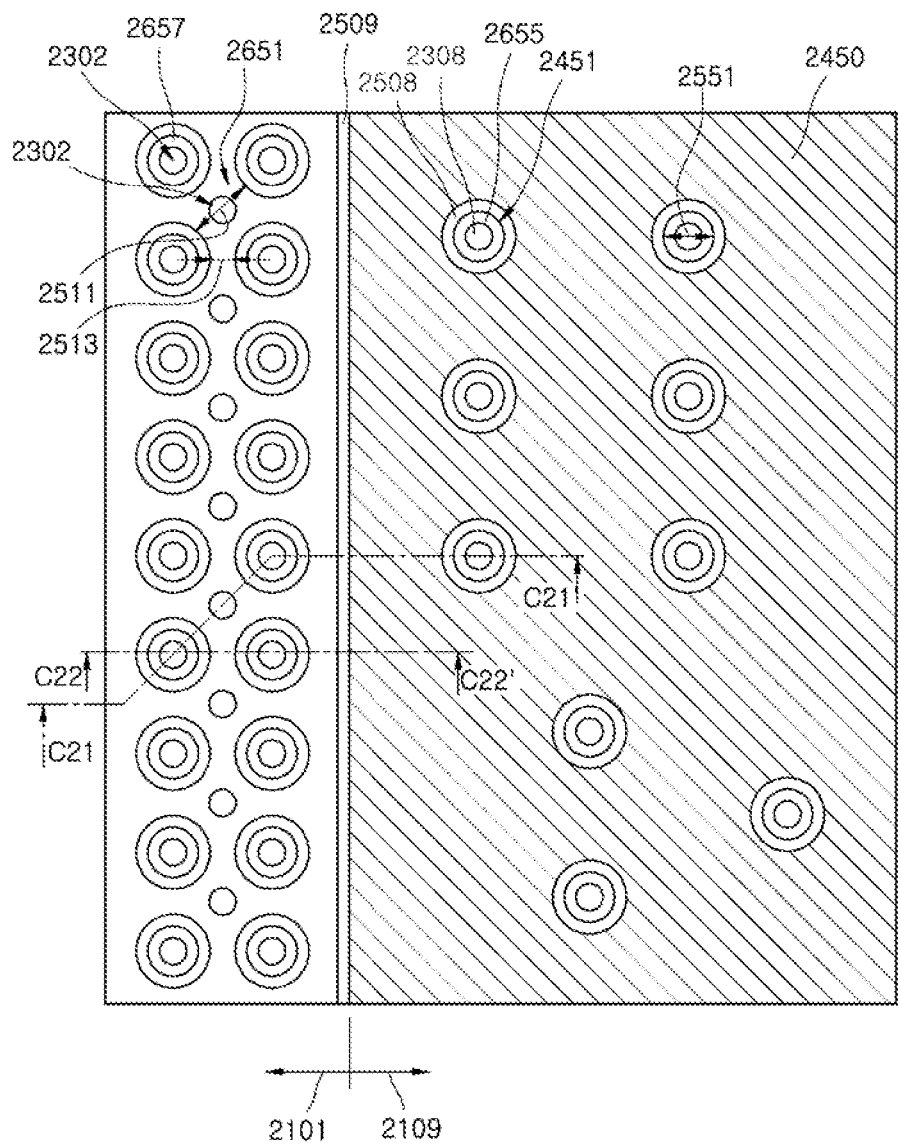
Figure 63:
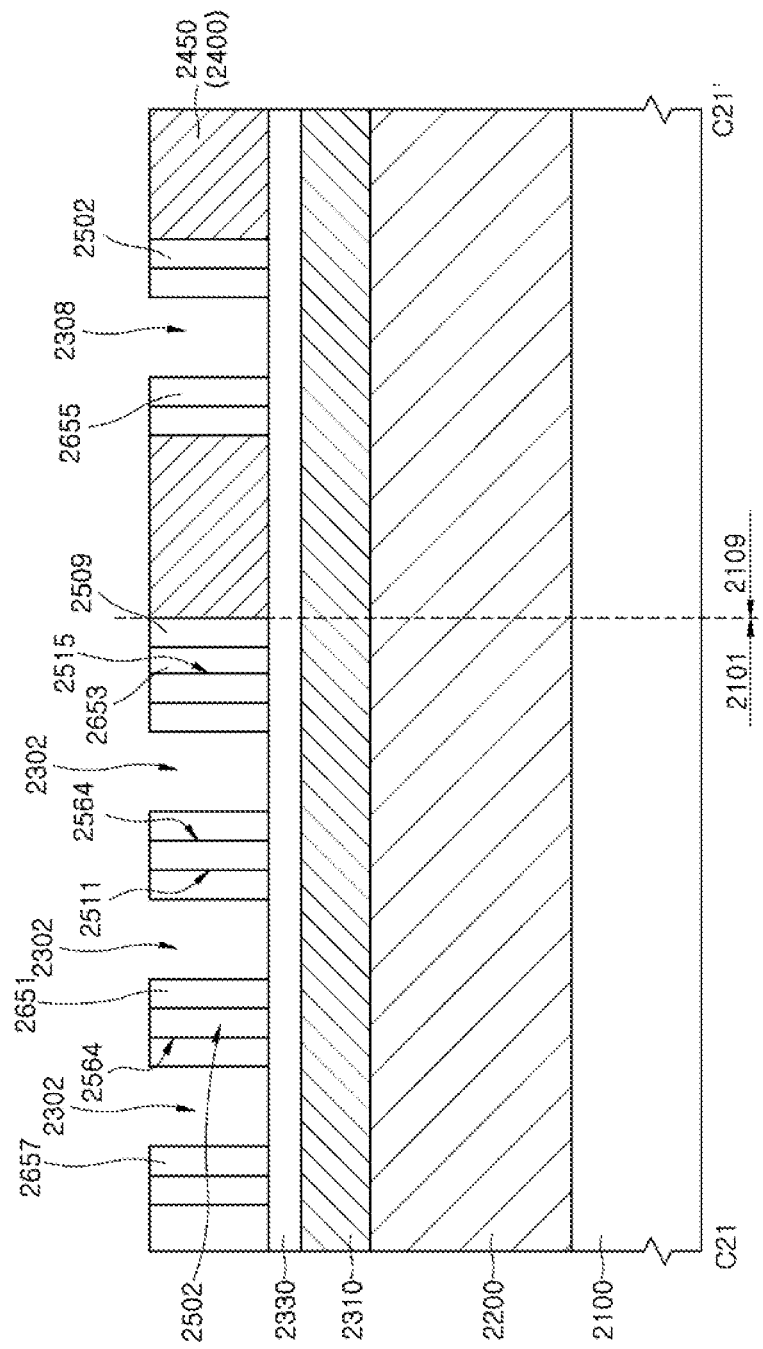

FIG. 62 is a plan view illustrating a step of forming second openings 2302 and third openings 2308. FIG. 63 is a cross-sectional view taken along a line C21-C21' of FIG. 62 and FIG. 64 is a cross-sectional view taken along a line C22-C22' of FIG. 62.

Figure 64:
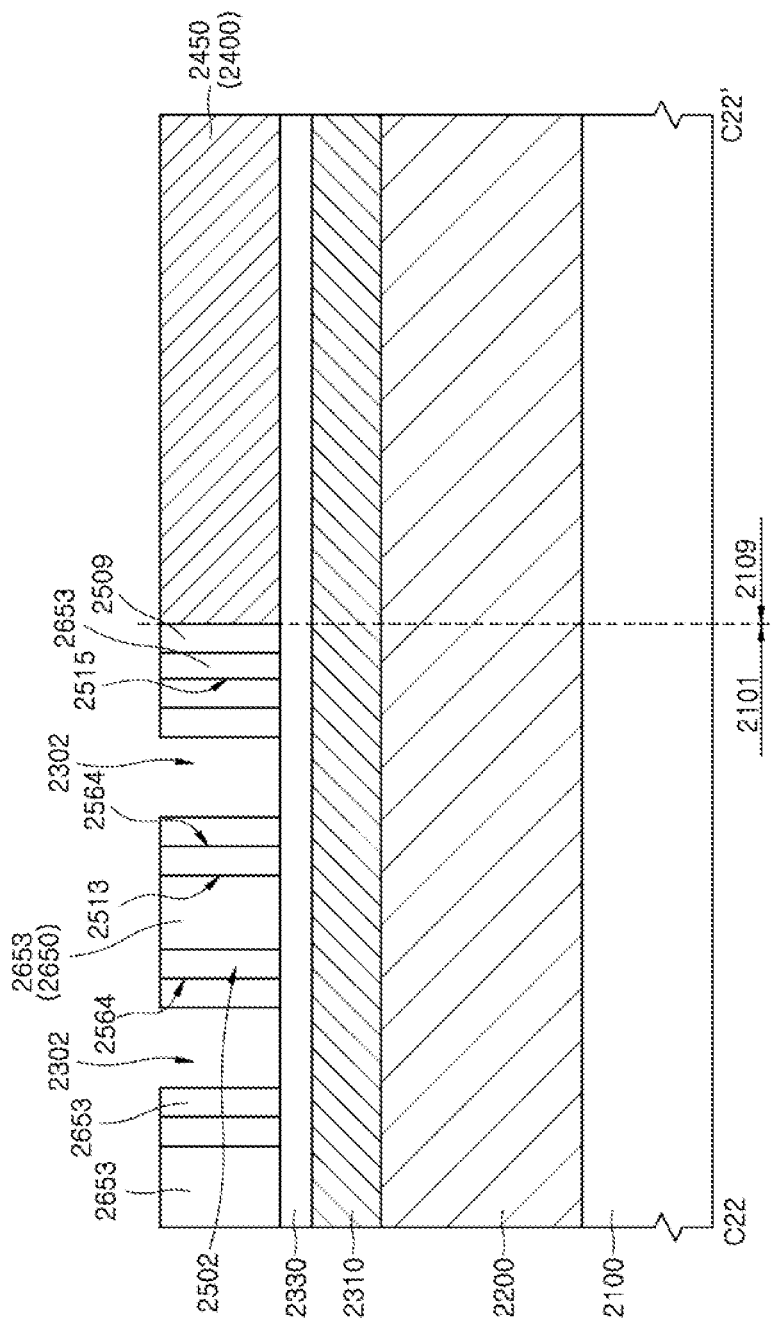

Referring to FIGS. 62, 63 and 64, the first, third and fifth domains (2610, 2615 and 2617 of FIG. 60) may be removed to form the second openings 2302 located between the separation walls 2502 and the third openings 2308 located in the first openings (2451 of FIG. 45). After the first, third and fifth domains (2610, 2615 and 2617 of FIG. 60) are removed, bottom portions of the second, fourth and sixth domains 2651, 2655 and 2657 may be selectively removed to form ninth openings extending from the second openings 2302 and tenth openings extending from the third openings 2308.

Figure 65:
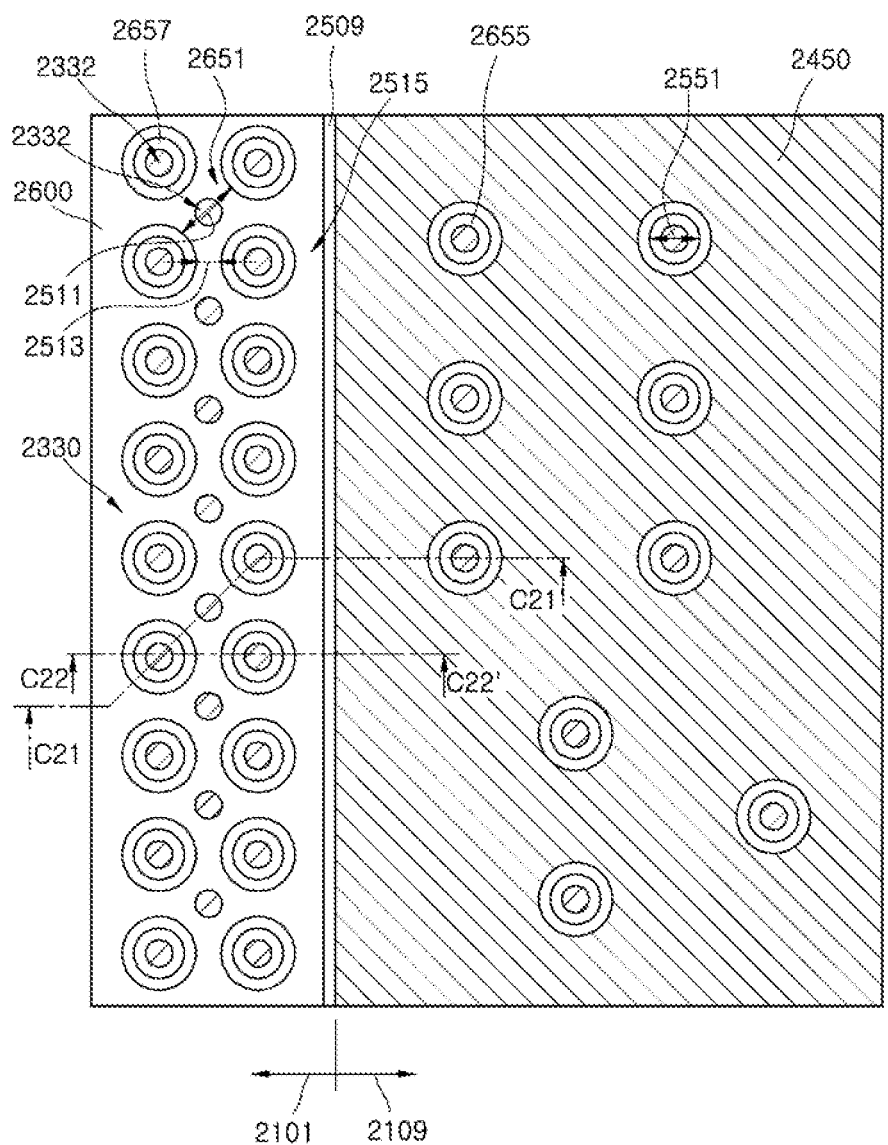
Figure 66:
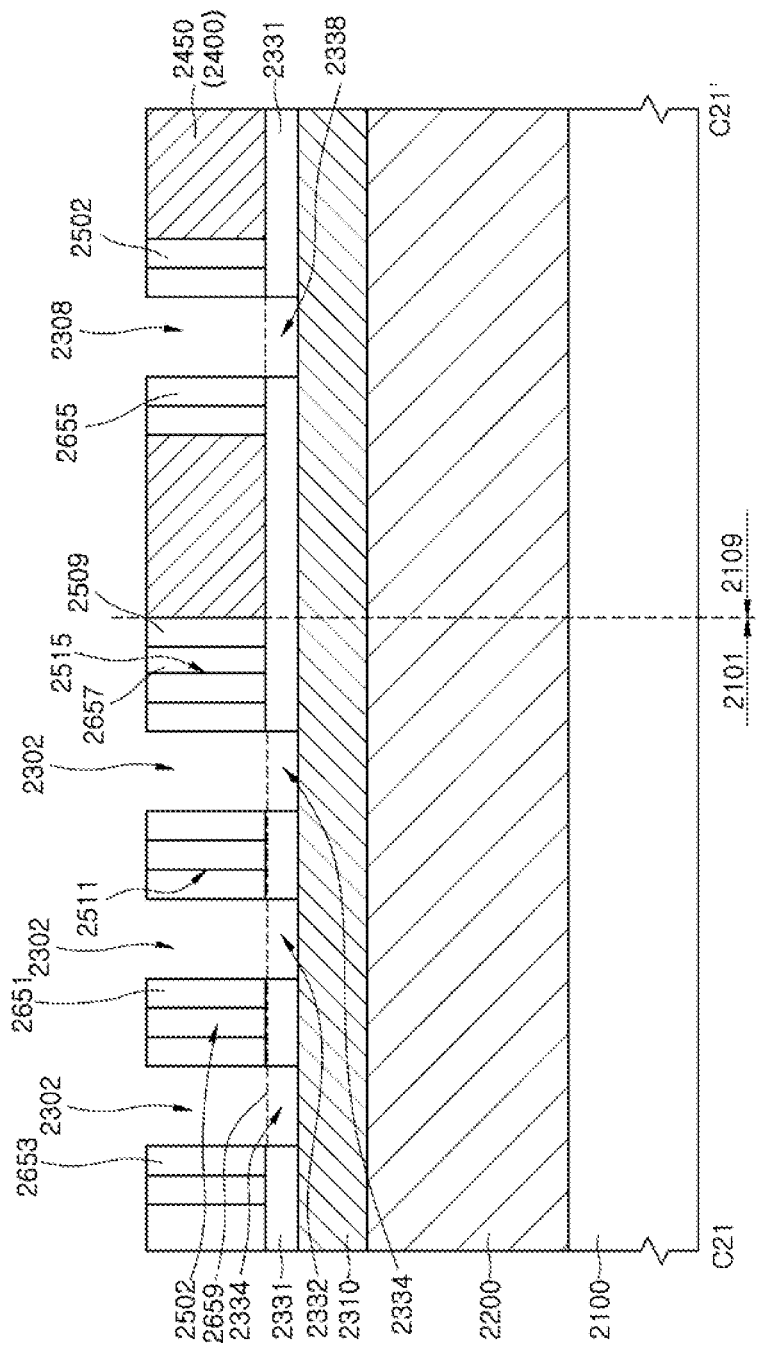

FIG. 65 is a plan view illustrating a step of forming fifth openings 2332 and sixth openings 2338. FIG. 66 is a cross-sectional view taken along a line C21-C21' of FIG. 65, and FIG. 67 is a cross-sectional view taken along a line C22-C22' of FIG. 65.

Figure 67:
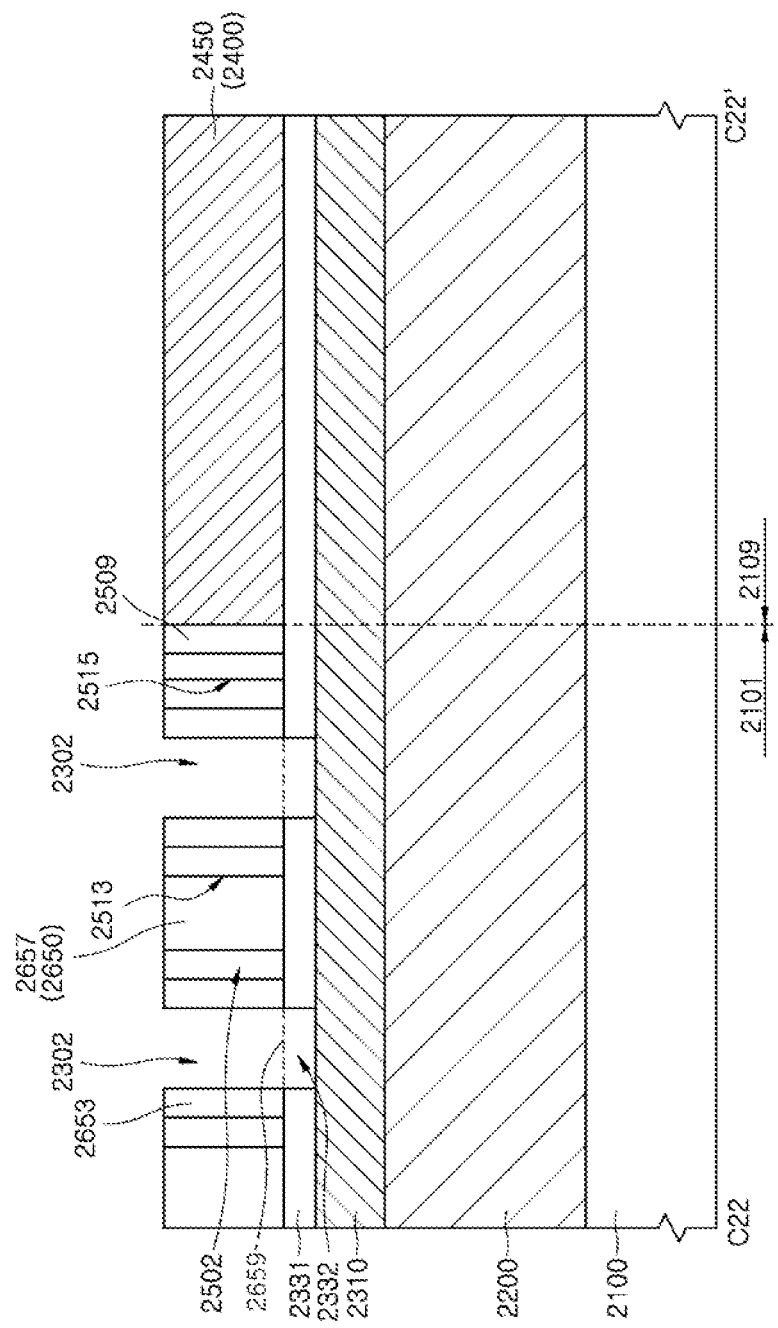

Referring to FIGS. 65, 66 and 67, portions 2334 of the underlying layer 2330 exposed by the ninth openings and the tenth openings may be selectively etched to form an underlying pattern 2331 that provides the fifth openings 2332 further extending from the second openings 2302 and the sixth openings 2338 further extending from the third openings 2308.

Figure 68:
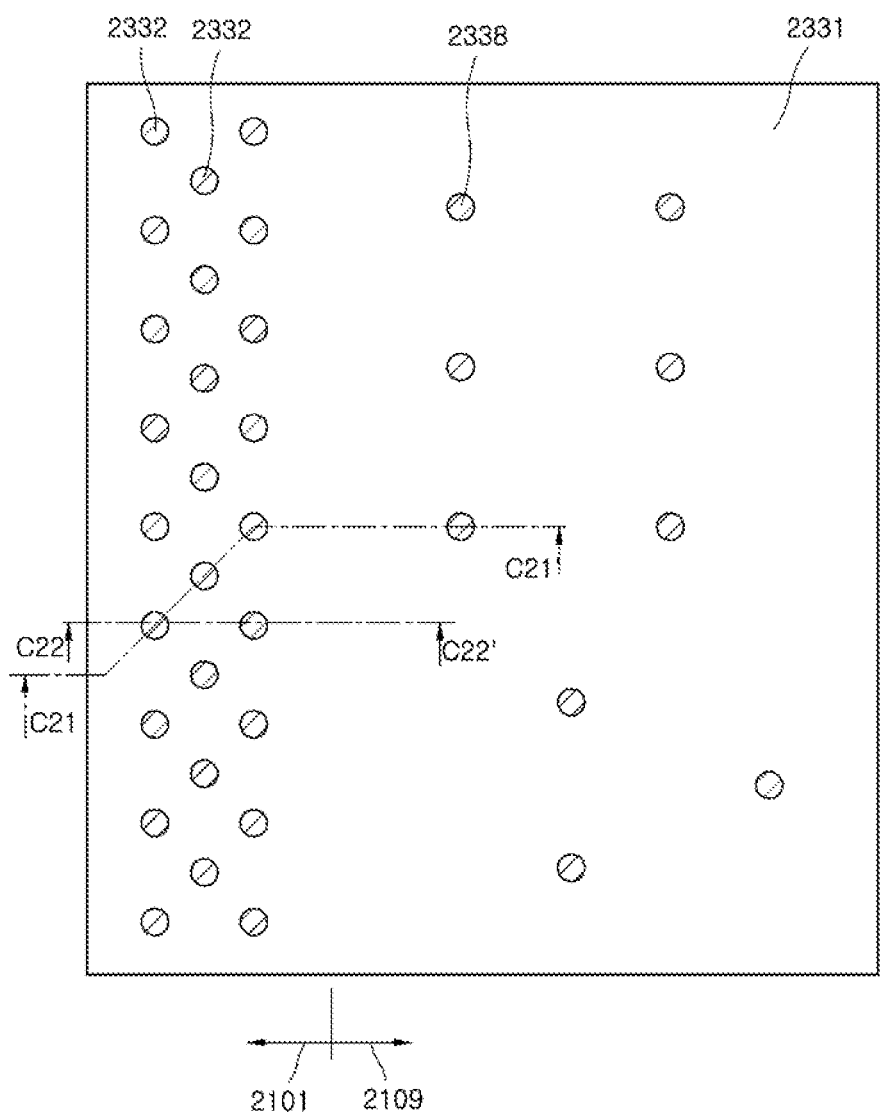
Figure 69:
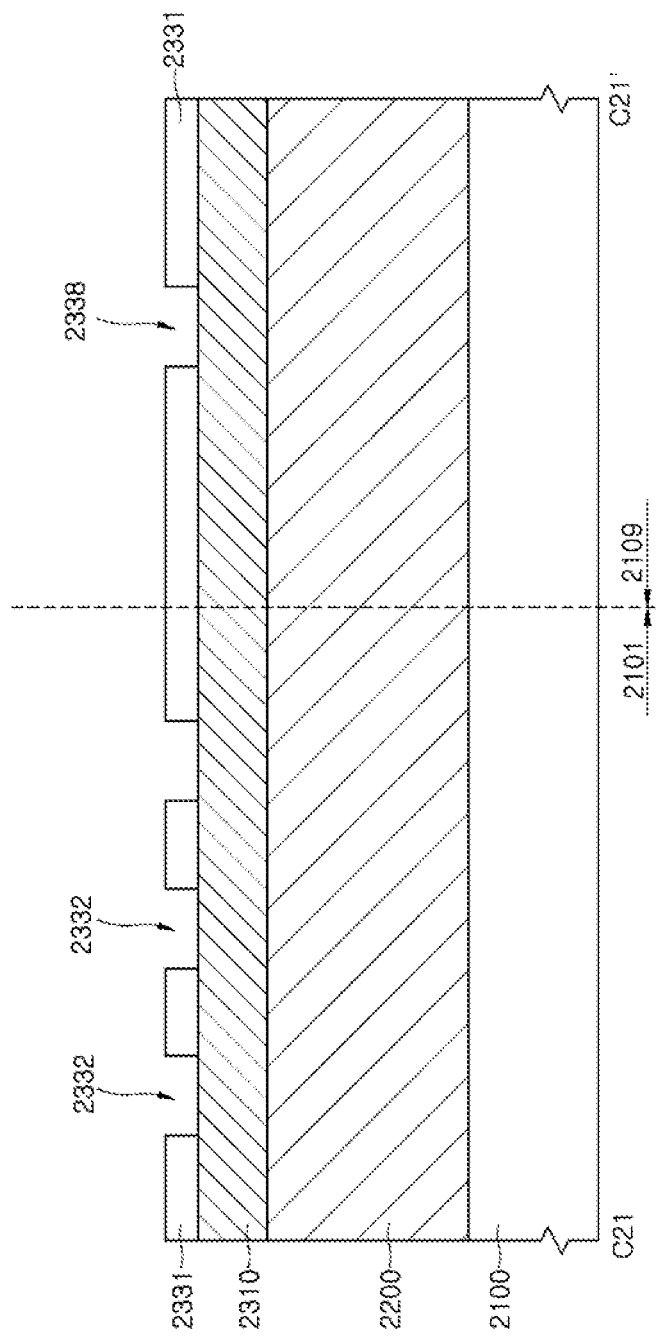

FIG. 68 is a plan view illustrating the underlying pattern 2331. FIG. 69 is a cross-sectional view taken along a line C21-C21' of FIG. 68 and FIG. 70 is a cross-sectional view taken along a line C22-C22' of FIG. 68.

Figure 70:
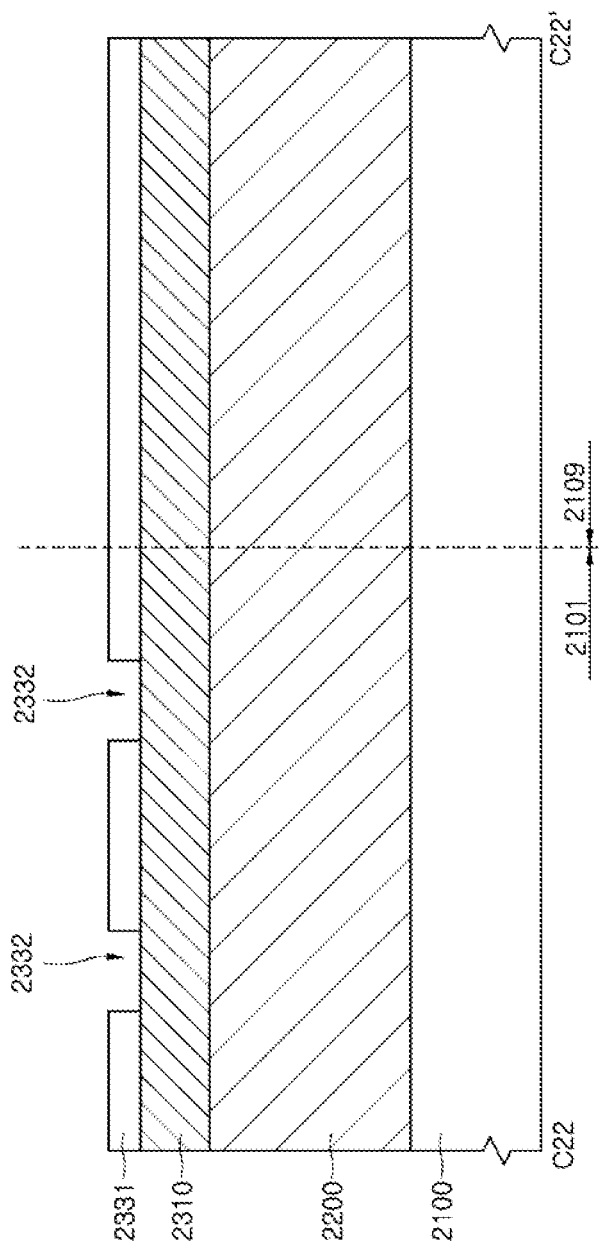

Referring to FIGS. 68, 69 and 70, the separation walls (2502 of FIG. 66), the second, fourth and sixth domains (2641, 2655 and 2657 of FIG. 66), and the template part 2450 may be removed to expose a top surface of the underlying pattern 2331. The underlying pattern 2331 may provide an array of the fifth openings 2332 and an array of the sixth openings 2338.

Figure 71:
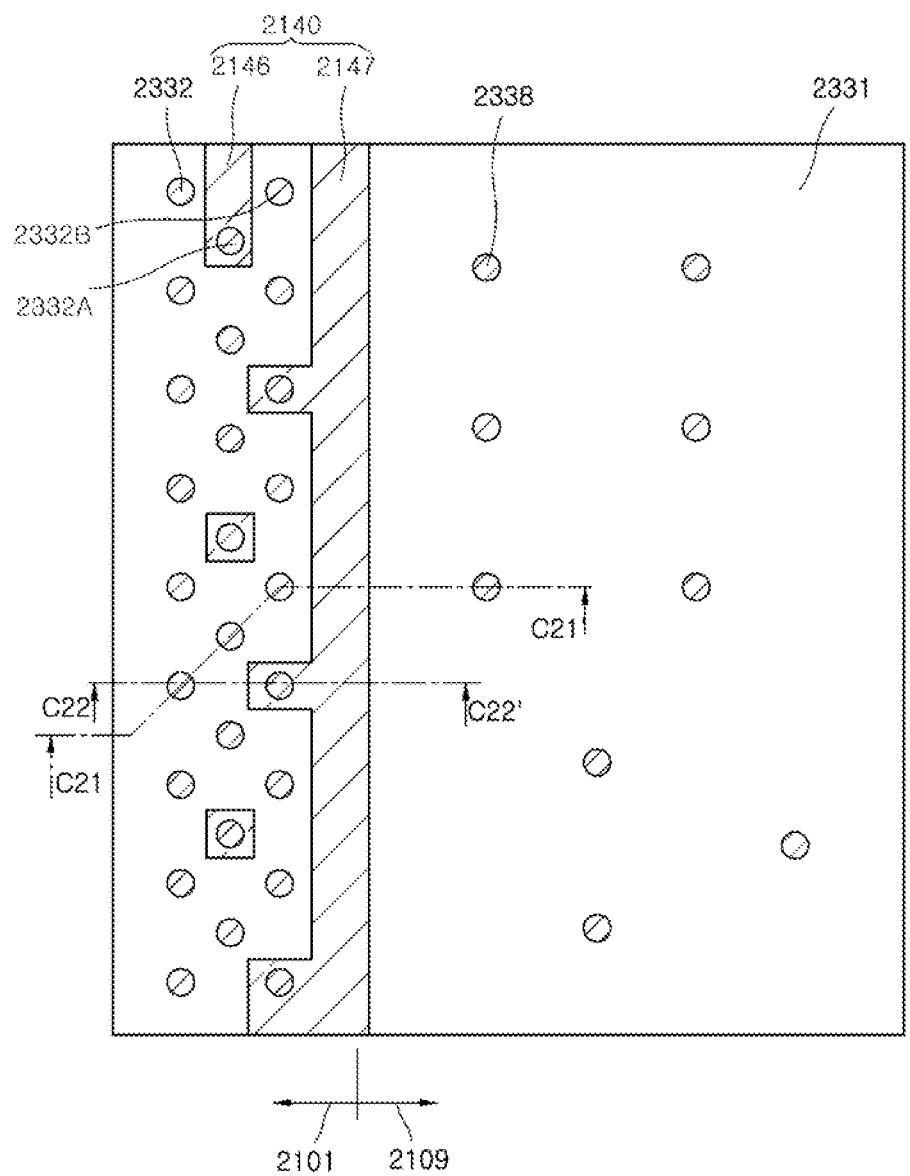
Figure 72:
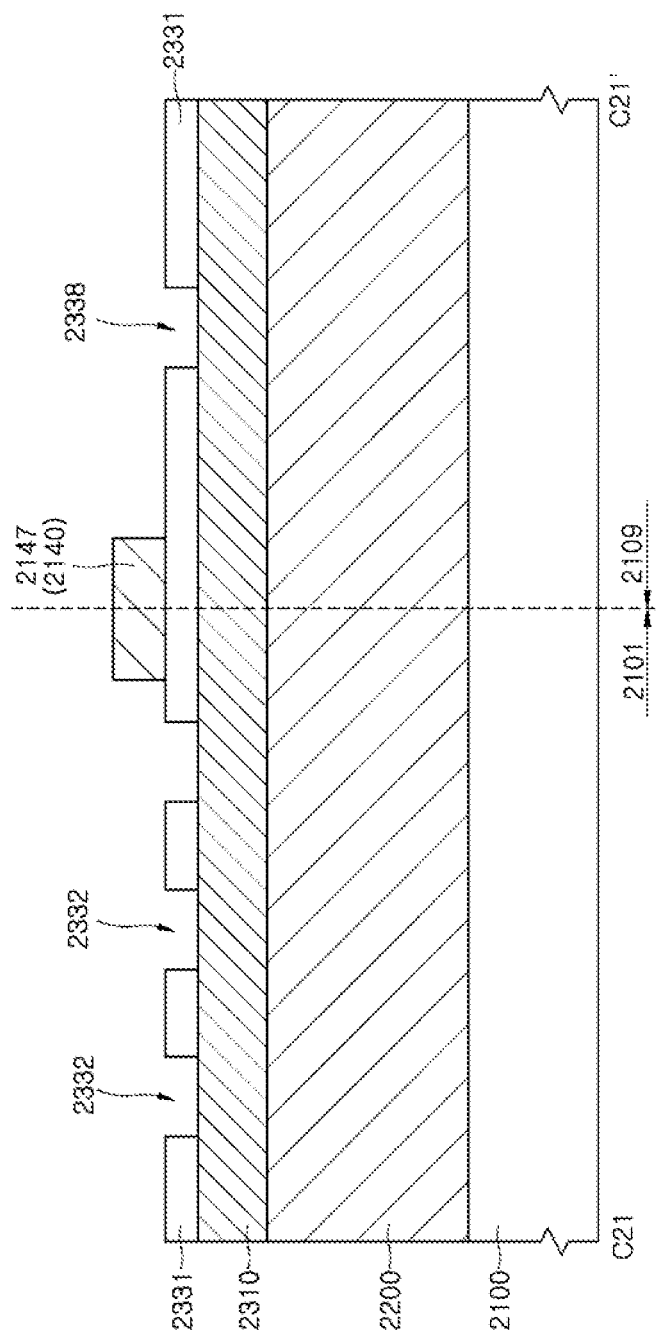

FIG. 71 is a plan view illustrating a step of forming a sealing pattern 2140. FIG. 72 is a cross-sectional view taken along a line C21-C21' of FIG. 71, and FIG. 73 is a cross-sectional view taken along a line C22-C22' of FIG. 71.

Figure 73:
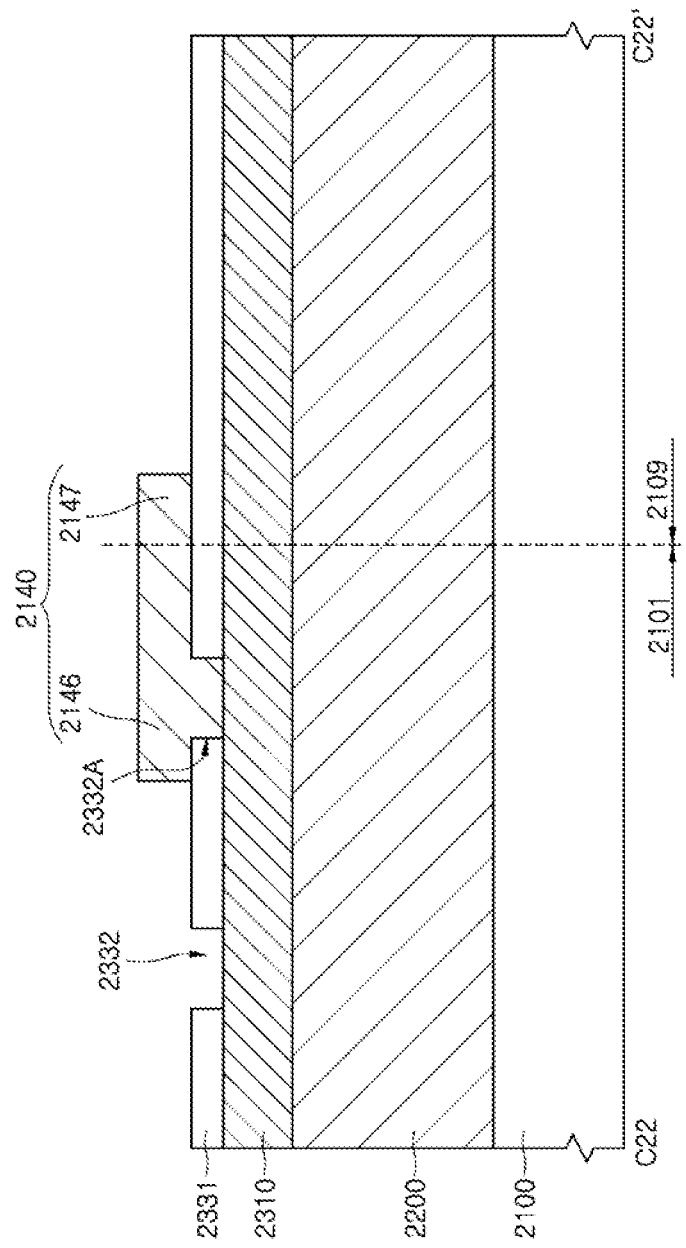

Referring to FIGS. 71, 72 and 73, the sealing pattern 2140 may be formed to cover some dummy openings 2332A among the fifth openings 2332. The sealing pattern 2140 may be formed by transferring the sealing pattern 45 of FIG. 4 onto the substrate 2100. The sealing pattern 2140 may be formed to include a silicon oxynitride (SiON) layer or a silicon nitride (SiN) layer. The sealing pattern 2140 may be formed to cover the dummy openings 2332A corresponding to the dummy patterns (43 of FIG. 4) so that the dummy openings 2332A are not transferred onto the substrate 2100. The sealing pattern 2140 may be formed to include first portions 2146 covering the dummy openings 2332A and a second portion 2147 covering a boundary region between the first region 2101 that is, the fifth openings 2332 and the second region 2109 that is, the template part 2450. The second portion 2147 of the sealing pattern 2140 may fill undesired parasitic holes located in the boundary region to prevent the undesired parasitic holes from being transferred to the substrate in a subsequent etch process.

Figure 74:
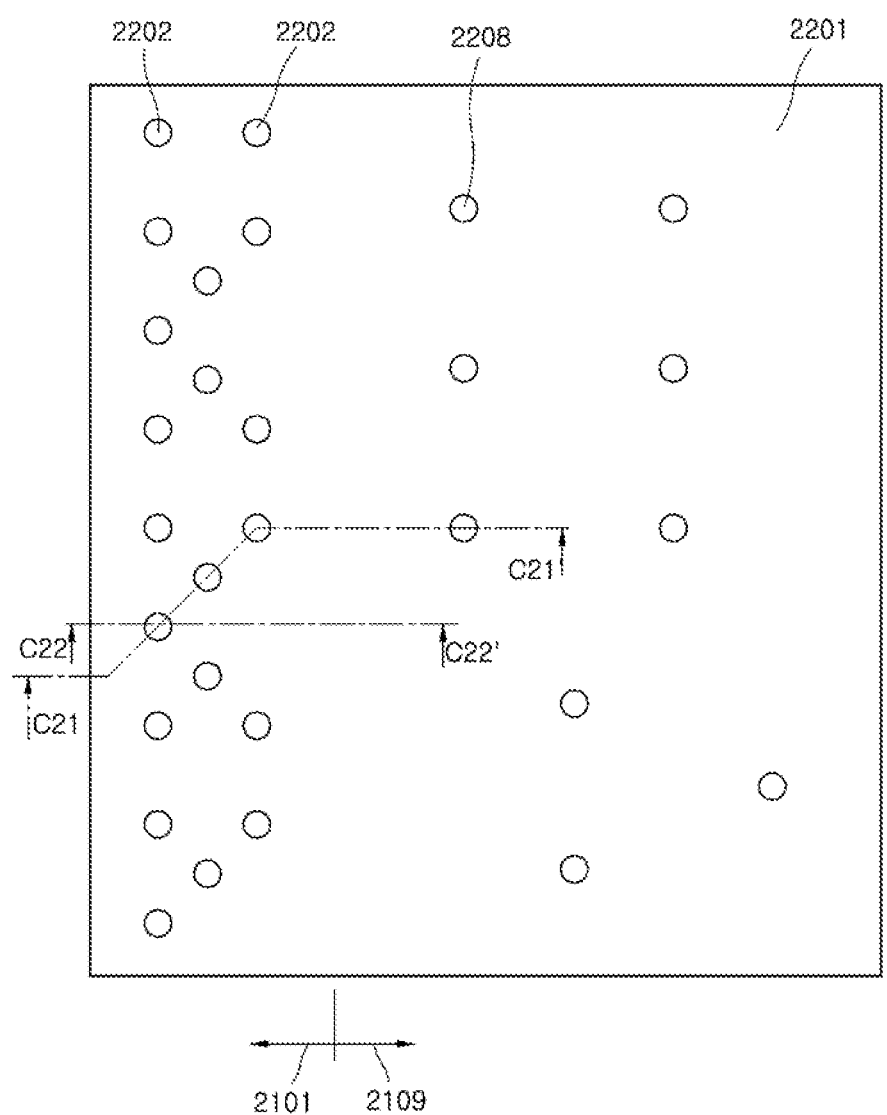
Figure 75:
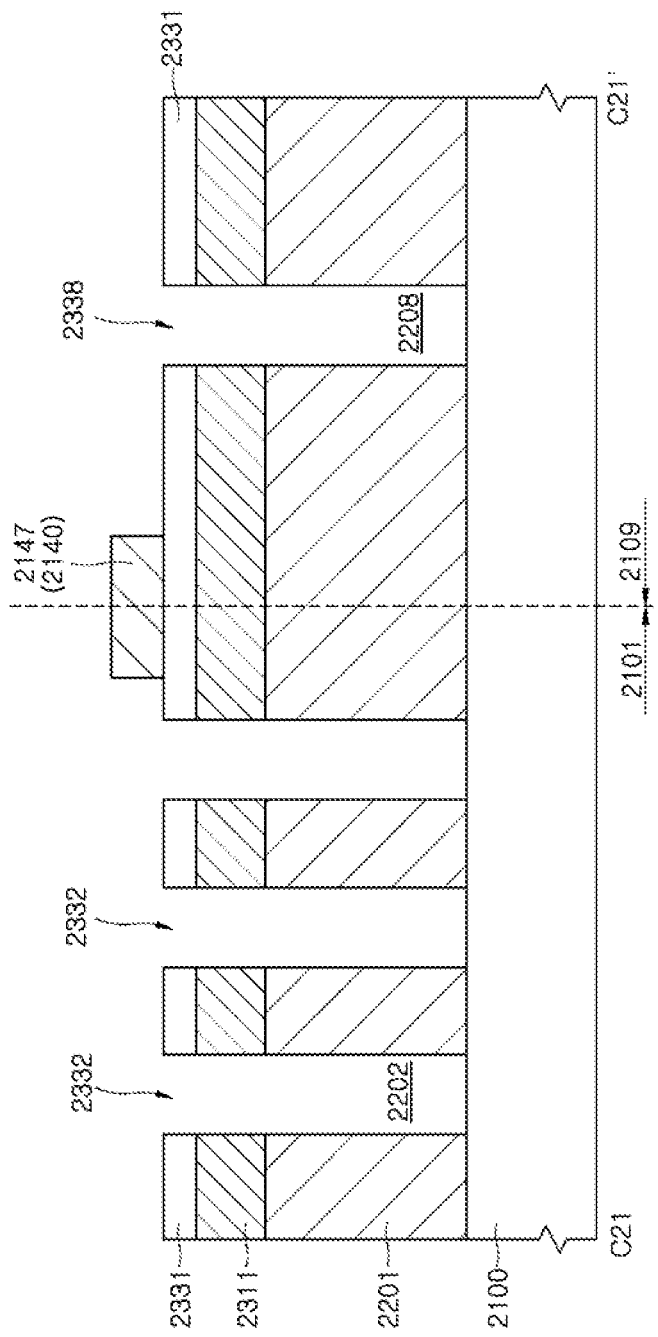

FIG. 74 is a plan view illustrating a step of forming seventh openings 2202 and eighth openings 2208. FIG. 75 is a cross-sectional view taken along a line C21-C21' of FIG. 74, and FIG. 76 is a cross-sectional view taken along a line C22-C22' of FIG. 74.

Figure 76:
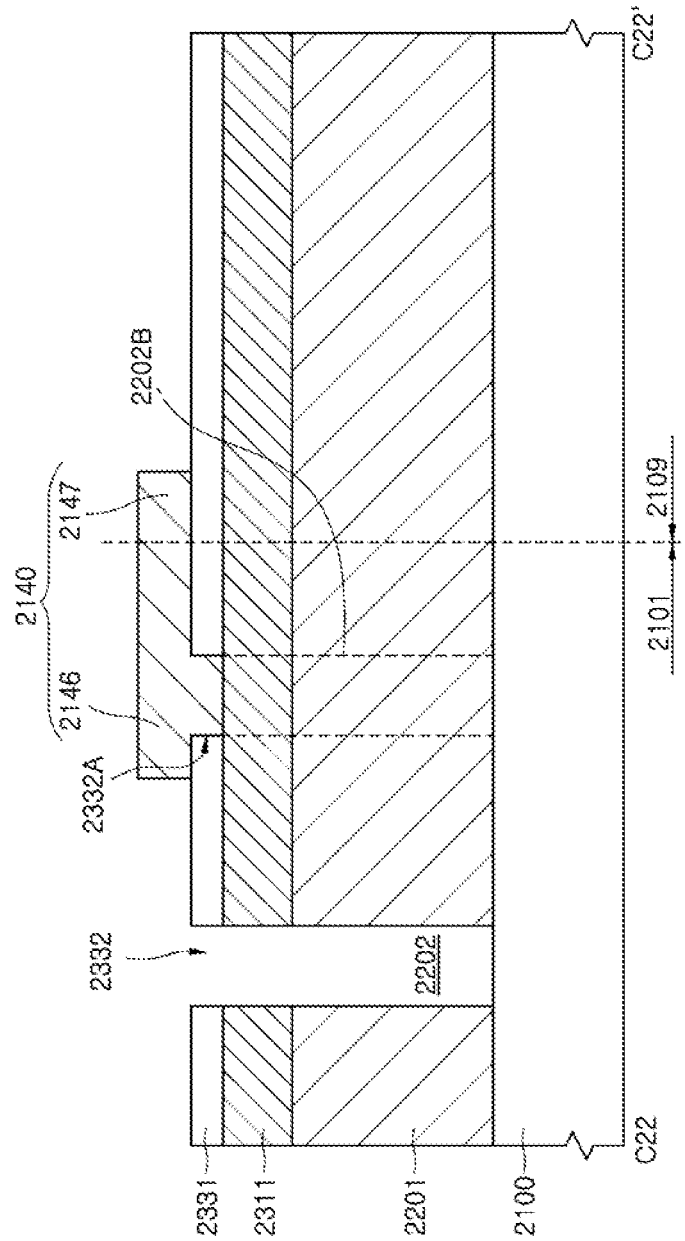

Referring to FIGS. 74, 75 and 76, the second etch target layer 2310 may be etched using the sealing pattern 2140 and the underlying pattern 2331 as etch masks to form a second etch target pattern 2311 through which the fifth openings 2332 and the sixth openings 2338 extend. Subsequently, portions of the first etch target layer 2200 exposed by the second etch target pattern 2311 may be etched to form a first etch target pattern 2201 that provides the seventh openings 2202 extending from the fifth openings 2332 and the eighth openings 2208 extending from the sixth openings 2338. The seventh openings 2202 and the eighth openings 2208 substantially penetrating the first etch target pattern 2201 may serve as contact holes that electrically connect lower conductive lines (not shown) to upper conductive lines (not shown). While the seventh openings 2202 and the eighth openings 2208 are formed, the dummy openings 2332A are not transferred onto the substrate 2100 due to the presence of the sealing pattern 2140. Thus, seventh dummy openings 22026 corresponding to the dummy openings 2332A are not formed in the first etch target pattern 2201.

According to the embodiments described above, nano-scale structures or nano structures can be fabricated on a large-sized substrate using a phase separation technique of a BCP layer. The nano-scale structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in fabricating nanowire transistors or memories, in fabricating electronic/electric components such as nano-scaled interconnections, in fabricating catalysts of solar cells and fuel cells, in fabricating etch masks and organic light emitting diodes (OLEDs), and in fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units keyboards, or central processing units (CPUs).

The embodiments of the present disclosure have been disclosed above for illustrative purposes.

What is claimed is:

1. A method of forming patterns, the method comprising:
    providing an underlying layer stacked over an etch target layer;
    forming an array of pillars and a template part over the underlying layer, wherein the template part provides first openings;
    forming a separation wall layer over the pillars and the template part to provide separation walls covering sidewalls of the pillars and the template part, wherein the separation wall layer includes extensions that cover portions of the underlying layer exposed by the pillars and the template part;
    forming a block copolymer layer over the separation wall layer;
    annealing the block copolymer layer to form first domains located between the pillars, a second domain surrounding and isolating the first domains, third domains respectively located in the first openings, and fourth domains respectively disposed in the first openings surrounding the third domains;
    selectively removing the first and third domains to form second openings and third openings;
    selectively removing the pillars to form fourth openings;
    selectively removing bottom portions of the second and fourth domains exposed by the second and third openings;
    selectively removing the extensions of the separation wall layer:
    forming fifth openings and sixth openings that penetrate the underlying layer, wherein the fifth openings are extended from the second and fourth openings, wherein the sixth openings are extended from the third openings;
    forming a sealing pattern that covers and seals one or more of the fifth openings; and
    forming seventh openings and eighth openings that penetrate the etch target layer,
    wherein the seventh openings are extended from the unsealed fifth openings exposed by the sealing pattern, and
    wherein the eighth openings are extend from the sixth openings.

2. The method of claim 1, wherein the sealing pattern extends to cover a portion of the underlying layer located between a first region including the fifth openings and a second region including the sixth openings.

3. The method of claim 1, wherein the pillars serve as guide patterns such that each of the first domains is formed at a central portion of a region surrounded by four adjacent pillars.

4. The method of claim 1, wherein the pillars act as guide patterns, and
    wherein each of the first domains is formed at a central portion of a region surrounded by three adjacent pillars.

5. The method of claim 1,
    wherein the block copolymer layer includes first polymer blocks and second polymer blocks that are phase-separated by the annealing process, and
    wherein the first polymer blocks are reordered to form the first and third domains and the second polymer blocks are reordered to form the second and fourth domains while the block copolymer layer is annealed.

6. The method of claim 5, wherein the block copolymer layer includes a polystyrene-poly methyl methacrylate block copolymer (PS-b-PMMA) material.

7. The method of claim 1, wherein forming the array of the pillars and the template part includes:
    designing a layout of first target features for the seventh openings and a layout of second target features for the eighth openings;
    adding dummy features to the layout of the first target features to form a layout of third target features, wherein the third target features includes the dummy features and the first target features and are repeatedly arrayed;

extruding a layout for the first domains and a layout for the pillar from the layout of the third target features; and forming the array of the pillars on the underlying layer using the layout for the pillar.

8. The method of claim 7, further comprising resizing the second target features to obtain a layout of fourth target features corresponding to the first openings.

9. The method of claim 7, wherein forming the sealing pattern includes:

obtaining a layout of the sealing pattern covering the dummy patterns from the layout of the third target features; and forming the sealing pattern using the layout of the sealing pattern.

10. The method of claim 1, wherein the separation wall layer includes extensions that cover portions of the underlying layer exposed by the pillars and the template part.

11. The method of claim 10, wherein the second and fourth domains are each formed to provide concave structures that cover the extensions and the separation walls of the separation wall layer, and wherein the second domain surrounds bottom surfaces and sidewalls of the first domains;

and wherein each of the fourth domains is formed to surround a bottom surface and a sidewall of any one of the second domains.

12. The method of claim 11, wherein forming the fifth openings and the sixth openings includes:

selectively removing bottom portions of the second and fourth domains exposed by the second and third openings to form ninth openings and tenth openings; and selectively removing the extensions of the separation wall layer exposed by the ninth and tenth openings to form eleventh and twelfth openings.

13. The method of claim 12, wherein forming the fifth openings and the sixth openings further includes:

selectively etching portions of the underlying layer exposed by the eleventh and fourth openings to form the fifth openings and selectively etching portions of the underlying layer exposed by the twelfth openings to form the sixth openings.

14. The method of claim 12, wherein selectively removing the pillars includes:

forming a mask that covers the template part and exposes the pillars after the twelfth openings are formed; and selectively etching the pillars exposed by the mask.

15. A method of forming patterns, the method comprising:

forming an array of pillars and a template part providing first openings over an underlying layer stacked over an etch target layer;

forming separation walls covering sidewalls of the pillars and the template part;

selectively removing the pillars to form fourth openings;

forming a block copolymer layer that fills a space between the separation walls, the first openings, and the fourth openings;

annealing the block copolymer layer to form first, second, third and fourth domains, wherein the first domains are located in gaps between the separation walls and the fourth openings, wherein the second domain surrounds the first domain to be isolated from the separation walls, wherein third domains are located in the first openings, wherein fourth domains are disposed in the first openings and surround the third domains;

selectively removing the first and third domains to form second openings surrounded by the second domain and third openings surrounded by the fourth domains;

selectively removing bottom portions of the second and fourth domains exposed by the second and third openings;

forming fifth openings and sixth openings that penetrate the underlying layer, wherein the fifth openings are extended from the second and fourth openings, and wherein the sixth openings are extended from the third openings;

forming a sealing pattern that covers and seals dummy openings among the fifth openings, wherein the dummy openings are openings that are not transferred onto a substrate; and forming seventh openings and eighth openings that penetrate the etch target layer, wherein the seventh openings extend from the fifth openings exposed by the sealing pattern and the eighth openings extend from the sixth openings.

16. The method of claim 15, wherein forming the separation walls includes:

forming a separation wall layer that covers the pillars and the template part; and etching the separation wall layer to leave the separation walls over the sidewalls of the pillars and the sidewalls of the first openings, wherein the separation walls are formed to have a spacer shape.

17. The method of claim 15, wherein the second and fourth domains are formed to provide concave structures that cover the separation walls and portions of the underlying layer exposed by the separation walls, wherein each of the second domains is formed to surround a bottom surface and a sidewall of any one of the first domains, and wherein each of the fourth domains is formed to surround a bottom surface and a sidewall of any one of the second domains.

18. The method of claim 17, wherein forming the fifth openings and the sixth openings includes:

selectively removing bottom portions of the second and fourth domains exposed by the second and third openings to form ninth openings and tenth openings, respectively.

19. The method of claim 18, wherein forming the fifth openings and the sixth openings further includes:

selectively etching portions of the underlying layer exposed by the ninth and tenth openings to form the fifth openings and the sixth openings, respectively.

20. A method of forming patterns, the method comprising:

forming an array of pillars and a template part on an underlying layer stacked on an etch target layer;

forming a separation wall layer on the pillars to provide separation walls covering sidewalls of the pillars, wherein the separation wall layer includes extensions that cover portions of the underlying layer exposed by the array of pillars and the template part;

forming a block copolymer layer on the separation wall layer;

annealing the block copolymer layer to form first domains located between the pillars, and a second domain surrounding and isolating the first domains;

selectively removing the first domains to form second openings;
selectively removing the pillars to form fourth openings;
selectively removing bottom portions of the second domains exposed by the second openings;
selectively removing the extensions of the separation wall layer;
forming fifth openings that extend from the second and fourth openings to penetrate the underlying layer;
forming a sealing pattern that covers and seals dummy openings among the fifth openings; and
forming seventh openings that extend from the fifth openings exposed by the sealing pattern to penetrate the etch target layer.

* * * * *